(12) United States Patent
Shishido et al.

(10) Patent No.: US 7,263,216 B2
(45) Date of Patent: Aug. 28, 2007

(54) PATTERN INSPECTING METHOD AND APPARATUS THEREOF, AND PATTERN INSPECTING METHOD ON BASIS OF ELECTRON BEAM IMAGES AND APPARATUS THEREOF

(75) Inventors: Chie Shishido, Yokohama (JP); Yuji Takagi, Yokohama (JP); Shuji Maeda, Yokohama (JP); Takanori Ninomiya, Hiratsuka (JP); Takashi Hiroi, Yokohama (JP); Masahiro Watanabe, Yokohama (JP); Hideaki Doi, Oota-ku (JP)

(73) Assignee: Hitachi, Ltd., Tokyo (JP)

( * ) Notice: Subject to any disclaimer, the term of this patent is extended or adjusted under 35 U.S.C. 154(b) by 762 days.

(21) Appl. No.: 10/637,488

(22) Filed: Aug. 11, 2003

(65) Prior Publication Data

US 2004/0086170 A1    May 6, 2004

Related U.S. Application Data

(63) Continuation of application No. 09/225,512, filed on Jan. 6, 1999, now Pat. No. 6,614,923.

(30) Foreign Application Priority Data

Jan. 6, 1998    (JP)    ................................ 10-000606

(51) Int. Cl.
*G06K 9/00* (2006.01)
(52) U.S. Cl. .................................... 382/149
(58) Field of Classification Search ................ 382/141, 382/147, 149
See application file for complete search history.

(56) References Cited

U.S. PATENT DOCUMENTS

| | | | |
|---|---|---|---|
| 4,633,504 A | 12/1986 | Wihl | |
| 4,783,826 A | 11/1988 | Koso | |
| 5,495,535 A | 2/1996 | Smilansky et al. | |
| 5,506,793 A | 4/1996 | Straayer et al. | |
| 5,659,172 A | 8/1997 | Wagner et al. | |
| 5,793,887 A | 8/1998 | Zlotnick | |
| 5,808,735 A | 9/1998 | Lee et al. | |
| 6,614,923 B1 * | 9/2003 | Watanabe et al. | ........... 382/149 |

FOREIGN PATENT DOCUMENTS

| | | |
|---|---|---|
| JP | 57-196377 | 12/1982 |
| JP | 03-177040 | 8/1991 |
| JP | 04-341248 | 11/1992 |

* cited by examiner

*Primary Examiner*—Jingge Wu
*Assistant Examiner*—Tom Y. Lu
(74) *Attorney, Agent, or Firm*—Antonelli, Terry, Stout and Kraus, LLP.

(57) ABSTRACT

A pattern inspecting method and apparatus for inspecting a defect or defective candidate of patterns on a sample includes picking up an image of a sample by shifting a sampling position on the sample, measuring geometric distortion in an image of a standard sample, beforehand, and defining a size for which the measured geometric distortion is neglectable, obtaining a first image of the sample and a second image to be compared with the first image, dividing the first image and the second stage into images of a division unit having a size not greater than the defined size, comparing a divided image of the first image with a divided image of the second image, and for calculating a difference in gradation values between both of the divided images. The defect or the defect candidate of the sample is extracted in accordance with the difference in the gradation values.

16 Claims, 28 Drawing Sheets

DIFFERENCE IN OFF-SET

DIFFERENCE IN GAIN

FIG. 19

| | -4 | -3 | -2 | -1 | 0 | 1 | 2 | 3 | 4 |
|---|---|---|---|---|---|---|---|---|---|
| -4 | S(-4,-4) | S(-3,-4) | S(-2,-4) | S(-1,-4) | S(0,-4) | S(1,-4) | S(2,-4) | S(3,-4) | S(4,-4) |
| -3 | S(-4,-3) | S(-3,-3) | S(-2,-3) | S(-1,-3) | S(0,-3) | S(1,-3) | S(2,-3) | S(3,-3) | S(4,-3) |
| -2 | S(-4,-2) | S(-3,-2) | S(-2,-2) | S(-1,-2) | S(0,-2) | S(1,-2) | S(2,-2) | S(3,-2) | S(4,-2) |
| -1 | S(-4,-1) | S(-3,-1) | S(-2,-1) | S(-1,-1) | S(0,-1) | S(1,-1) | S(2,-1) | S(3,-1) | S(4,-1) |
| 0 | S(-4,0) | S(-3,0) | S(-2,0) | S(-1,0) | S(0,0) | S(1,0) | S(2,0) | S(3,0) | S(4,0) |
| 1 | S(-4,1) | S(-3,1) | S(-2,1) | S(-1,1) | S(0,1) | S(1,1) | S(2,1) | S(3,1) | S(4,1) |
| 2 | S(-4,2) | S(-3,2) | S(-2,2) | S(-1,2) | S(0,2) | S(1,2) | S(2,2) | S(3,2) | S(4,2) |
| 3 | S(-4,3) | S(-3,3) | S(-2,3) | S(-1,3) | S(0,3) | S(1,3) | S(2,3) | S(3,3) | S(4,3) |
| 4 | S(-4,4) | S(-3,4) | S(-2,4) | S(-1,4) | S(0,4) | S(1,4) | S(2,4) | S(3,4) | S(4,4) |

SHIFT QUANTITY IN x DIRECTION

SHIFT QUANTITY IN y DIRECTION

DETECTION IMAGE

COMPARISON IMAGE

PATTERN INSPECTING METHOD AND APPARATUS THEREOF, AND PATTERN INSPECTING METHOD ON BASIS OF ELECTRON BEAM IMAGES AND APPARATUS THEREOF

CROSS REFERENCE TO RELATED APPLICATION

This application is a continuation application of U.S. application Ser. No. 09/225,512, filed on Jan. 6, 1999, now U.S. Pat. No. 6,614,923 the subject matter of which is incorporated by reference herein.

BACKGROUND OF THE INVENTION

Field of the Invention

The present invention relates to a pattern inspecting method and an apparatus thereof, and a pattern inspecting method on a basis of an electron beam pictures or images and an apparatus thereof, with which a picture, displaying physical properties of an object such as a semiconductor wafer, TFT, a photo mask and so on, is obtained by use of an electron beam, a light or the like, and the obtained picture is compared with a picture which is obtained separately therefrom, thereby detecting defects or quasi-defects (or defective candidates), in particular the fine or minute ones thereof.

In a conventional art 1, as is described in Japanese Patent Laying-Open No. Sho 57-196377 (1982), there is already know a testing or an inspection, wherein a pattern including a repetitive pattern, being formed on an object to be tested or inspected such as a semiconductor wafer, is detected to be memorized, and the detected pattern is fitted or aligned with to a pattern which is memorized one time before, in an accuracy of degree of each pixel, thereby extracting a discrepancy or difference between the two patterns fitted or aligned with in the positions thereof so as to recognize or acknowledge the defects therein. Further, in a conventional art 2, as is disclosed in Japanese Patent Laying-Open No. Hei 3-177040 (1991), there is also known a technology, wherein a portion due to distortion or deformation in the detection points or positions between two pictures is improved among the problems of discrepancies or differences between the both images in normal portions thereof. Namely, in the conventional art 2, there is described the technology, wherein an object pattern is detected as a picture signal, and the detected pattern is aligned, or adjusted in the position by an unit of pixel with that which is memorized in advance or that which is detected separately. The two of them, which are aligned in positions by the unit of pixel (pixel unit), are further aligned in positions at a degree being finer or lower than the pixel (i.e., sub-pixel unit), so as to be compared and extracted errors therefrom in the image signals of those two patterns which are aligned in positions at the degree finer than the pixel, thereby recognizing or acknowledging the defect(s) of the pattern(s).

Between the two pictures to be compared, there exist the minute difference in the pattern shape, the differences in the values of gradation, distortion or deformation in the patterns, misalignment in positions and so on, even in a normal portion, due to a detection object sample itself and an image detection system thereof. Namely, as the discrepancies or inconsistency in the normal portion, there are some which are caused by the object itself and other(s) which are caused by a side of the testing or inspecting apparatus thereof.

The discrepancy or inconsistency caused by the test object is mainly due to a delicate difference caused through a wafer fabricating processes, such as etching and so on. This is because it looks to be the minute difference in shapes, or as the gray level difference between the repetitive patterns on the detected images.

The discrepancies, which are caused at the testing or inspecting apparatus side, include quantizing errors due to vibration of stages, various electric noises, mis- or malfocusing and sampling, fluctuation in illumination light amount especially in a case of an optical system, fluctuation in electron beam current especially in a case of an electron beam system, and gaps or shifts in scanning position of the electron beam due to electrical charge of the sample and/or of an electronic-optical system, etc. In particular, in the electron beam system, influences due to geometric distortion is remarkable in the periphery portion of the test object. Those appear in the forms of differences in the gradation values of the portion of the image, the geometric distortion, and the gaps or shifts in the position.

In the conventional art 1 mentioned above, there are problems that, since the discrepancies occur even in the normal portion due to the causes of factors listed in the above, erroneous report occurs very often if each of those discrepancies is decided to be the defect restrictively or minutely, one by one. While, if a reference or criteria to decide the defect is loosen or lowered for preventing from the above, it is impossible to detect the minute or fine defect correctly.

Further, with the conventional art 2 mentioned above, though an only effect can be obtained in reducing or lowering the influence due to the misalignment in the positions between the pictures or images, among those influences due to the minute difference in the pattern shape, the differences in the gradation values, the distortion or deformation of the patterns, and the gaps or shifts in positions and so on, which are caused by the test object itself and the image detecting system thereof, but it is still not sufficient, nor takes the other problems into considerations thereof any more.

SUMMARY OF THE INVENTION

An object is, according to the present invention for dissolving the problems of the conventional arts mentioned above, to provide a pattern testing method and an apparatus therefor, which can further reduce or lower the possibility of occurring the erroneous reports which are caused by the discrepancies or differences due to the sample itself and the image detecting system thereof, so as to enable the detection of the more minute or the finer defects.

Further, an another object of the present invention is to provide a pattern testing or inspecting method on a basis of electron beam picture or image and an apparatus thereof, which can further reduce or lower the Possibility of occurring the erroneous reports which are caused by the discrepancies due to the sample and the image detecting system, on a basis of the electron beam picture of the test object itself, so as to enable the detection of the more minute or the finer defects.

Further, other object of the present invention is to provide a pattern testing method on a basis of electron beam picture or image and an apparatus thereof, which can further reduce or lower the possibility of occurring the erroneous reports which are caused by non-uniform distortion or deformation on the detected images due to the sample and the image detecting system thereof, on a basis of the electron beam picture of the sample, so as to enable the detection of the more minute or the finer defects.

Further, other object of the present invention is to provide a method and an apparatus therefor, having stable gradation values being suitable for testing, and being able to obtain an electron beam picture or image with less geographic distortion, in the pattern inspecting with use of the electron beam image of the sample.

Moreover, further other object of the present invention is to provide a method and an apparatus therefor, enabling the inspecting all over surface including a central portion and a peripheral portion as well, of the sample in the pattern inspecting with use of the electron beam image of the sample.

For dissolving the above objects, according to the present invention, there are provided a pattern inspecting method and an apparatus thereof and a pattern inspecting method on a basis of an electron beam image and an apparatus thereof, wherein inspection is made upon defect or defective candidate on a sample on the basis of a first data which are arranged in two-dimension, by making sampling values in physical quantity from a certain area selected on the sample as gradation values, and a second image data containing contents which can be a comparison sample for the first image data, and each of which has the following features.

Namely, according to the present invention, there are provided an image dividing and cutting-out step or means thereof, for memorizing said first image data and second image data sequentially for a predetermined area, and for dividing and cutting out each of those first and second data memorized sequentially into such a small area unit to be able to neglect such as the distortion therein; and a deciding step or means thereof, for comparing the first divided image and the second divided image, which are divided in the image dividing and cutting-out step or means thereof for the each division unit so as to calculate difference of the both images, and for deciding the defect or the defective candidate upon the basis of the difference between the both images, which are calculated for the each division unit. Further, according to the present invention, there are also provided a position shift detecting step or means thereof, for detecting the position shift quantity between the first divided image and the second divided image, which are divided and cut out in said image dividing and cutting-out step or means thereof for the each division unit; and a deciding step or means thereof, for deciding to be the defect or the defective candidate by taking into considerations the position shift quantity which is detected in the position shift detecting step or means thereof, by comparing the first divided image and the second divided image, which are divided in the image dividing and cutting-out step or means thereof for the each division unit.

Further, according to the present invention, there are provided a position shift detecting step or means thereof, for detecting the position shift quantity between the first divided image and the second divided image, which are divided and cut out in said image dividing and cutting-out step or means thereof for the each division unit, and a deciding step or means thereof, for deciding to be the defect or the defective candidate, by comparing the first divided image and the second divided image, which are divided in the image dividing and cutting-out step or means thereof for the each division unit, so as to calculate the difference in the gradation values between the both images, and by basing upon a reference value for decision of containing fluctuating component in the gradation values which can be calculated out depending on the position shift quantity detected in the position shift detecting step or means thereof, with respect to the difference between the both images in the gradation values calculated for the each division unit.

Further, according to the present invention, there are provided a position shift detecting step or means thereof, for detecting the position shift quantity between the first divided image and the second divided image, which are divided and cut out in said image dividing and cutting-out step or means thereof for the each division unit; and a deciding step or means thereof, for deciding to be the defect or the defective candidate, by comparing the first divided image and the second divided image, which are divided in the image dividing and cutting-out step or means thereof for the each division unit, so as to calculate the difference between the both images depending upon the position shift quantity detected for the each division unit by the position shift detecting step or means thereof, and by basing upon the difference between the both images calculated for the each division unit.

Further, according to the present invention, there are provided a position shift detecting step or means thereof, for detecting the position shift quantity between the first divided image and the second divided image, which are divided and cut out in said image dividing and cutting-out step or means thereof for the each division unit; and a deciding step or means thereof, for deciding to be the defect or the defective candidate, by comparing the first divided image and the second divided image, which are divided in the image dividing and cutting-out step or means thereof for the each division unit, so as to treat the position shift compensation depending upon the position shift quantity detected for the each division unit by the position shift detecting step or means thereof, by calculating the difference between the first divided image and the second divided image on which the position shift compensation is treated, and basing upon the difference between the both images calculated for the each division unit.

Further, according to the present invention, there is also provided a step of means thereof, for compensating at least one of the gradation values so that the first divided image and the second divided image are nearly equal in the gradation values.

Further, according to the present invention, there is also prepared a compensation equation or a compensation data table for measuring the geographical distortion on the two-dimensional image having the electron beam image as the image contents thereof, and for compensating the distortion in advance, thereby controlling the electron beam scanning by using the compensation equation or the compensation data table.

Further, according to the present invention, there are provided a pattern inspecting method on a basis of an electron beam picture and an apparatus thereof, which are able to deal with the dynamic image distortion.

As mentioned in the above, according to the above constructions, in the inspection of patterns formed on the sample with use of the electron microscope, it is possible to reduce the possibility of bringing about erroneous or false reports due to the sample side and the inspecting apparatus side thereof, which are caused by discrepancies, such as the minute difference in pattern shapes, the difference in the gradation values, the distortion or deformation of the patterns, the position shifts, thereby enabling the detection of the defects or the defective candidates in more details. In particular, it is possible to deal with the dynamic image distortion.

BRIEF DESCRIPTION OF DRAWING(S)

FIG. 19 shows a view for explaining the arrangement of alignment factor;

Figure 30:
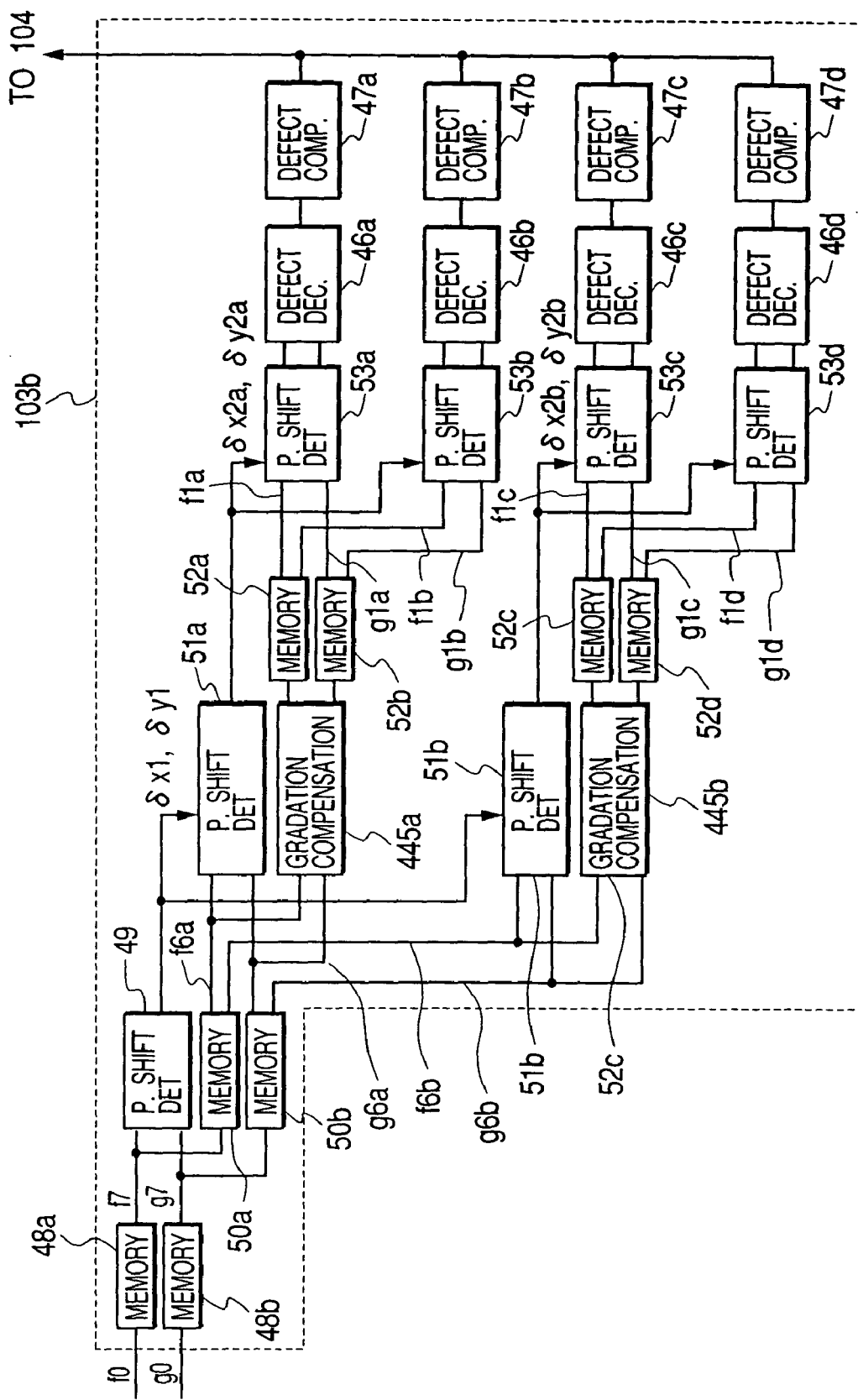
Figure 31:
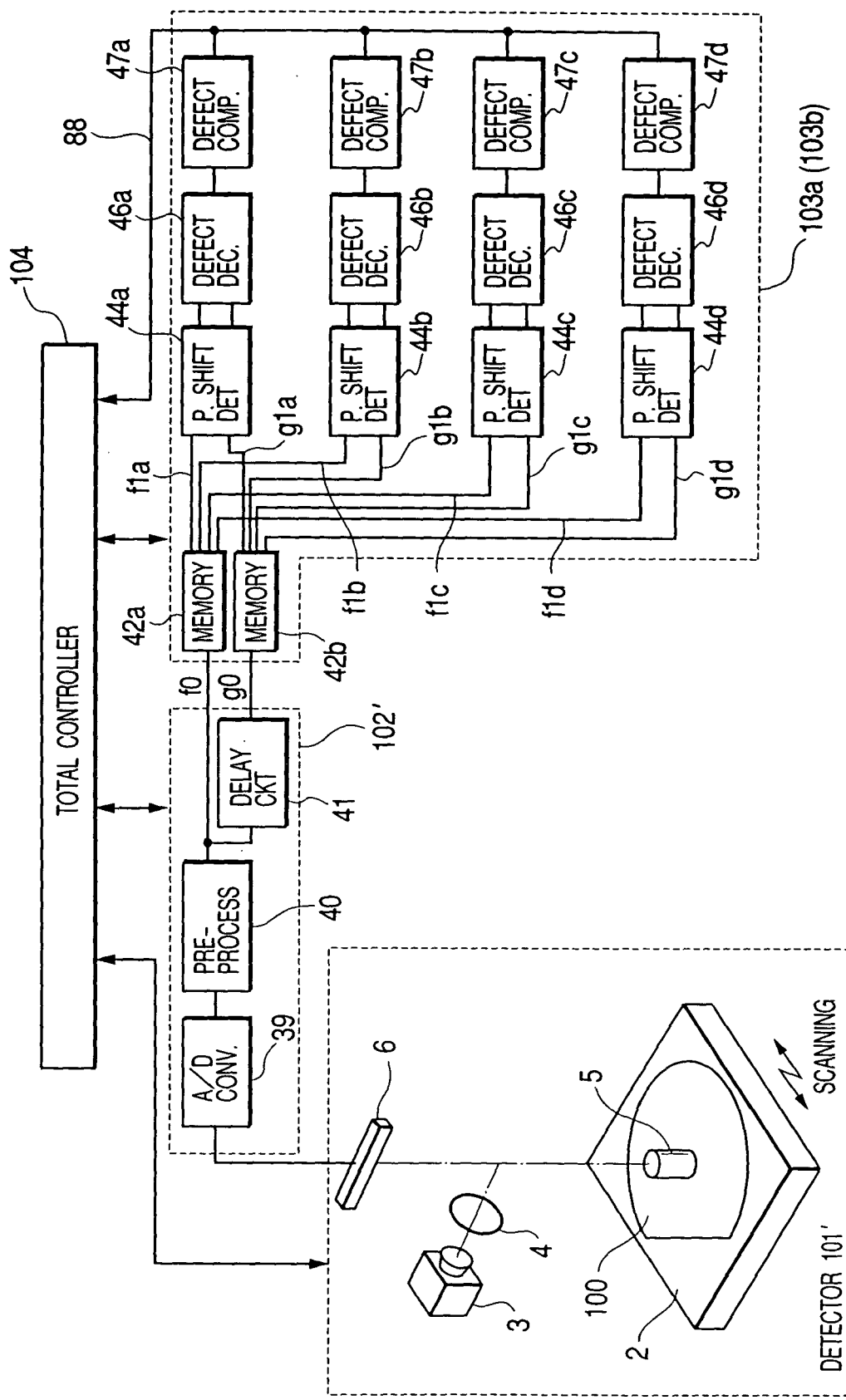

FIG. 30 shows another example of the structure upon combining the second embodiment and the second variation of the first embodiment, according to the present invention; and FIG. 31 shows an outline of construction of a common variation of the first embodiment and the second variation of a pattern testing method and an apparatus with use of an electron microscope, according to the present invention.

DETAILED DESCRIPTION OF PREFERRED EMBODIMENTS

Hereinafter, embodiments of a pattern inspection method and an apparatus according to the present invention will be fully explained by referring to the attached drawings.

<<First Embodiment>>

Figure 1:
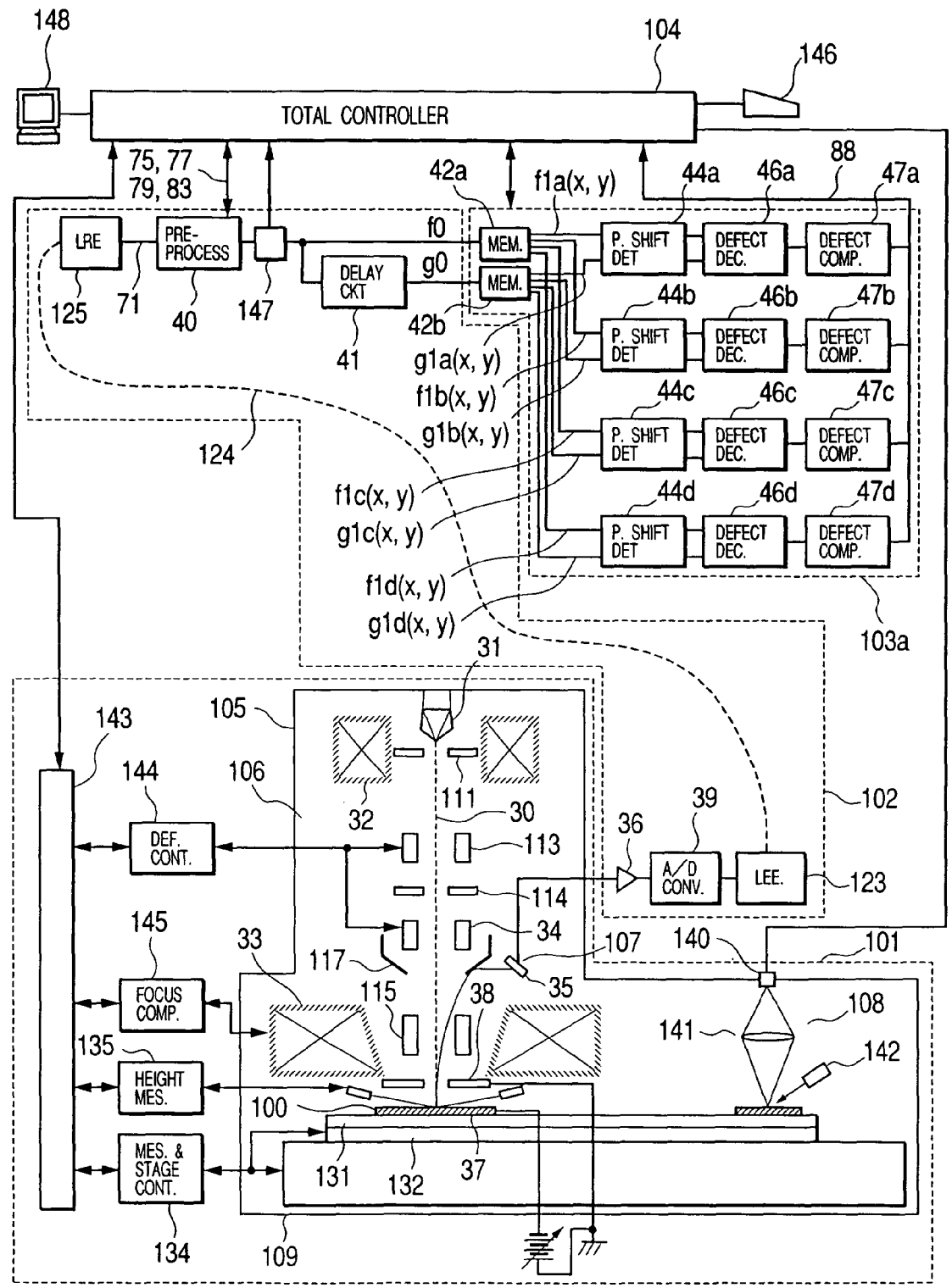
FIG. 1 shows an outline of construction of an first embodiment of a pattern inspecting method and an apparatus thereof with use of an electron microscope, according to the present invention.

A first embodiment of the pattern inspecting method and the apparatus thereof according to the present invention is disclosed in FIG. 1. Here, an object of inspection (i.e., test object to be inspected) 100 such as a semiconductor wafer is scanned with use of an electron gun 30, and electrons generated from the test object 100 by irradiation of the electrons are detected, thereby obtaining an image of electron beams relating a portion to be scanned depending upon changes in the intensity thereof, so as to conduct the pattern inspection with use of the electron beam image.

Figure 2:
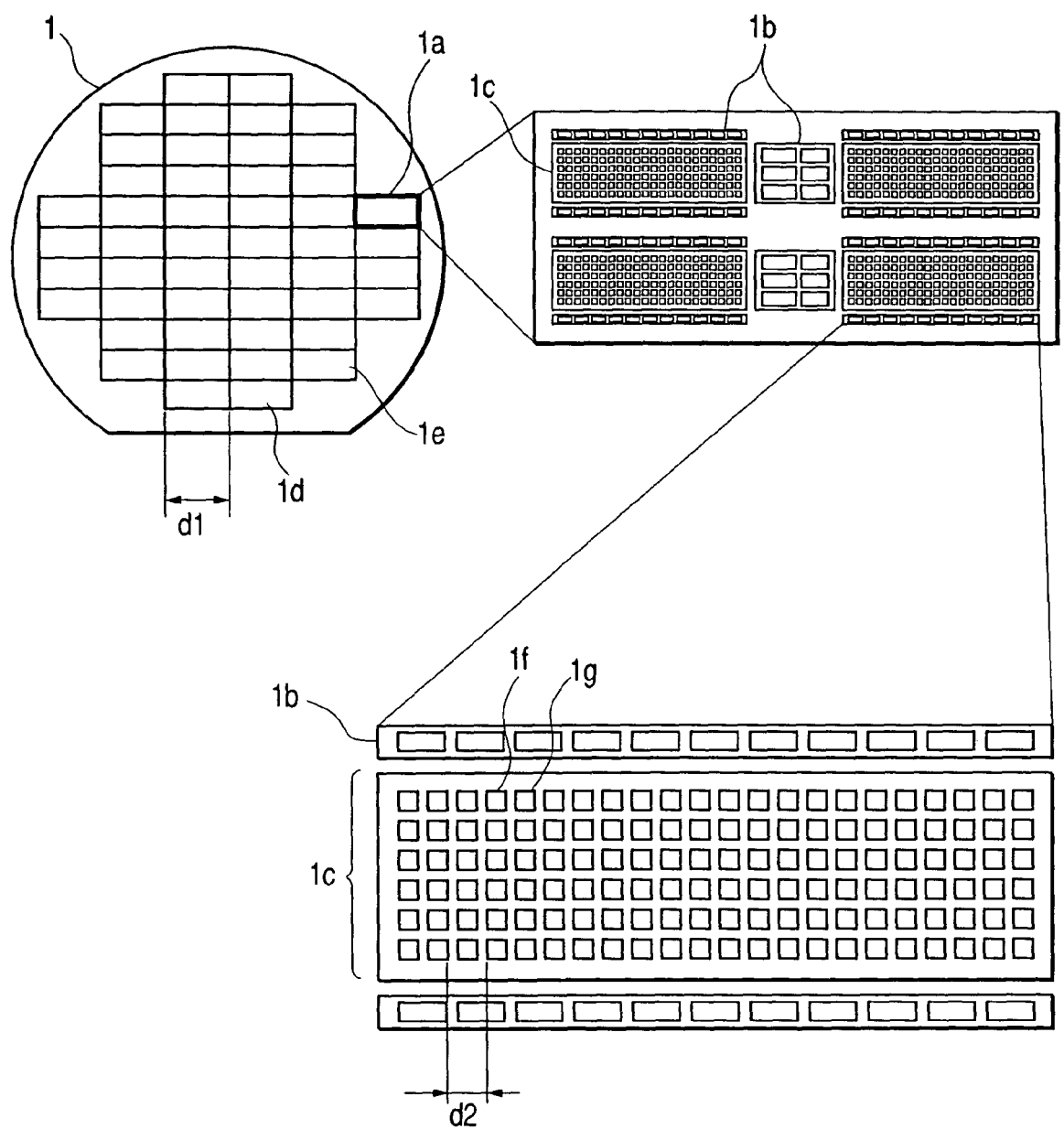
FIG. 2 shows a layout of a semiconductor wafer as an example of an object to be inspected, relating to the present invention.

As the test object 100, it includes the semiconductor wafer 1 which is shown in FIG. 2, for example. On the semiconductor wafer 1 are formed and aligned a large number of chips 1a, each of which comes to be a same product finally. Pattern layout inside of the chip 1a comprises, as shown in an enlarged view of the same figure, memory mat portions 1c in each of which memory cells are aligned at a same pitch two-dimensionally, regularly, and peripheral circuit portions 1b. The pattern inspection of this semiconductor wafer 1 is practiced, for instance, by memorizing an image or picture of a certain chip (for example, a chip 1d) detected in advance and by comparing it with the image detected on other chips (for example, the chip 1e) (hereinafter, it is called by "die to die comparison"), or alternatively, by memorizing the image or picture of a certain memory cell (for example, a memory cell 1*f*) detected in advance and by comparing it to the image detected on other cell (for example, the cell 1*g*) (hereinafter, it is called by "cell to cell comparison").

The present pattern inspecting system comprises, as shown in FIG. 1, a detector portion 101, an image pick-out portion 102, an image processing portion 103, and a total controller portion 104 for controlling the system as a whole. To the total controller portion 104 are connected an input means 146 including a recording medium for inputting information relating to the test object 100 and a standard or reference sample and a network as well, and a display means 148 for displaying (or monitoring) various control information and also information relating to the defects and/or those looking to be like the defects (i.e., the defective candidates) which can be obtained from the image processing portion 103. Further, the present pattern inspection system comprises an inspection chamber 105 which is evacuated and vacuumed therein, and a preliminary chamber (not shown in the figure) for carrying in and out the inspection object 100 into inside of the inspection chamber 105, wherein the preliminary chamber is so constructed that it can be evacuated and vacuumed independent upon the inspection chamber 105.

<Detector Portion 101 of the First Embodiment>

First, the detector portion 101 will be explained by referring to FIG. 1.

Namely, an interior of the inspection chamber 105 in the detector portion 101 is constructed roughly with an electron optic system 106, an electron detector portion 107, a sample chamber 109 and an optical microscope portion 108. The electrical optical system 106 is constructed with an electron gun 31, an electron pulling electrode 111, a condenser lens 32, a deflector 113 for blanking, a scanning deflector 34, a choke 114, an objection lens 33, a reflection plate 117, an ExB deflector 115 and a Faraday cup for detecting beam current (not shown in the figure). The reflection plate 117 is in a conical shape so as to have a secondary electron multiplication function.

An electron detector 35 for detecting such as the secondary electrons and/or reflected electrons of the electron detector portion 107 is positioned in the inspection chamber 105, for instance, above the objection lens 33. An output signal of the electron detector 35 is amplified by an amplifier 36 which is provided outside of the inspection chamber 105.

The sample chamber 109 is constructed with an X stage 131, a Y stage 132, an iconometer 134 for position monitoring, and a height measuring instrument 135 for measuring height of an inspection substrate. However, in place of such the stages as mentioned in the above, a rotary stage can also be provided therefor.

The iconometer 134 for position monitoring monitors the positions of the stages 131, 132 and so on, and transfers the result thereof to the total controller portion 104. Further, a driving system of the stages 131, 132 is also controlled by the total controller portion 104. As a result, the total controller portion 104 is able to obtain the region and/or position where the electron beam 30 is irradiated upon, correctly on a basis of those data.

The height measuring instrument 135 for the inspection substrate, in which an optical measuring instrument is used, measures the height of the test object 100 which is positioned on the stages 131, 132. Then, on a basis of the measured data obtained from the height measuring instrument 135, the focus distance of the objection lens 33 is adjusted for condensing the electron beam finely dynamically, thereby being constructed in such that the electron beam is always irradiated upon the inspection region under a condition of being in focus. Though the height measuring instrument 135 of the inspection substrate is positioned inside the inspection chamber 105 in FIG. 1, however, it can be positioned outside the inspection chamber 105, wherein the light is projected inside the inspection chamber 105 through a glass window or the like.

The optical microscope portion 108 is positioned in a vicinity of the electron optic system 106 within the room of the inspection chamber 105, being separated at such a distance that they do not have influences to each other, and the value of the distance between the electron optic system 106 and the optical microscopic portion 108 is, of course, already known. Then, the X stage 131 or the Y stage 132 moves at the known distance between the electron optic system 106 and the optical microscope portion 108, reciprocally. The optical microscope portion 108 is constructed with a light source 142, an optical lens 141, and a CCD camera 140. The optical microscope portion 108 detects an optical image or picture of the test object 100, for instance the circuit patterns which are formed on the semiconductor wafer 1. On the basis of the detected optical image is calculated a rotary shift or discrepancy in the circuit patterns, and the calculated rotary shift is sent to the total controller portion 104. Then, the total controller portion 104 is able to adjust or compensate the rotary shift by rotating the rotary stage for instance, by an amount or quantity of the rotary shift. Further, the total controller 104 sends the quantity of the rotary shift to a compensation controller circuit 143 so that the compensation controller portion 14 compensates a position of scanning and deflection by the electron beam, for example through the scanning defector 34, thereby enabling the compensation of the rotary shift. Further, the optical microscope portion 108 detects an optical image of the test object 100, for instance the circuit patterns which are formed on the semiconductor wafer 1, so as to be displayed, for example on a monitor (not shown in the figure) to be observed. By inputting coordinates into the total controller portion 104 with use of an input means 146 on a basis of the optical image being observed, it is also possible to set up an inspection area or region into the total controller portion 104. Or, for example, by measuring pitches between or among chips on the circuit patterns formed on such the semiconductor wafer 1 or a repetitive pitches of the repetitive patterns of such the memory cells, in advance, it is also possible to input them into the total controller portion 104. Although the optical microscope portion 108 is positioned inside the inspection chamber 105 in FIG. 1, it can also be positioned outside the inspection chamber 105, thereby detecting the optical image of the semiconductor wafer 1 through the glass window or the like.

As shown in FIG. 1, the electron beam emitted from the electron gun 31 passes through the condenser lens 32 and the objection lens 33, and is condensed into a beam having a diameter of about a pixel size on a sample surface. In this instance, by means of a ground electrode 38 and a retarding electrode 37, a negative potential is applied to the sample 100 so as to decelerate the electron beam between the objection lens 33 and the test object (i.e., the sample) 100, thereby obtaining high resolving power in a low acceleration voltage region. When being irradiated by the electron beam, electron is generated from the test object 100 (i.e., the wafer 1). With the repetitive scanning of the electron beam in the X direction by the scanning deflector 34 and with the detection of the electron which is generated from the test object 100 (i.e., the sample) in synchronism with the continuous movement thereof in the Y direction by the stage 132, a two (2) dimensional electron beam image of the test object 100 can be obtained with continuity (i.e., a continuous image data).

Figure 5:
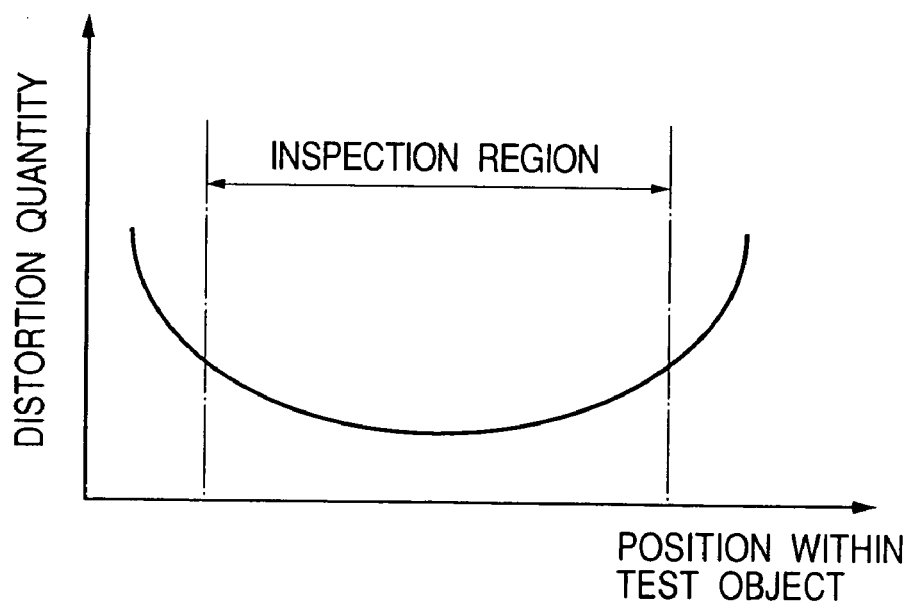
FIG. 5 shows a state of distortion distribution on a detected image with a pattern detecting apparatus by use of the electron microscope.
Figure 6:
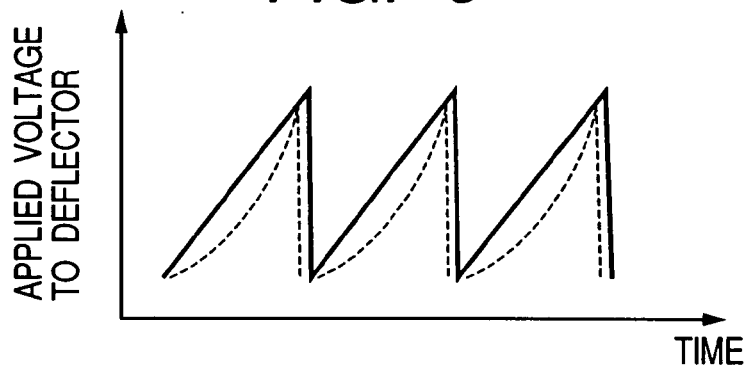
FIG. 6 shows a state in variation of voltage being applied to a deflector.

However, a potential distribution is created by the ground electrode 38 and the retarding electrode 37 in a retarding method, and an effective acceleration voltage is reduced thereby. Even if the stage 132 moves so that an inspection spot comes to an edge (periphery portion) of the test object 100, no distortion occurs as far as the potential distribution is same to that in the central portion, and for that purpose, it is necessary to make the electrodes (i.e., the ground electrode 38 and the retarding electrode 37) large endlessly. However, since it is impossible to enlarge the electrodes endlessly, it is very difficult to bring the edge portion (i.e., the peripheral portion) of the test object and the central portion thereof in magnetic field distribution in the retarding method, therefore, even assuming that no distortion lies in the central portion, there still lies the distortion, in particular, in the peripheral portion of the test object. In this manner, since the magnetic field distribution is distorted in the peripheral portion of the test object 100, the scanning of the electron beam is disturbed, and as the result of this, the distortion or deformation is caused in the detected image (see FIG. 5). Under the condition shown in FIG. 5, it is difficult to inspect the test object all over. As a measure for this, in advance to the inspection, by mounting on the stage 132 the standard or reference sample on which the repetitive patterns having previously known in sizes or shapes thereof are formed, the image which is obtained from such the reference sample in the image pick-up portion 102, is detected and preprocessed to be memorized into memories 42a or 42b. For example, by means of a computer (CPU) within the total controller portion 104 or other computer(s) connected to the total controller portion 104, having the distortion which is calculated from the detected image preprocessed and memorized in the memories 42a or 42b in advance, the electron beam is controlled in scanning speed and scanning point (i.e., X coordinate and Y coordinate) by the deflection controller portion 144 through the compensation controller portion 143, when inspecting. For example, the voltage given to the deflector 34 is changed from a solid line in FIG. 6 to a broken line therein. Since the distortion due to the retarding is reproductive, the distortion can be improved by this method, thereby expanding the region in which the inspection can be done or carried out. For obtaining the data of the distortion in advance, it is preferable to use a sample, for example, on which the same patterns are aligned regularly at appropriate pitches. Or, alternatively it is also possible to manufacture a special sample for use in the measurement of the distortion or deformation, on which such the patterns are formed. And, for obtaining the data of the distortion in advance, the image is detected on the sample with the test patterns having the appropriate pitches in the image pick-up portion 102, and the distortion can be measured on the image detected by the computer (CPU) within the total controller portion 104 or the computer(s) which is/are connected to the total controller portion 104. The computer mentioned in the above recognizes or acknowledges the position for each minimum unit of the repetitive pattern on the image (alternatively, it may acknowledges or recognizes appropriate features of the repetitive patterns, or may performs so-called a template matching with use of the minimum unit of the repetitive patterns, as the template thereof), and it is able to calculate and measure the amount or quantity of distortion by comparing the position being acknowledged with the position at which the above pattern should be located. Although the manner of the distortion is almost reproductive as far as the sample is equal in sizes, however, it comes to be different in the manner of the distortion or deformation if the samples differ in sizes thereof, therefore, it is necessary to have the compensation data for the respective sizes of the samples. Further, on occasions, it differs depending upon the fact whether the pattern on the sample is made of insulating material or of conductive material, therefore, it is necessary to prepare the compensation data appropriately in the above computer(s).

The electrons generated from the test object (the sample) 100 is caught by the detector 35 and amplified by the amplifier 36. Here, for enabling the inspection with high speed, it is preferable to use an electrostatic deflector having a fast deflection speed as the deflector 34 for scanning the electron beam in the X direction repetitively. Further, it is also preferable to use as the electron gun 31 an electron gun of a heat electric field radiation type, with which the electron beam current can be made large thereby shortening the irradiation time, and while to use as the detector 35 a semiconductor detector which can be driven with high speed.

<The Image Pick-up Portion 102 in the First Embodiment>

Next, an explanation will be given on the image pick-up portion 102, by referring to FIGS. 1, 3 and 4.

Namely, an electron detection signal which is detected by the electron detector 35 in the electron detector portion 107 is amplified by the amplifier 36 and is converted into a digital image data (a gradation image data) through the A/D converter 39. And, they are so constructed that the output of the A/D converter 39 is transferred through an optical conversion means (i.e., a light emitting element) 123, a transfer means (i.e., an optical fiber cable) 124 and an electric conversion means (i.e., a light receiving element) 125. With such the construction, it is enough for the transfer means 124 to have a transfer speed which is equal to the clock frequency of the AND converter 39. The output of the A/D converter 39 which is converted into the optical digital signal through the optical conversion means (i.e., the light emitting element) 123, is optically transferred through the transfer means (i.e., the optical fiber cable) 124 and is also converted into the digital image data (i.e., the gradation image data) by the electric conversion means (i.e., the light receiving element) 125. A reason for converting it into the optical signal for the transmission thereof in this manner is in that the constructive elements from the semiconductor detector 35 up to the optical conversion means 123 for conducting the electron 52 from the reflection plate 117 into the semiconductor detector 35 (i.e., the semiconductor detector 35, the amplifier 36, the AID converter 39, and the optical conversion means (the light emitting element) 123), must be floated at a positive high potential by a high voltage source (not shown in the figure).

More correctly, it is enough that only the semiconductor detector must be floated at the high voltage. However, since it is preferable that the amplifier 36 and the A/D converter 39 are positioned directly close to the semiconductor detector for protecting the signal from mixture with noises and deterioration thereof, it is difficult to keep only the semiconductor detector 35 at the positive high voltage, therefore bringing such the constructive elements as mentioned in the above at the high voltage as a whole. Namely, since the transfer means (i.e., the optical fiber cable) 124 is made of high insulating material, the image signal fitting to the positive high potential level can be obtained at the optical conversion means (i.e., the light emitting element) 123, and the image signal of an earth level (or ground level) can be obtained from the electric conversion means (i.e., the light receiving element) 125 after passing through the transfer means (i.e., the optical fiber cable) 124.

Figure 3:
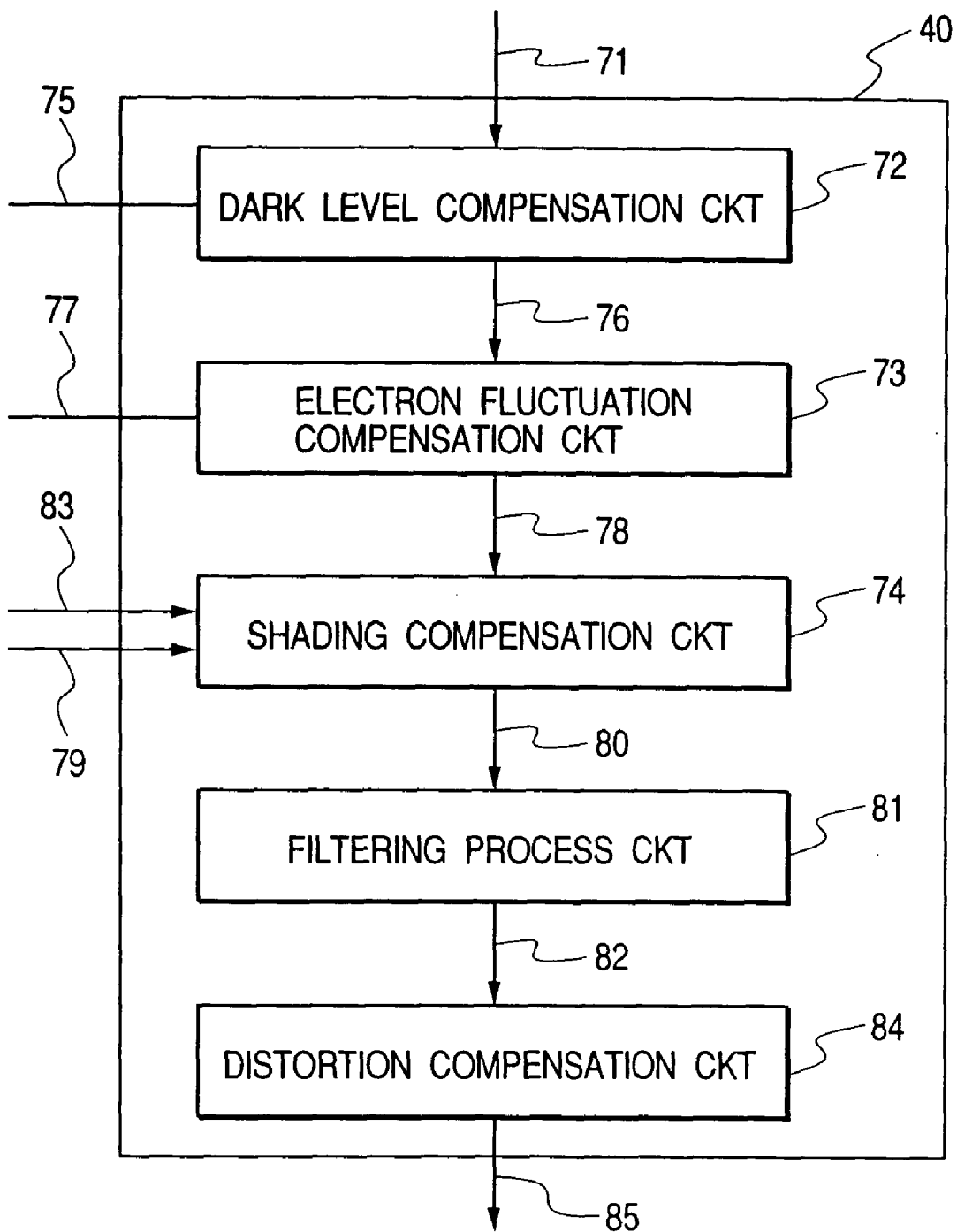
FIG. 3 shows more details of a pre-processing circuit according to the present invention.
Figure 4:
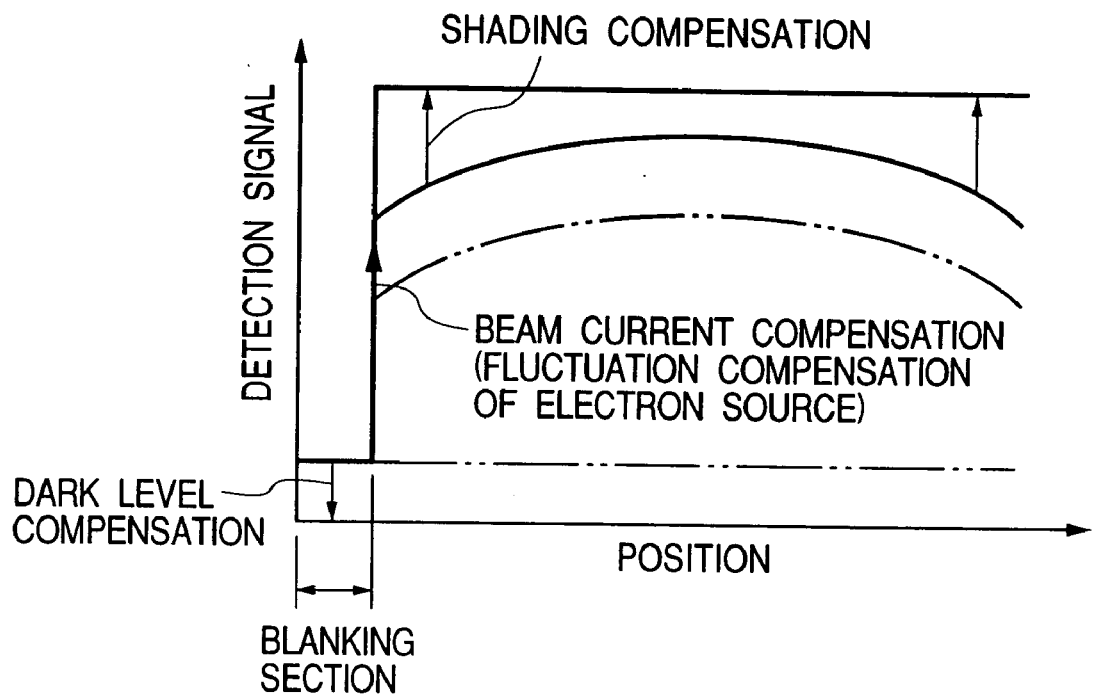
FIG. 4 shows a view for explanation of contents which are compensated in the pre-processing circuit shown in FIG. 3.

The pre-processing circuit (i.e., the image compensation circuit) 40 is, as shown in FIG. 3, constructed with a dark level compensation circuit 72, an electron source fluctuation compensation circuit 73, a shading compensation circuit 74, a filtering processing circuit 81, a distortion compensation circuit 84 and so on. The digital image data (the gradation image data) 71 obtained from the electric conversion means (i.e., the light receiving element) 125 is treated with various image compensations in the pre-processing circuit (i.e., the image compensation circuit) 40, including the compensation in the dark level, the compensation for fluctuation of the electron source, the shading compensation and so on. In the dark level compensation within the dark level compensation circuit 72 is, as shown in FIG. 4, the dark level is compensated upon a basis of the detected signal 71 during a beam blocking period, which is extracted on a basis of a scanning line synchronization signal 75. Namely, a reference signal for compensating the dark level renews the dark level to an average of the gradation values at a specific number of pixels, for instance, at a specific position during the beam blanking period, for the each scanning line. In this manner in the dark level compensation circuit 72, the dark level compensation is conducted so as to compensate the detected signal which is detected during the beam blanking period to the reference signal which is renewed for the each line. The compensation of the fluctuation in the electron source with the electron source fluctuation compensation circuit 73 is practiced, as shown in FIG. 4, by normalizing the detected signal 76 which is compensated in the dark level with a beam current 77 which is monitored by the Faraday cup (not shown in the figure) for detecting the above beam current with a compensation frequency (for example, a line unit of 100 kHz). The fluctuation in the electron source does not change abruptly, therefore, it is also possible to use the beam current which was detected one or several lines before. The shading compensation in the shading compensation circuit 74, as shown in FIG. 4, is to compensate the detected signal 78 which is compensated with the fluctuation in the electron source, with the fluctuation in the amount of light depending on the beam scanning position 79 obtained from the total controller portion 104. Namely, the shading compensation is to compensate (i.e., normalize) each of the pixels on a basis of a reference data 83 of brightness which is detected in advance. The reference data 83 of brightness for use in the shading compensation is detected under the condition that the shading compensation function is turned "off" in advance, and the image data detected is stored into the image memory (for example, 147). The stored image data is sent to the computer which is provided inside the total controller portion 104 or the host computer which is connected to the total controller portion 104 through the network, and is processed to be formed by a software in the computer being provided inside the total controller portion 104 or the host computer being connected to the total controller portion 104 through the network. Or it is also possible that the reference data 83 of the brightness for use in the shading compensation is calculated and stored in the host computer which is connected to the total controller portion 104 through the network in advance, and in this case, it is downloaded when starting the inspection, then it can be taken by the CPU in the shading compensation circuit 74. For coping with a whole field of view, in the shading compensation circuit 74 are provided two (2) pieces of the compensation memories of the pixel number corresponding to swinging width of the ordinary electron beam (for example, 1024 pixels), therefore they are exchanged during the time period when inspecting an outside of the region (i.e., the time period shifting from completion of the inspection of 1 field view to starting of the inspection of next 1 field view). As the compensation data, there are provided a number of data corresponding to the pixels when the electron beam is swung at the maximum width (for example, 5,000 pixels), and in this case, it is enough for the CPU to rewrite them into each of the compensation memories until the completion of the inspection of the next 1 field view.

In the above, after having conducted the dark level compensation (i.e., compensating the dark level on the basis of the detected signal 71 beam during the blanking period), the compensation for the fluctuation in the electron beam current (i.e., monitoring intensity of the beam current and normalizing the signal with the beam current), and the shading compensation (i.e., the compensation for change in the light amount depending upon the beam scanning position) with respect to the digital image data (i.e., the gradation image data) 71 which is obtained from the electric conversion means (i.e., the light receiving element) 125, then the quality of image is improved by treating filtering processes with use such as of a Gaussian filter, an average value filter, or an edge enhancement filter, etc., in the filtering process circuit 81, with respect to the digital image data (i.e., the degradation image data) 80 which is compensated.

Further, if necessary, the distortion or deformation of the image is compensated by the distortion compensation circuit 84. Though it is previously mentioned that the scanning point of the electron beam is controlled by controlling the deflector 34 so as to detect and obtain the image with less distortion, the present distortion compensation circuit 84 is constructed in such that it compensates the distortion on the image which is detected once. Namely, investigating or checking a relationship between the detection position of the image and the amount or quantity of distortion in advance, and then formulating a compensation equation (eq. 1) for the distortion depending upon the coordinates which are shown below, coordinate transformation of the detected image is practiced in accordance with the compensation equation. Namely, assuming that the coordinates of the pixel before compensation are (x, y) and that the coordinates of the pixel after compensation is (X, Y), if the compensation equation is a high dimensional polynomial, it can be expressed by the equation (eq. 1) shown below:

$$X = \sum_{i=1}^{n} \sum_{j=1}^{n} a_{ij} x^{i-1} y^{j-1} \qquad \text{(Eq. 1)}$$

$$Y = \sum_{i=1}^{n} \sum_{j=1}^{n} b_{ij} x^{i-1} y^{j-1}$$

For example, if it is a secondary polynomial, such a relationship is established as shown below by the following equation (eq. 2):

$$X = a_{11} + a_{21}x + a_{12}y + a_{22}xy$$

$$Y = b_{11} + b_{21}x + b_{12}y + b_{22}xy \qquad \text{(Eq. 2)}$$

For investigating or checking the relationship between the detection point and the distortion, on the stage 132 is mounted a standard sample on which are formed the repetitive patterns having known sizes and shapes, and then the detected image is obtained and detected from the said standard sample in the image pick-up portion 102. The detected image is pre-processed and is stored into the memories 42a or 42b, for instance, and then the computer (CPU) within the total controller portion 104 or the computer(s) which is/are connected to the total controller portion 104 recognizes or acknowledges the position of each minimum unit of the repetitive patterns (corresponding to the coordinates (x, y) of the pixel before the compensation) in the detected image which is pre-processed and stored in the memory 42a or 42b. From the relationship between the above acknowledged position for each minimum unit of the repetitive patterns and the position to be laid with said repetitive patterns (corresponding to the coordinates (x, y) of the pixel after the compensation), the coefficients $a_{ij}$ and $b_{ij}$ which are shown in the above equation (Eq. 1) are determined for each coordinate of positions on the sample, for example, by a method of least squire, and are memorized into the distortion compensation circuit 84.

In the distortion compensation circuit 84, in case that the X and Y are non-integers, the values of gradation between the pixels are determined by any one of interpolation approximations. For such the interpolation, a liner approximation expressed by the following equation (eq. 3) can be used for instance.

$$f(x + dx, y + dy) = (1 - dx)(1 - dy)f(x, y) + \qquad \text{(Eq. 3)}$$
$$dx(1 - dy)f(x + 1, y) +$$
$$(1 - dx)dy\, f(x, y + 1) + dxdy\, f(x + 1, y + 1)$$

where the gradation values are f(x, y) at the coordinates (x+dx, y+dy) between the pixels. However, the dx and dy lie between 0 to 0.5.

The various compensations which are practiced in the pre-processing circuit (i.e., the image compensation circuit) 40 shown in FIG. 3 are for converting the detected images, so as to be advantageous in a defect determination process afterward. However, all of those compensations are not always necessary, nor be in such the sequence as shown in FIG. 3.

By the way, the delay circuit 41 which is constructed with shift registers and so on, delays the digital image signal (i.e., the gradation image signal) by a constant time period, being improved in the image quality and supplied from the pre-process circuit 40, and if the delay time is obtained from the total controller portion 104 and then it is set to the time period for moving the stage 2 by a distance of a chip pitch (i.e., d1 in FIG. 2) for example, the signal g0 being delayed and the signal f0 not being delayed come to be the image signals of the same point on the chips neighboring to each other, thereby practicing the die to die comparison inspection mentioned in the above. Or, if the delay time is obtained from the total controller portion 104 and then is set to the time period for moving the stage 2 by a distance of a memory cell (i.e., d2 in FIG. 2), the signal g0 being delayed and the signal f0 not being delayed come to be the image signals of the same point on the memory cells neighboring to each other, thereby practicing the cell to cell comparison inspection mentioned in the above. In this manner, the delay circuit 41 is so constructed to select the delay times arbitrarily by controlling the pixel position to be read-out on the basis of the information which is obtained from the total controller portion 104. In the manner mentioned in the above, the digital image signals (i.e., the gradation image signal) f0 and g0 are taken out from the image pick-up portion 102 to be compared with. Hereinafter, the f0 is called by "detection image" and the g0 by "comparison image".

<Image Processing Portion 103a of the First Embodiment>

Next, an explanation will be given on the image processing portion 103a with reference to FIG. 1.

In the first embodiment according to the present invention, the detection image (i.e., a first image) being the gradation value f0(x,y) at the coordinate (x,y) and the comparison image (i.e., a second image) being the gradation value g0(x,y) at the coordinate (x,y) are compared to practice the defect determination. First of all, the distortion of the image comes to be a problem when comparing them. By means of control of the deflector 34 or by use of the distortion compensation circuit 84, it is possible to compensate a statistic distortion (i.e., a predictable distortion), however, dynamic distortions which are caused due to vibration of the stages 131, 132 and so on, and/or change in magnetic field resulted from the pattern distribution of the test object 100 cannot be compensated in advance.

Figure 7:
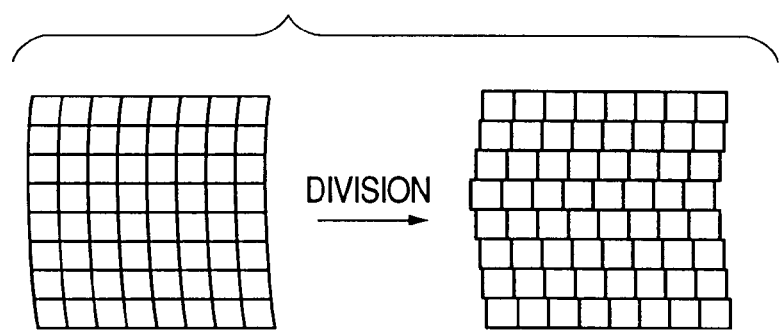
FIG. 7 shows a view for explaining a state when the image is divided into such a size to be negated from distortion thereof.

According to the present invention, for treating with such the dynamic distortions, as shown in FIG. 7, the image is divided finely into such a size that the dynamic distortion can be neglected therefrom, and the defect determination is practiced for each of the unit of the divisions.

The size of the unit of division is determined by taking into the consideration the following aspects (1), (2) and (3).

(1): The degree of distortion of the image which is detected in the system.

(2): The size of the defect to be detected (the smaller the size of defect to be detected is, the slighter the distortion turns up to be a problem).

(3) If the unit of division is made small, the pixels in each division unit also comes to be small in the number thereof, thereby decreasing an accuracy in measuring the shift of the position.

Figure 8:
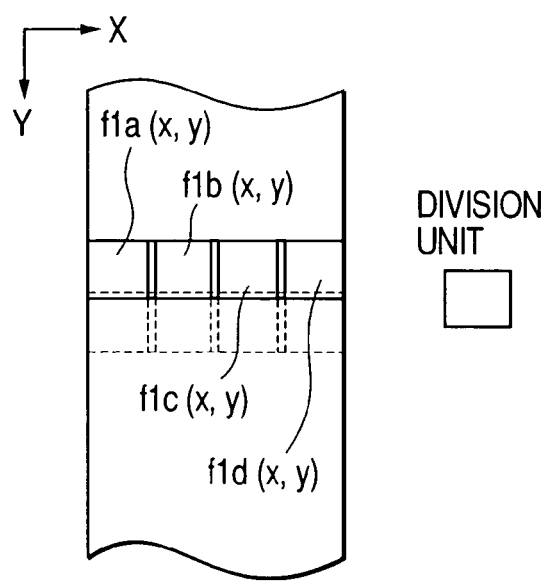
FIG. 8 shows a positional relationship of division units on a continuous image data.

The image processing portion 103 shown in FIG. 1 is the construction for a case of dividing one scanning line in the X direction by the electron beam into four (4), for instance, as shown in FIG. 8. The continuous image data f0(x,y) and g0(x,y) are firstly stored into the respective image memories 42a and 42b of two dimension, respectively. Those image memories 42a and 42b of two dimension are of such memories having a function of freely setting an area from which the data can be read-out. In those image memories 42a and 42b of the two dimension, there are provided two-dimension memory portions 421a and 421b and registers 422a and 422b for storing start and termination addresses for read-out, respectively. The total controller portion 104 sets the registers 422a and 422b to such values that the image of the position shown in FIG. 8 can be processed. With the values, a portion of the image data (i.e., for each division unit) which are memorized in the memory portions 421a and 421b, i.e., f1(x,y) and g1(x,y) are read out. Namely, as shown in FIG. 8, the continuous image data f1(x,y) and g1(x,y) are read out from the areas for the division units memorized in the two-dimension memory portions 421a and 421b, which are set into the registers 422a and 422b for storing the start and termination addresses for read-out by the coordinates for the division units through the total controller portion 104. However, in the above explanation, it is so constructed that the images which are memorized in the respective two-dimension memory portions 421a and 421b are cut out and read out, by the each area of the division unit, which is set by each of the registers 422$a$ and 422$b$ for storing the start and termination addresses for read-out in the image memories 42$a$ and 42$b$. However, it is further possible to provide two-dimension memory portions for every division unit, thereby preparing the continuous image data f1(x,y) and g1(x,y) for the each division unit, by cutting out the image of the each division unit from each of the two-dimension memory portions 421$a$ and 421$b$ on the basis of the coordinates for the each division unit which is designated by the total controller portion 104 and also by memorizing them into- the two-dimension memory portions which are provided for the respective division units.

Figure 10A:
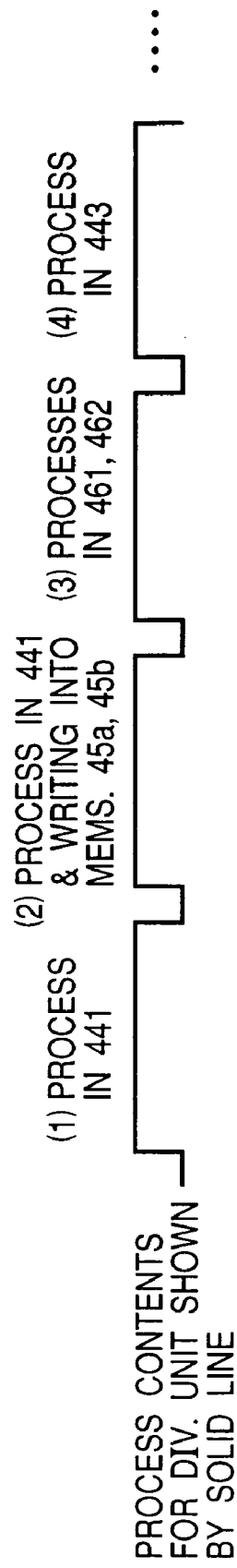
FIG. 10 shows a time-schedule of process contents in the division unit, which are shown by a solid line and a broken line in FIG. 8.
Figure 10B:
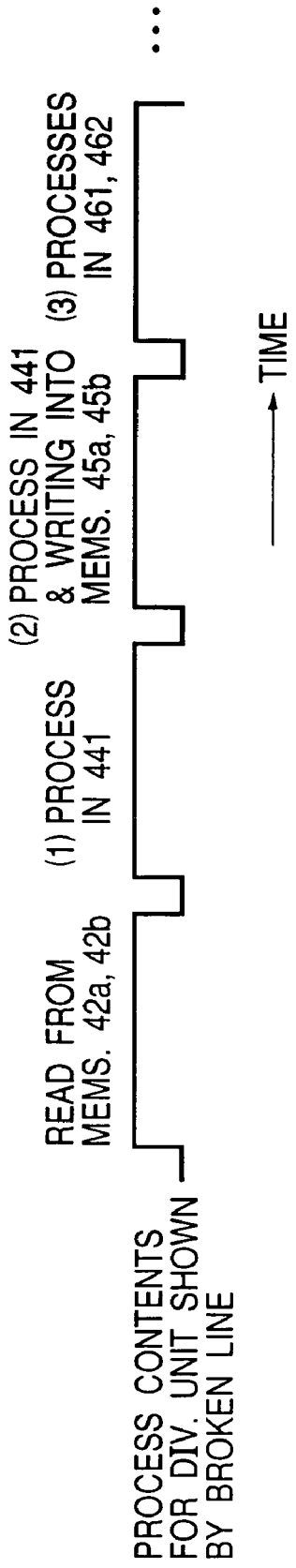

In the position shift detection portion 44$a$ for the division unit, on the first portions f1$a$(x,y) and g1$a$(x,y) of the image which are read out by a first division unit from the respective two-dimension image memories 42$a$ and 42$b$ with the designation on the basis of the coordinates for the each division unit from the total controller portion 104, position alignment is performed by an unit of the pixel within pixel unit position aligning portions 441 and 447 so as to output f2$a$(x,y) and g2$a$(x,y), or f4$a$(x,y) and g4$a$(x,y). Thereafter, in the position shift detector portion 442 for detecting the position shift quantity finer than the pixel unit (i.e., sub-pixel unit), a position shift amount or quantity $\delta$xOa in the x direction and position shift amount or quantity $\delta$yOa in the y direction, i.e., a position shift amount or quantity between f2$a$(x,y) and g2$a$(x,y) or that between f4$a$(x,y) and g4$a$(x,y) is obtained in an accuracy of the sub-pixel. Similarly, in the position shift detector portion 44$b$ for a second division unit area, on the second portions f1$b$(x,y) and g1$b$(x,y) of the picture, which are read out by the second division unit from the respective two-dimension image memories 42$a$ and 42$b$ with the designation on the basis of the coordinates for each division unit from the total controller portion 104, the position alignment is performed by an unit of the pixel in the pixel-unit position aligning portion 441 so as to output f2$b$(x,y) and g2$b$(x,y) or f4$a$(x,y) and g4$a$(x,y). Thereafter, in the position shift detector portion 442 for detecting the shift in the sub-pixel unit, the position shift quantity $\delta$xOb between f2$b$(x,y) and g2$b$(x,y) or $\delta$yOb between f4$b$(x,y) and g4$b$(x,y) is also obtained in the accuracy of sub-pixel unit. In the position shift detector portions 44$c$ and 44$d$ for a third division unit area and for a fourth division unit, similarly, on the third portions f1$c$(x,y) and g1$c$(x,y) of the image and the fourth portions f1$d$(x,y) and g1$d$(x,y) thereof, which are read out by the third division unit and the fourth division unit from the respective the two-dimension image memories 42$a$ and 42$b$ with the designation on the basis of the coordinates for each division unit from the total controller portion 104, the position alignments are performed by the pixel unit in the pixel unit position aligning portions 441 so as to output f2$c$(x,y) and g2$c$(x,y), f4$c$(x,y) and g4$c$(x,y) and f2$d$(x,y) and g2$d$(x,y), or f4$d$(x,y) and g4$d$(x,y). Thereafter, in the position shift detector portion 442 for detecting the shift in the sub-pixel unit, the position shift quantity $\delta$xOc between f2$c$(x,y) and g2$c$(x,y) or $\delta$yOd between f4$d$(x,y) and g4$d$(x,y) is obtained in the accuracy of the sub-pixel unit. A positional relationships of f1$a$(x,y), f1$b$(x,y), f1$c$(x,y) and f1$d$(x,y) on continuous data are shown in FIG. 8 in the coordinates by the division units, which the total controller portion 104 sets up and designates into the image memory 42$a$. A reason for overlapping the division units each other in the areas thereof which the total controller portion 104 sets up and designates onto the picture memory 42$a$, is for avoiding possibility of occurring the region or area which cannot be tested due to the position shift. An amount of the overlapping is necessitated to be more than a maximum value which can be estimated. The position relationships of g1$a$(x,y), g1$b$(x,y), g1$c$(x,y) and g1$d$(x,y) on the continuous data in the coordinates which the total controller portion 104 sets up and designates into the picture memory 42$b$, is also similar to the above. In the position shift detector portions 44$a$–44$d$ for the respective division unit areas (i.e., division unit), as shown in FIG. 10, when the process of position alignment by the division unit is completed, for example, with respect to the image which is read out from each of the memories 42$a$ and 42$b$ by the division unit being indicated with a solid line in FIG. 8, then a process for position alignment is initiated between the images of the division units f2$a$(x,y), f2$b$(x,y), f2$c$(x,y), f2$d$(x,y), and images g2$a$(x,y), g2$b$(x,y), g2$c$(x,y), g2$d$(x,y) which are indicated by broken lines. Namely, in FIG. 10 (a) is shown the contents of the process by the each division unit which is indicated by the solid line, and in FIG. 10 (b) is shown the contents of the process by the each division unit which is indicated by the broken line. The images are detected continuously one by one, therefore, the division unit indicted by the broken line is executed with the process which was executed one step before by the division unit which is indicated by the solid line (i.e., a pipe-line process).

Namely, in the time of "(1) process at 441" on the area of the division unit indicated by the solid line, the read-out of the division unit indicated by the broken line is done from the image memories 42$a$ and 42$b$. Then, in the time of "(2) process at 442 & writing into memories 45$a$, 45$b$" on the division unit indicated by the solid line, the "(1) process at 441" is carried out on the division unit indicated by the broken line. Then, in the time of "(3) processes at 461, 462" on the division unit indicated by the solid line, the "(2) process at 442 & writing into memories 45$a$, 45$b$" is done on the division unit indicated by the broken line. Then, in the time of "(4) process at 463" on the division unit indicated by the solid line, the "(3) processes at 461, 462" on the division unit indicated by the broken line is done. On a while, as shown in FIG. 8, for avoiding the region or area which cannot be tested or inspected, the read-out with the overlapping in the y direction is also necessitated from the image memories 42$a$ and 42$b$. However, between the variations of the first embodiment which will be shown in FIGS. 13, 15, 17, 18 and 20, there can be a difference more or less in the explanation in the above.

Figure 9:
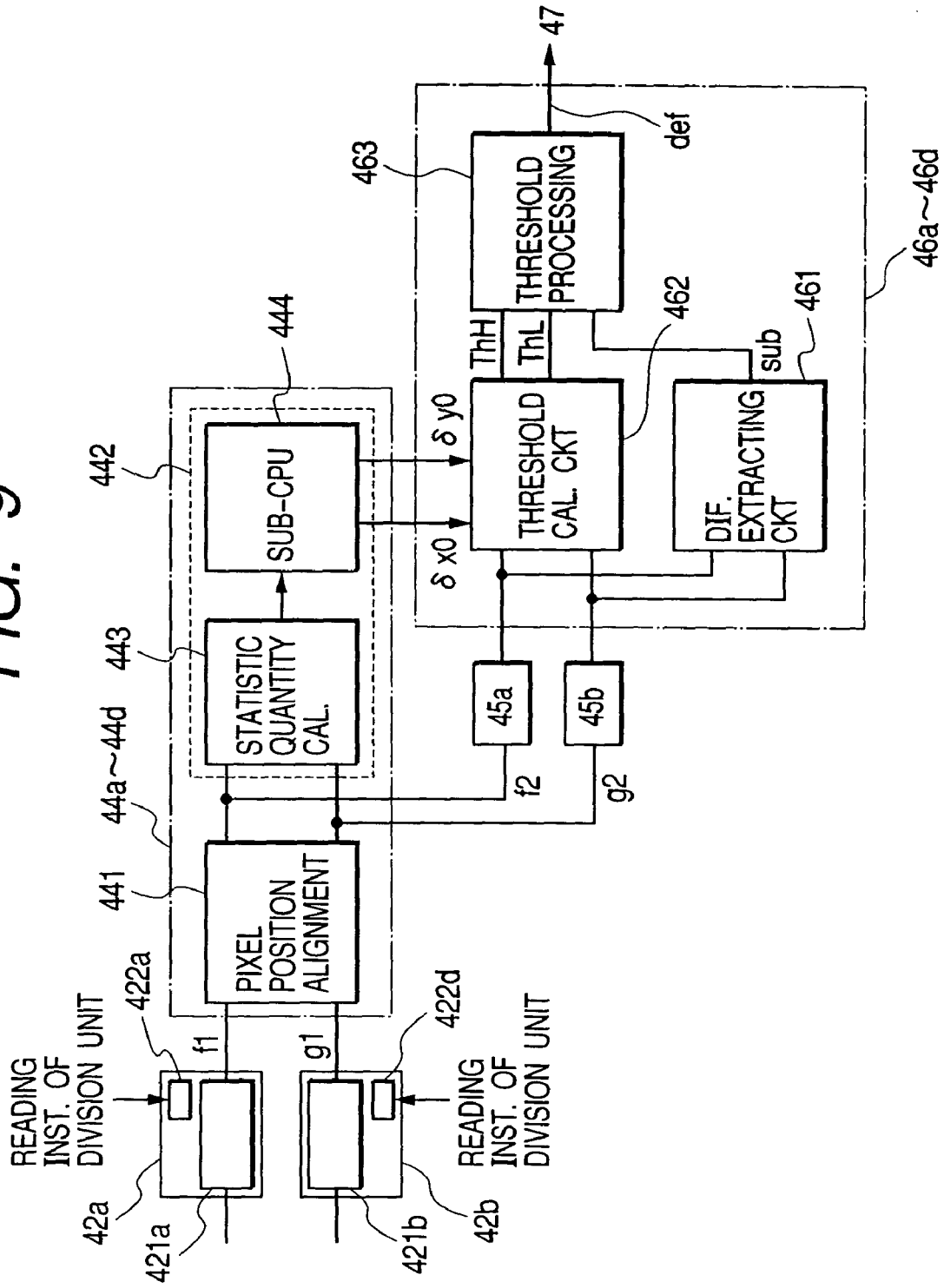
FIG. 9 shows construction of a position shift detector portion and a defect decision portion, relating to the first embodiment of the present invention.

Following, an explanation will be given on the position shift detector portions 44$a$–44$d$ for the respective division units, by referring to FIG. 9. FIG. 9 shows only one set among four sets of the position shift detector portions 44$a$–44$d$ and the defect decision portions 46$a$–46$d$. In the one set of the position shift detector portion 44 for each division unit, after performing the alignment of the position in the accuracy of the pixel unit within the position aligning portion 441 for each division unit, the position shift quantities ($\delta$xO,$\delta$yO) is calculated in the amount or quantity thereof, by an unit finer than the pixel (i.e., sub-pixel unit).

In the position alignment portion 441 for each division unit in the pixel unit, for example, a comparison image g1(x,y) is shifted in the position thereof, in such a manner that the position shift quantity of the comparison picture g1(x,y) with respect to the detected picture f1(x,y) of each division unit area lies between 0 and 1 pixel, in other words, the position where "degree of adjustment" between f1(x,y) and g1(x,y) reaches a maximum value lies between 0 and 1 pixel.

Further, the "degree of adjustment" mentioned above can be expressed by the following equation (Eq. 4).

$$\Sigma\Sigma|f1-g1|, \Sigma\Sigma(f1-g1)^2 \quad \text{(Eq. 4)}$$

The above $\Sigma\Sigma|f1-g1|$ means the sum of absolute values of the differences between the detected image f0(x,y) and the comparison or reference image g1(x,y) in the image of all over the division unit areas. While, the $\Sigma\Sigma(f1-g1)^2$ means the value integrated in the x direction and the y direction all over the respective division unit areas, by multiplying the difference between the detected image f0(x,y) and the comparison image g1(x,y) by itself. Or, alternatively, a well-known mutual correlation between f1 and g1 can also be applied thereto. Here, an explanation will be given in a case where the $\Sigma\Sigma|f1-g1|$ is adopted.

It is assumed that a shift amount or quantity of the comparison image g1(x,y) in the x direction is mx, and my in the y direction thereof (where mx and my are integers), and e1(mx,my) and s1(mx,my) are defined as the following equations (Eq. 5) and (Eq. 6).

$$e1(mx,my)=\Sigma\Sigma|f1(x,y)-g1(x+mx,y+my)| \quad \text{(Eq.5)}$$

$$s1(mx,my)=e1(mx,my)+e1(mx+1,my)+e1(mx,my+1)+e1(mx+1,my+1) \quad \text{(Eq. 6)}$$

In the (Eq. 5), $\Sigma\Sigma$ means the sum within each division unit area. What should be obtained here are the shift amount or quantity mx in the x direction and that in the y direction, so that the s1(mx,my) is minimum. Therefore, the s1(mx,my) is calculated in each time when the mx and my are varied ±0, 1, 2, 3, 4 n, in other words by shifting the comparison image g1(x,y) by the pitch of the pixel in each division unit area. Then, the values of mx and my, i.e., mx0 and my0 when it is at the minimum value are obtained. However, the maximum shift amount or quantity n of the comparison image must be a large value depending upon the positioning accuracy of the detector portion 101, i.e., the larger, the worthier in the positioning accuracy.

From the pixel unit position aligning portion 441 for each division unit, the comparison image g1(x,y) obtained for each division unit is outputted, being shifted by (mx0,my0) while keeping the detected image f1(x,y) obtained for each division unit area as be original one (i.e., without change therein). Namely, f2(x,y)=f1(x,y) and g2(x,y)=g1(x+mx0,y+my0). However, if the images f1 and g1 are originally same to each other in the sizes, the areas at the pixel width mx0 and the pixel width my0 comes to be invalid due to the position shift of mx0 and my0 on the periphery of the picture of each division unit are (since it is the area where there is no picture to be compared with). In FIG. 8, the overlap between the division units is due to existence of those invalid areas.

Figure 11:
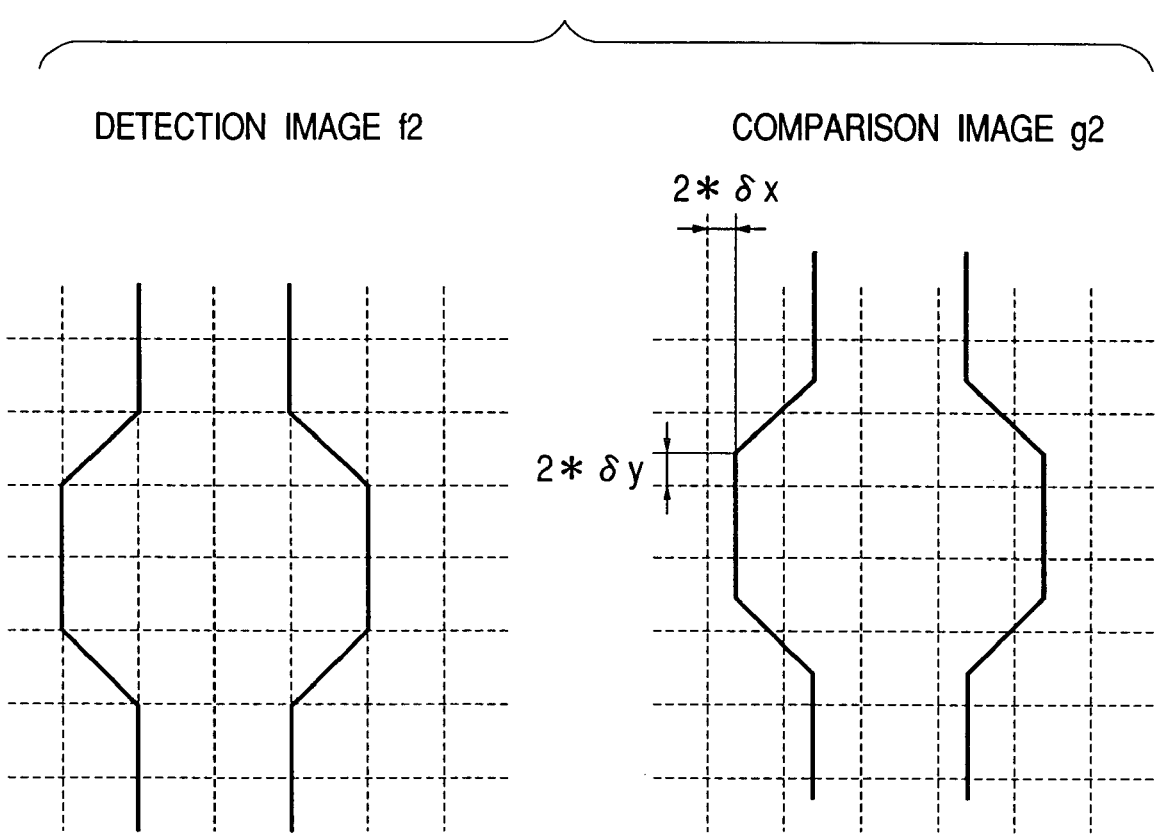
FIG. 11 shows a view for explaining meaning of the position shift of sub-pixel unit.

In the position shift detector portion 442 for each division unit area, detecting it in the sub-pixel unit, the position shift quantity less than the pixel is calculated over the division unit area (the position shift quantity comes to be a real number between 0 and 1). The position shift quantity over the division unit area is a condition as shown in FIG. 11. In FIG. 11, a squire indicated by a chained line is the pixel, and it is a unit that is detected by an electron detector 35 and to be converted into a digital value by sampling with the AND converter 39.

In the same figure, the comparison image g2 for each division unit area (over the division unit) is shifted in the position, by only 2*δx in the x direction and 2*δy in the y direction, with respect to the detected image f2 (over the division unit areas). For measuring the degree of adjustment, there is also a choice as indicated by the equation (Eq. 4), however, here is shown an example where the "sum of squires of the differences" (i.e., $\Sigma\Sigma(f1-g1)^2$) is applied to.

Now, it is assumed that the position shift amount or quantity at a central position of the detected image f2 (x,y) for the each division unit and the comparison image g2(x,y) for the each division unit is zero (0). Namely, under the condition shown in FIG. 11, it is assumed that f2 is shifted only by −δx in the x direction and by −δy in the y direction, and g2 is shifted only by +δx in the x direction and by +δy in the y direction. Since δx and δy are not the integers, there is a necessity of defining the value between the pixel and the pixel for shifting it only by δx and δy. The detected image f3 for the each division unit area, which is shifted by +δx in the x direction and by +δy in the y direction, and the comparison image g3, which is shifted by −δx in the x direction and by −δy in the y direction, are defined by the following equations (Eq. 7) and (Eq. 8).

$$\begin{aligned} f3(x,y) &= f2(x+\delta x, y+\delta y) \\ &= f2(x,y) + \delta x(f2(x-1,y) - f2(x,y)) + \\ &\quad \delta y(f2(x,y)+1) - f2(x,y) \end{aligned} \quad \text{(Eq. 7)}$$

$$\begin{aligned} g3(x,y) &= g2(x-\delta x, y-\delta by) \\ &= g2(x,y) + \delta x(g2(x-1,y) - g2(x,y)) + \\ &\quad \delta y(g2(x,y-1) - g2(x,y)) \end{aligned} \quad \text{(Eq. 8)}$$

The equations (Eq. 7) and (Eq. 8) are so-called the linear compensations. The degree of adjustment or compensation e2(δx,δy) between f3 and g3 comes to be indicated by the following equation (Eq. 9) when applying the "sum of squires of the differences".

$$e2(\delta x,\delta y)=\Sigma\Sigma(f3(x,y)-g3(x,y))^2 \quad \text{(Eq. 9)}$$

The above $\Sigma\Sigma$ is the sum within the division unit area. A purpose of the position shift detector portion 442 for the each division unit, detecting it in the sub-pixel unit, is to obtain the values of δx and by, i.e., δx0 and δy0 with which the e2(δx,δy) takes the minimum value within the division unit area. For that purpose, the equation (Eq. 9) mentioned in the above is differentiated with partial differentiation by δx and δy and is put to be equal 0, to be solved with respect to δx and δy. The result comes to be indicated by the equations (Eq. 10) and (Eq. 11) as follows.

$$\begin{aligned}\delta x0=&\{(\Sigma\Sigma C0*Cy)*(\Sigma\Sigma Cx*Cy)-(\Sigma\Sigma C0*Cx)* \\ &(\Sigma\Sigma Cy*Cy)/\}(\Sigma\Sigma Cx*Cx)*(\Sigma\Sigma Cy*Cy)- \\ &(\Sigma\Sigma Cx*Cy)*(\Sigma\Sigma Cx*Cy)\end{aligned} \quad \text{(Eq. 10)}$$

$$\begin{aligned}\delta y0=&\{(\Sigma\Sigma C0*Cx)*(\Sigma\Sigma Cx*Cy)-(\Sigma\Sigma C0*Cy)* \\ &(\Sigma\Sigma Cx*Cx)/\}(\Sigma\Sigma Cx*Cx)*(\Sigma\Sigma Cy*Cy)- \\ &(\Sigma\Sigma Cx*Cy)*(\Sigma\Sigma Cx*Cy)\end{aligned} \quad \text{(Eq. 11)}.$$

Where, the above C0, Cx, and Cy are in the relationships shown by the following equations (Eq. 12), (Eq. 13) and (Eq. 14).

$$C0=f2(x,y)-g2(x,y) \quad \text{(Eq. 12)}$$

$$Cx=\{f2(x+1,y)-f2(x,y)\}-\{g2(x-1,y)-g2(x,y)\} \quad \text{(Eq. 13)}$$

$$Cy=\{f^2(x,y+1)-f2(x,y)\}-\{g2(x,y-1)-g2(x,y)\} \quad \text{(Eq. 14)}$$

For obtaining each of δx and δy, as shown in the (Eq. 10) and (Eq. 11) mentioned above, there is necessity of obtaining the various statistical (total) quantity of $\Sigma\Sigma Ck*Ck$ (however, Ck=C0, Cx, Cy) mentioned above. The statistical quantity calculating portion 443, bridging over the division unit, calculates the above-mentioned various kinds of statistical quantities ΣΣCk*Ck on a basis of the detection image f2(x,y) of each division unit, consisting of the gradation value of each division unit aligned by the pixel unit and obtained from the position alignment unit 441 of each pixel unit, and the comparison (reference) image g2(x,y) of each division unit. The sub-CPU 444 executes calculation of the above equations (Eq. 10) and (Eq. 11) by using the ΣΣCk*Ck which is calculated over the division units in the statistical quantity calculating portion 443, so as to obtain δx0 and δy0.

Delay circuits 45a and 45b, each comprising a shift register and so on, are provided for delaying the image signals f2 and g2 by a time period which is necessitated for obtaining the δx0 and δy0 in the position shift detecting unit 442 for detecting the position shift of the each division unit in the sub-pixel unit.

Following to the above, a defect determining portion 64 for each one set of division units within defect determining portions 64a–64d for each division unit shown in FIG. 1 will be explained by referring to FIG. 9. Within the division unit defect determining portion 64, while a difference image between the detection image f2 of the each division unit and the comparison image g2 of the each division unit being formed in a difference extracting circuit 461, a threshold value for each pixel is calculated in a threshold calculating circuit 462 for each division unit, and the difference image is compared with the threshold values in the gradation values, thereby determining to be the defect or not, in a threshold value processing unit 463.

The difference extracting circuit 461 for the each division unit obtains a difference image sub(x,y) for each division unit between the division unit detection image f2 and the division unit comparison image g2, having the position gaps 2*δx0 and 2*δy0 upon the calculation thereof. This difference image sub(x,y) of each division unit can be expressed by the following equation (Eq. 15):

$$\text{sub}(x,y)=g1(x,y)-f1(x,y) \quad \text{(Eq. 15)}$$

Figure 12:
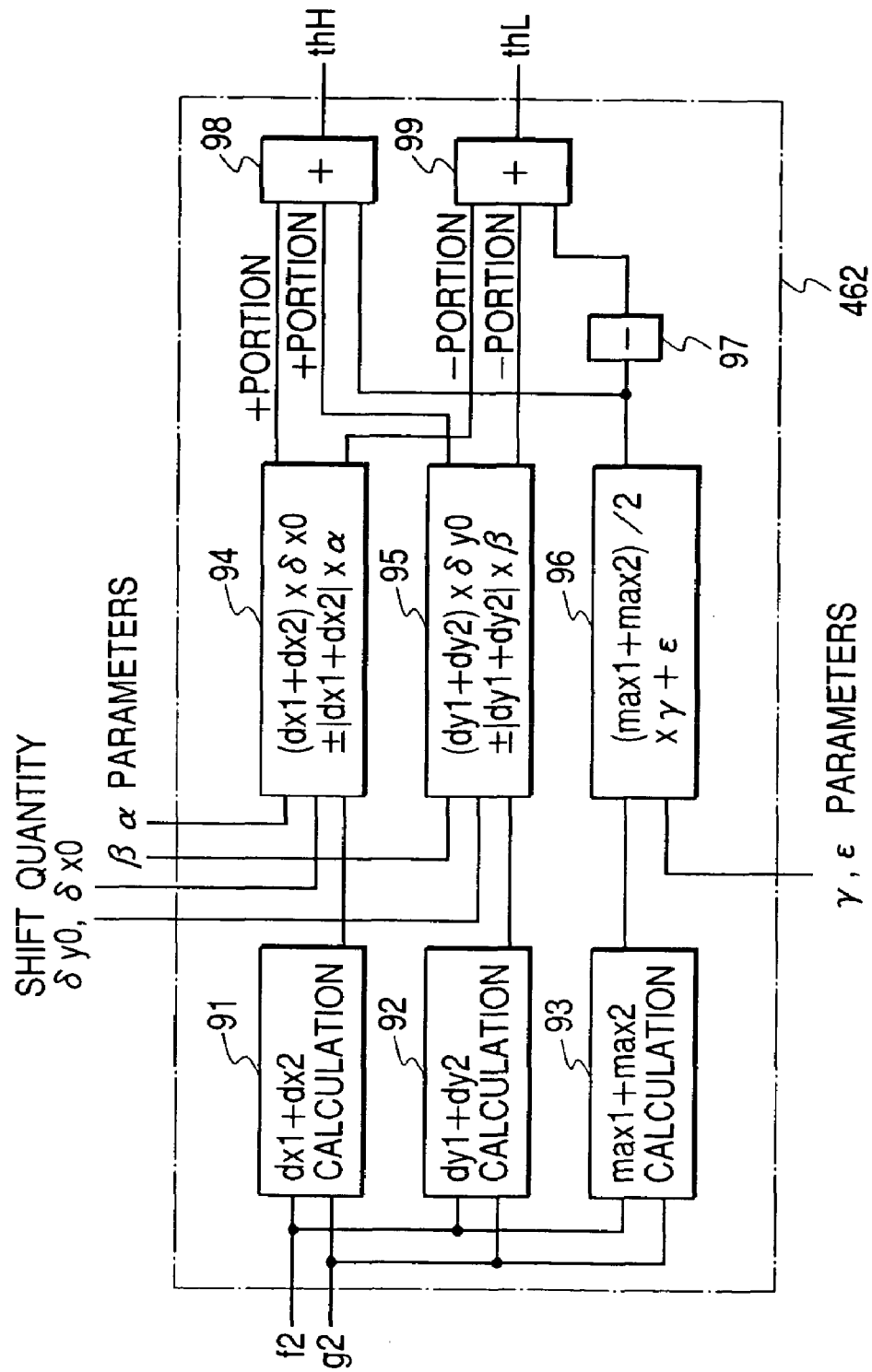
FIG. 12 shows detailed structure of a threshold calculating circuit, according to the first embodiment of the present invention.

The threshold value calculating circuit 462 of each division unit lo calculates two threshold values thH(x,y) and thL(x,y) to determine to be the defective candidate or not, by using the position shift quantities δx0 and δy0 of each division unit in the sub-pixel unit, which are obtained from the position shift detector portion 442 of the sub-pixel unit. The thH(x,y) is a threshold value for restricting an upper limit of the difference image sub(x,y) obtained for each division unit, and the thL(x,y) a threshold value for restricting a lower limit of the difference image sub(x,y) obtained for each division unit. The construction of the threshold value calculating circuit 462 for each division unit is shown in FIG. 12. The contents of the calculations which are executed in the threshold value calculating circuit 462 are expressed by the following equations (Eq. 16) and (Eq. 17).

$$thH(x,y)=A(x,y)+B(x,y)+C(x,y) \quad \text{(Eq. 16)}$$

$$thL(x,y)=A(x,y)-B(x,y)-C(x,y) \quad \text{(Eq. 17)}$$

However, the above A(x,y) can be expressed by the following equation (Eq. 18), and is a clause for compensation the threshold value depending upon the value of the difference image sub(x,y) which can be substantially obtained for each division unit by using the position shift quantities δx0 and δy0 in sub-pixel unit which are obtained for each division unit.

Also, the above B(x,y) can be the following equation (Eq. 19), and is a clause for allowing or tolerating a minute position shift at the pattern edge (also, a minute differences in the pattern shape or in the pattern deformation can be treated as the minute position shift at the pattern edge, from a local view point), between the detection image f2 obtained for each division unit and the comparison image g2 obtained for each division unit. Further, the above C(x,y) can be the following equation (Eq. 20), and is a clause for allowing or tolerating a minute difference in the gradation value between the detection image f2 obtained for each division unit and the comparison image g2 obtained for each division unit.

$$A(x,y) = \{dx1(x,y)*\delta x0 - dx2(x,y)*(-\delta x0)\} + \\ \{dy1(x,y)*\delta y0 - dy2(x,y)*(-\delta y0)\} \\ = \{dx1(x,y) + dx2(x,y)\}*\delta x0 + \\ \{dy1(x,y) + dy2(x,y)\}*\delta y0 \quad \text{(Eq. 18)}$$

$$B(x,y) = |\{dx1(x,y)*\alpha - dx2(x,y)*(-\alpha)\}| + \\ |\{dy1(x,y)*\beta - dy2(x,y)*(-\beta)\}| \\ = |\{dx1(x,y) + dx2(x,y)\}*\alpha| + \\ |\{dy1(x,y) + dy2(x,y)\}*B| \quad \text{(Eq. 19)}$$

$$C(x,y)=((\max1+\max2)/2)\gamma+\epsilon \quad \text{(Eq. 20)}$$

where, α or β is a real number from 0 to 0.5, γ a real number being equal or greater than 0, and ε an integer being equal or greater than 0.

The dx1(x,y) can be expressed by a relationship of the following equation (Eq. 21) and indicates an amount of change in the gradation values on the detection image f2(x,y) obtained for each division unit with respect to the image neighboring by +1 in the x direction.

And, the dx2(x,y) can be expressed by a relationship of the following equation (Eq. 22) and indicates an amount of change in the gradation values on the comparison image g2(x,y) obtained for each division unit with respect to the image neighboring by −1 in the x direction.

Further, the dy1(x,y) can be expressed by a relationship of the following equation (Eq. 23) and indicates an amount of change in the gradation values on the detection image f2(x,y) obtained for each division unit with respect to the image neighboring by +1 in the x direction.

Furthermore, the dy2(x,y) can be expressed by a relationship of the following equation (Eq. 24) and indicates an amount of change in the gradation values on the comparison image g2(x,y) obtained for each division unit with respect to the image neighboring by −1 in the x direction.

$$dx1(x,y)=f2(x+1,y)-f2(x,y) \quad \text{(Eq. 21)}$$

$$dx2(x,y)=g2(x,y)-g2(x-1,y) \quad \text{(Eq. 22)}$$

$$dy1(x,y)=f2(x,y+1)-f2(x,y) \quad \text{(Eq. 23)}$$

$$dy2(x,y)=g2(x,y)-g2(x,y-1) \quad \text{(Eq. 24)}$$

The max1 can be expressed by the following equation (Eq. 25), and indicates the maximum gradation value among the detection images, including the detection image f2(x,y) obtained for the each division unit itself and the images neighboring it by +1 in the x direction and +1 in the y direction. And, max2 can be expressed by the following equation (Eq. 26), and indicates the maximum gradation value among the comparison images, including the comparison image g2(x,y) obtained for the each division unit itself and the images neighboring it by −1 in the x direction and −1 in the y direction.

$$\max1=\max\{f2(x,y), f2(x+1,y), f2(x,y+1); f2(x+1,y+1)\} \quad \text{(Eq. 25)}$$

$$\max2=\max\{g2(x,y), g2(x-1,y), g2(x,y-1), g2(x-1,y-1)\} \quad \text{(Eq. 26)}$$

First, an explanation will be given on the first clause, A(x,y) in the equations (Eq. 16) and (Eq. 17) for calculating the threshold values for the each division, thH(x,y) and thL(x,y). Namely, the first clause, A(x,y) in the equations (Eq. 16) and (Eq. 17) for calculating the threshold values thH(x,y) and thL(x,y) for the each division, is a clause for compensating the threshold value depending upon the position shift quantities δx0 and δy0 for the each is division unit in the sub-pixel unit, which are obtained by the position shift detecting portion 442 for the each division unit in the sub-pixel unit. For example, since the dx1 which is expressed by the equation (Eq. 21) indicates a local changing rate in the x direction of the gradation values of the detection image f2 for the each division unit, the dx1(x,y)*δx0 for the division unit shown in the equation (Eq. 18) can be said an estimation value of the gradation values of the f2 when the position is shifted by δx0. Therefore, the first clause, {dx1(x,y)*δx0−dx2(x,y)*(−δx0)}+{dy1(x,y)*δy0−dy2(x,y)*(−δy0)} for the each division unit shown in the equation (Eq. 18) can be said a value of change in the gradation values of the difference image between f2 and g2, which is estimated for the each pixel, when the position of f2 is shifted by δx0 in the x direction and δy0 in the y direction. Similarly, the second clause also can be said a value estimated but in the y direction. Namely, the {dx1(x,y)+dx2(x,y)}*δx0 for the each division unit is the estimated value of change in the gradation values of the difference image between f2 and g2 in the x direction, by multiplying the position shift δx0 with the local changing rate, {dx1(x,y)+dx2(x,y)}, in the x direction of the difference image between the detection image f2 for the each division unit and the comparison image g2 for the each division unit, and the {dy1(x,y)+dy2(x,y)}*δy0 for the each division unit is the estimated value of change in the gradation values of the difference image between f2 and g2 in the y direction, by multiplying the position shift δy0 with the local changing rate, {dy1(x,y)+dy2(x,y)}, in the y direction of the difference image between the detection image f2 for the each division unit and the comparison image g2 for the each division unit.

As explained in the above, the first clause, A(x,y) in the threshold values thH(x,y) and thL(x,y) for the each division unit is the clause for canceling the position shifts, δx0 and δy0 which are known in advance for the each division unit.

Next, an explanation will be given on the second clause, B(x,y) in the equations (Eq. 16) and (Eq. 17) for calculating the threshold values thH(x,y) and thL(x,y) for the each division unit. Namely, the second clause, B(x,y) in the equations (Eq. 16) and (Eq. 17) for calculating the threshold values thH(x,y) and thL(x,y) for the each division unit, is a clause for allowing or tolerating the minute position shift at the pattern edge of the each division unit (also, a minute differences in the pattern shape or in the pattern deformation can be treated as the minute position shift at the pattern edge, from a local view point). As is apparent from comparison between the equations (Eq. 18) and (Eq. 19) for obtaining the A(x,y) and the B(x,y), the later B(x,y) indicates an absolute value of the estimated change in the gradation values of the difference image by the position shifts α and β. If the position shift can be canceled by the A(x,y), the addition of B(x,y) to A(x,y) means that the position is shifted further by α in the x direction and β in they direction from an aligned condition, by taking into the consideration the minute position shift at the pattern edge due to the minute difference on the basis the form of the pattern, as well as the deformation thereof. Namely, that for allowance or tolerance of +α in the x direction and +β in the y direction, as the minute position shift at the pattern edge due to the minute difference on the basis the form of the pattern, as well as the deformation thereof for the each division unit, is the clause +B(x,y) shown in the above-mentioned equation (Eq. 16). Further, as is shown in the above equation (Eq. 17), the subtraction of B(x,y) from A(x,y) means that the position is shifted further by −α in the x direction and −β in the y direction from the aligned condition for the each division unit. That for allowing or tolerating −α in the x direction and −β in the y direction is the clause −B(x,y) shown in the above equation (Eq. 17). As indicated by the equations (Eq. 16) and (Eq.17), with provision of the upper limit thH(x,y) and the lower limit theL(x,y) in the threshold value for each division unit, it is possible to allow or tolerate the position shift, by ±α and ±β for the each division unit. And, in the threshold value calculating circuit 462 for the each division unit, it is possible to control the allowable or tolerable position shift quantity (the minute position shift at the pattern edge) due to the minute difference on the basis of shapes of the patterns and the deformation thereof for each division unit freely, by setting up the values of inputted parameters, α and β at appropriate values thereof.

Next, an explanation will be given on the third clause, C(x,y) in the equations (Eq. 16) and (Eq. 17) for calculating the threshold values thH(x,y) and thL(x,y) for each division unit. The C(x,y) in the equations (Eq. 16) and (Eq. 17) for calculating the threshold values thH(x,y) and thL(x,y) for the each division unit, is the clause for allowing or tolerating the minute difference in the gradation value, between the detection image f2 for the each division unit and the comparison image g2 for the each division unit. As shown in the equation (Eq. 16), the addition of the C(x,y) means that the gradation value of the comparison image g2 for the each division unit is allowed to be greater than that of the detection image f2 for the each division unit by the C(x,y), while the subtraction of the C(x,y), as indicated by the equation (Eq. 17), means the gradation value of the comparison image g2 for the each division unit is allowed to be smaller than that of the detection image f2 for the each division unit by the C(x,y).

Although the C(x,y) is described here as the sum of a representative value (here, the max-value) of the gradation value in a local area multiplied by a constant proportion y and the constant ε, as shown in the equation (Eq. 20), there is no necessity of always relating to that function. If the way of change in the gradation values is known, the function being fitted to that may be preferably applied to it. For instance, if an amplitude of the change is proportional to the squire root of the gradation value, the function should be as the following equation (Eq. 27) in place of the above equation (Eq. 20):

$$C(x,y)=(\sqrt{(\max1+\max2)}*\gamma+\epsilon) \quad \text{(Eq. 27)}$$

Further, it is also possible to provide a look-up table (LUT) of the C(x,y) with respect to- various representative values for the gradation values in advance, so as to output the C(x,y) once the representative value of the gradation value is input thereto. The LOT is preferable in a case where it is difficult to express the way of change by means of such the function. And, in the threshold value calculating circuit 462 for each division unit, similar in the B(x,y), it is also possible to control the allowable or tolerable difference in the gradation value for each division unit freely, by the parameters γ and ε to be inputted.

As shown in FIG. 12, the threshold value calculating circuit 462 for each division unit comprises a calculation circuit 91 for executing a calculation, i.e., dx1(x,y)+dx2(x,y)}, on a basis of the detection image f2(x,y) for each division unit inputted from the delay circuit 45 and the comparison image g2(x,y) for each division unit, a calculation circuit 92 for executing a calculation, i.e., {dy1(x,y)+dy2(x,y)}, and a calculation circuit 93 for executing a calculation, i.e., (max1+max2).

Further, a calculation circuit 94 executes a calculation on a basis of {dx1(x,y)+dx2(x,y)} obtained from the calculation circuit 91 for each division unit, δx0 obtained from the detector portion 442 in sub-pixel unit for each division unit, and the parameter a to be inputted, i.e., ({dx1(x,y)+dx2(x,y)}*δx0 ±|{dx1(x,y)−dx2(x,y)}|*α as a portion of the equation (Eq. 18) and a portion of the equation (Eq.19). A calculation circuit 95 executes a calculation on a basis of {dy1(x,y)+dy2(x,y)} obtained from the calculation circuit 92 for each division unit, δy0 obtained from the detector portion 44 in the sub-pixel unit for each division unit, and the parameter β to be inputted, i.e., ({dy1(x,y)+dy2(x,y)}*δy0±|{dy1(x,y)+dy2(x,y)}|*β as a portion of the equation (Eq. 18) and a portion of the equation (Eq. 19). A calculation circuit 96 executes a calculation on a basis of the (max1+max2) obtained for each division unit from the calculation circuit 93, the inputted parameters γ and ε, i.e., ((max1+max2)/2)*γ+ε, following the equation (Eq. 20) for example.

Further, the threshold value calculation circuit 462 comprises an addition circuit 98 for outputting the threshold value thH(x,y) at the upper limit by summing ({dx1(x,y)+dx2(x,y)}*δx0+|{dx1(x,y)+dx2(x,y)}|*α) obtained from the calculation circuit 94, ({dy1(x,y)+dy2(x,y)}*δy0+|{dy1(x,y)+dy2(x,y)}|*β) obtained from the calculation circuit 95, and ((max1+max2)/2)*γ+ε) obtained from the calculation circuit 96, a subtraction circuit 97 for subtracting by ((max1+max2)/2)*γ+ε) obtained from the calculation circuit 96, and addition circuit 99 for outputting the threshold value thL(x,y) at the lower limit by summing ({dx1(x,y)+dx2(x,y)}*δx0−|{dxl(x,y)+dx2(x,y)}|*α) obtained from the calculation circuit 94, ({dyl(x,y)+dy2(x,y)}*δy0−|{dy1(x,y)+dy2(x,y)}|*β) obtained from the calculation circuit 95, and −((max1+max2)/2)*γ+ε) obtained from the subtraction circuit 97.

However, it is preferable that the parameters α, β, γ and ε to be inputted are prepared in a test parameter file in which the appropriate values of the parameters α, β, γ and ε are described for each kind of the inspection objects (i.e., for each variation of the wafers or processes), and that there is provided a such device with which the file is automatically loaded when the inspection is started by inputting the variation thereof.

The threshold value processing portion 463 for each division unit decides or determines the pixel of a position (x,y) at a certain division unit to be the non-defective candidate if it satisfies the relationship of the following equation (Eq. 28), while to be the defective candidate if it does not satisfy it, by using the difference image sub(x,y) obtained from the difference image extracting circuit (difference extracting circuit) 461, the threshold value thL(x,y) at the lower limit and the threshold value thH(x,y) at the upper limit for each division unit, which are obtained from the threshold value calculation circuit 462 for each division unit. The threshold value processing portion 463 for each division unit outputs a bi-valued or digitized image def(x,y) having "0" for the non-defective candidate and "1" for the defective candidate in a certain division unit.

$$ThL(x,y) \leq \text{sub}(x,y) \leq thH(x,y) \qquad \text{(Eq. 28)}$$

In the defect compiling portions 47a, 47b, 47c and 47d for each division unit in FIG. 1, after removing a noise-like output (for instance, all of 3×3 pixels are not defective candidate pixels at the same time) by a noise removing process (for instance, shrinking/expanding is executed with respect-to the digitized image def(x,y)). For example, when all of 3×3 pixels are not the defective candidates at the same time, the shrinking process is executed by making only the central pixel of them such as "0" (the non-defective candidate pixel) for removing them, and the expanding is executed for turning it back again), a merge process for the defective candidate portion is executed by collecting the neighboring defective candidate portions. After that, in the each division unit, characteristic quantity 88 is calculated for each unity of the defective candidate portion collected, such as the position coordinates for the center of gravity, projection lengths (indicating the maximum lengths in the x and y directions. However, the squire root of (squire of X projection length+Y projection length) comes to be the maximum length), areas thereof and so on, to be outputted into the total controller portion 104.

As is explained in the above, from the image processing portion 103a which is controlled by the total controller portion 104, the characteristic quantity 88 (such as, the coordinate position for the center of gravity, the XY projection lengths, the area, etc.) of the each defective candidate is obtained.

In the total controller portion 104, the position coordinates of the defective candidate on the detection image are converted into the coordinate system on the object 100 to be inspected (i.e., the sample) and are executed with removal of the suspected defects, and finally are compiled as defect data, consisting of the position on the object 100 to be inspected (i.e., the sample) and the characteristic quantities which are calculated from the defect compiling portions 47a, 47b, 47c and 47d for each division unit in the image processing portion 103a.

According to the present embodiment, since the defect determination is executed after the detection image is divided into such the size that the image distortion or deformation can be neglected therefrom and compensated with the position shift for each division unit, it is possible to prevent from bringing or occurring a false or wrong report which is often caused by the image deformation. Further, since the minute position shift at the each pattern edge and/or the minute difference in the gradation values can be allowed or tolerated, it is free from the error of recognizing the normal portion as the defect. Further, by setting up the parameters α, β, γ and ε at the appropriate values thereof, it is also possible to control the allowable or tolerable quantity or amount in the change of the position shift and the gradation values with ease.

However, in the explanation in the above, the thH(x,y) is obtained by adding A(x,y) to B(x,y)+C(x,y) (see the equation (Eq. 16)), while obtaining thL(x,y) by subtracting B(x,y)+C(x,y) from A(x,y) (see the equation (Eq. 17)). However, in place of this, it is also possible to use the following equations (Eq. 29) and (Eq. 30):

$$thH(x,y) = \sqrt{A(x,y) + \{B(x,y) + C(x,y)\}} \qquad \text{(Eq. 29)}$$

$$thL(x,y) = \sqrt{A(x,y) - \{B(x,y) + C(x,y)\}} \qquad \text{(Eq. 30)}$$

With those equations (Eq. 29) and (Eq. 30), through the hardware comes to be large in the scale thereof, but if the minute position shift at each the pattern edge and the change of gradation values are independent in phenomena, rather the equations (Eq. 29) and (Eq. 30) are in conformity with those, realistically, thereby obtaining the higher performance or capacity.

Further, although the equations (Eq. 18), (Eq. 19) and (Eq. 20) are used as a method for calculating A(x,y), B(x,y) and C(x,y) here, there also may be various calculating methods other than that. According to the present invention, those various methods also can be involved therein.

<Option Function of the First Embodiment>

The pattern inspection apparatus according to the present invention includes the following optional functions for supporting the inspection other than the pattern inspection function which was mentioned in the above.

(1) Input of Detection Image:

The image data, being started from a point at desire starting coordinates for picking up the image, which is inputted from the input means 146, etc., is stored into the memory 147, therefore there can be provided a function that it is inputted into the computer provided within the total controller apparatus 104 or a higher ranked computer connected to the total controller apparatus 104 through the network, or that it is displayed on the display means 148 such as a display. Further, it is also possible to obtain the image data under a condition where all or a part of the functions of the preprocessing circuit 40 is turned into OFF.

(2) Image Processing Means on the Computer:

The computer which is provided within the total controller apparatus 104 or the higher ranked computer connected to the total controller apparatus 104 through the network, has the following image processing functions:

a. production/display function of histogram of the image and/or calculation/display function of image of cross-section.

With those functions, it is possible for the user to decide appropriateness of various image compensation in the pre-processing circuit 40, or to set up an optimum condition (for example, acceleration voltage value, beam current value, coefficient for aberration compensation, off-set value for auto-focusing, etc.) by comparing the images which changes when adjusting the conditions of the electron optic system of the image pickup portion 102 variously.

b. Function of Measuring Deforming Condition in Image:

This is a function of measuring the deformation or distortion in the image so as to display a deforming condition for each coordinates on the display, or to teach also amplitude and/or frequency, etc., of the deformation, if necessary. As mentioned previously, with the present inspecting apparatus, the inspection of the deformed image is achieved or realized by dividing the image into the size so that the deformation thereof can be neglected therefrom. However, the condition of the deformation differs depending upon the materials or sizes of the test object, or the deformation at the issue also differs upon the inspection efficiency or property which is needed. The present function is useful to decide the way to divide it (though there is an upper limit in the maximum pixel number for dealing with each division unit due to the construction of the hardware, however, it is so constructed that it can be set up freely as far as it is less than that).

c. Test Inspection Function:

This is a function to realize a comparison inspection being similar to that executed in the image processing portion 103 on the computer. With this function, it is possible for the user to obtain an optimum value by trying to change the inspection results, in particular, when the way of division is changed and/or adjusted with the various inspection parameters. In the case of the electron optic system, since there is no guarantee in that an equal image always can be obtained (due to influences of charge-up and/or contamination, etc.), it is impossible, without this function, to see the influence upon the inspection results which are purely brought by those inspection parameters. Further, it has another function of displaying an image, not only a final inspection result, but also an image at a middle stage, such as the image before the position shift compensation or the difference image, etc.

<First Variation of the First Embodiment>

Figure 13:
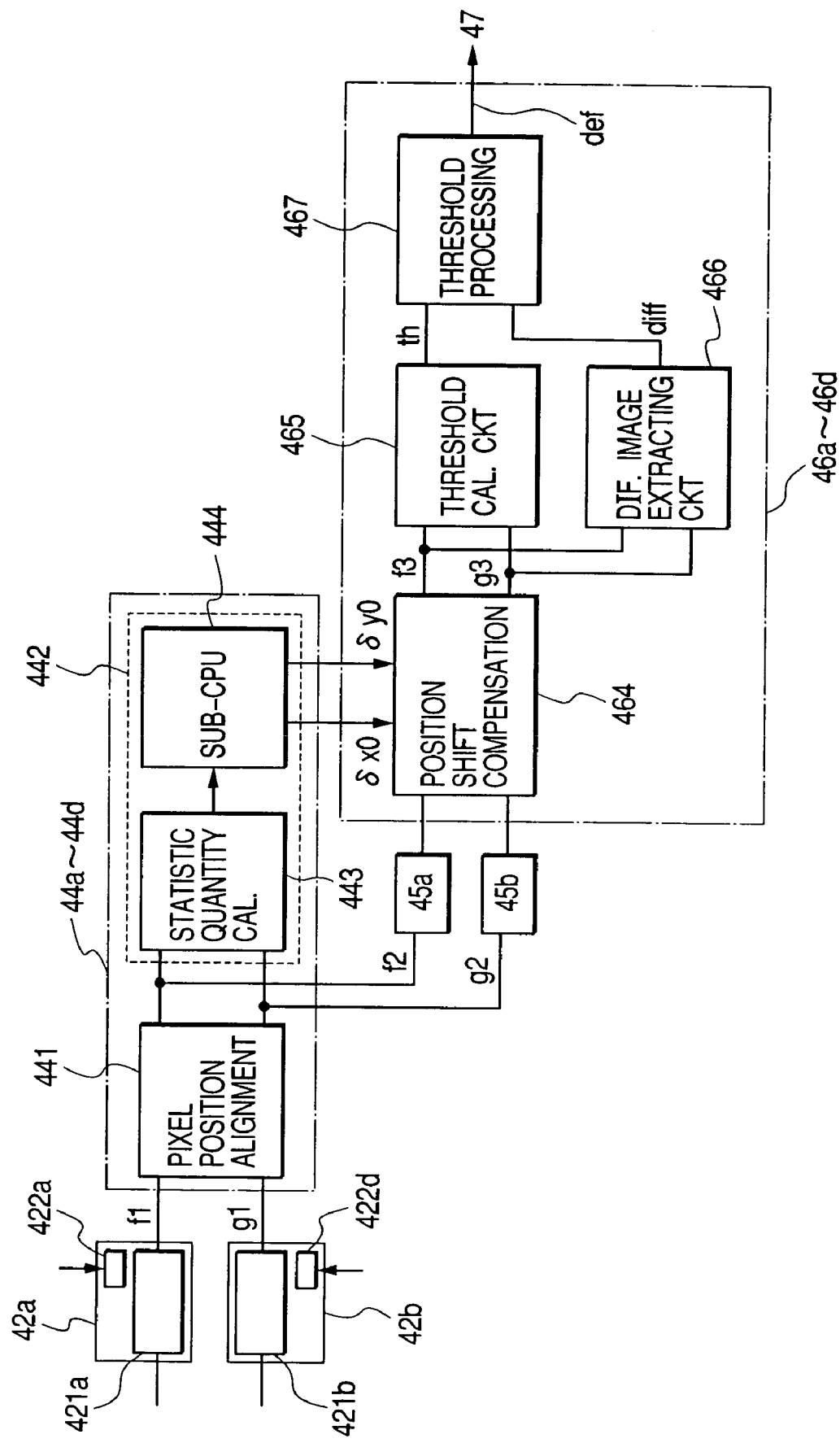
FIG. 13 shows a view of the structure of a position shift detector portion and a defect decision portion in a first variation of the first embodiment, according to the present invention.

A first variation of the first embodiment of the pattern inspecting method and the apparatus thereof according to the present invention will be shown in FIG. 13. Although the change in gradation values due to the position shift of the sub-pixel unit is estimated for each division unit to be introduced into the threshold value in the present first embodiment shown in FIG. 9, however, in the present first variation, an image aligned in the position is produced in the position shift compensation portion 464 for each division unit, by using the position shift quantities, δx0 and δy0, which are obtained as the results of the position shift detection in the sub-pixel unit for each division unit, in place of estimation of the change in the gradation value. In the position shift compensation portion 464 for each division unit, there are produced an image f3(x,y) obtained by shifting the detection image f2(x,y) by δx0 in the x direction and δy0 in the y direction, which is obtained by aligning the position in the pixel unit for each division unit according to the following equation (Eq. 31), and an image g3(x,y) obtained by shifting the comparison image g2(x,y) by −δx0 in the x direction and −δy0 in the y direction, which is obtained by aligning the position in the pixel unit for each division unit according to the following equation (Eq. 32).

$$f3(x, y) = f2(x + dxo, y + dyo) = (1 - dx0)(1 - dy0)f2(x, y) + \\ dx0(1 - dyo)f2(x + 1, y) + (1 - dx0)dy0f2(x, y + 1) + \\ dx0dy0f2(x + 1, y + 1) \quad \text{(Eq. 31)}$$

$$g3(x, y) = g2(x - dx0, y - dy0) = (1 - dx0)(1 - dy0)g2(x, y) + \\ dx0(1 - dy0)g2(x - 1, y) + (1 - dx0)dy0g2(x, y - 1) + \\ dx0dy0g2(x - 1, y - 1) \quad \text{(Eq. 32)}$$

The above equations (Eq. 31) and (Eq. 32) are for the purpose of a so-called hyperbola compensation. Though lowering a little bit in accuracy, it is also possible to use the linear compensation indicated by the equations (Eq. 7) and (Eq. 8) mentioned in the above, in place of those equations (Eq. 31) and (Eq. 32). Alternatively, other compensation methods than the hyperbola compensation and the linear compensation also can be applied thereto.

The difference extracting circuit 466 for each division 20 unit obtains an absolute value image diff(x,y) of the difference between the detection image f2 and the comparison image g2 for each division unit which are compensated in the position shift compensation portion 464 for each division unit. This absolute value image diff(x,y) can be expressed by the following equation (Eq. 33).

$$\text{diff}(x,y) = |g3(x,y) - f3(x,y)| \quad \text{(Eq. 33)}$$

The threshold value calculation circuit 465 for each division unit calculates the threshold value th(x,y) for judging or deciding to be the defective candidate or not for each division unit by using the images f3 and g3 which are compensated in the position shift compensating portion 464 for each division unit. The contents of calculation in the threshold value calculation circuit 465 for each division unit is expressed by the following equation (Eq. 34).

$$th(x,y)=B(x,y)+C(x,y) \quad \text{(Eq. 34)}$$

Though B(x,y) could be same to that in the equation (Eq. 19) (in this case, but f2 and g2 must be changed to f3 and g3 in the equations (Eq. 21), (Eq. 22), (Eq. 23) and (Eq. 24)), however, it is calculated by the following equation (Eq. 35) here. Also, C(x,y) could be same to that in the equation (Eq. 20) (in this case, but f2 and g2 must be changed to f3 and g3 in the equations (Eq. 25) and (Eq. 26)), however, it is calculated by the following equation (Eq. 36) here.

$$B(x,y)=[\{\max f(x,y)-\min f(x,y)\}/2+\{\max g(x,y)-\min g(x,y)\}/2]/2 \times a \quad \text{(Eq. 35)}$$

$$C(x,y)=((f3(x,y)+g3(x,y))/2) \times b+c \quad \text{(Eq. 36)}$$

where, "a" is a real number from 0 to 0.5, "b" a real number greater than 0, and "c" an integer greater than 0.

However, maxf(x,y) is the maximum value among 3×3 pixels in the vicinity of f3(x,y) presented in the following equation (Eq. 37), minf(x,y) is the minimum value among 3×3 pixels in the vicinity of f3(x,y) presented in the following equation (Eq. 38), maxg(x,y) is the maximum value among 3×3 pixels in the vicinity of g3(x,y) presented in the following equation (Eq. 39), and minf(x,y) is the minimum value among 3×3 pixels in the vicinity of g3(x,y) presented in the following equation (Eq. 40).

$$\max f(x, y) = \max - \{f3(x-1, y-1), f3(x, y-1), \quad \text{(Eq. 37)}$$
$$f3(x+1, y-1), f3(x-1, y)f3(x, y), f3(x+1, y),$$
$$f3(x-1, y+1), f3(x, y+1), f3(x+1, y+1)\}$$

$$\min f(x, y) = \min\{f3(x-1, y-1), f3(x, y-1), \quad \text{(Eq. 38)}$$
$$f3(x+1, y-1), f3(x-1, y)f3(x, y), f3(x+1, y),$$
$$f3(x-1, y+1), f3(x, y+1), f3(x+1, y+1)\}$$

$$\max g(x, y) = \max\{g3(x-1, y-1), g3(x, y-1), \quad \text{(Eq. 39)}$$
$$g3(x+1, y-1), g^3(x-1, y)g3(x, y), g3(x+1, y),$$
$$g3(x-1, y+1), g3(x, y+1), g3(x+1, y+1)\}$$

$$\min g(x, y) = \min\{g3(x-1, y-1), g3(x, y-1), \quad \text{(Eq. 40)}$$
$$g3(x+1, y-1), g3(x-1, y)g3(x, y), g3(x+1, y),$$
$$g3(x-1, y+1), g3(x, y+1), g3(x+1, y+1)\}$$

First, an explanation will be given on the first clause, B(x,y) in the equation (Eq. 34), for calculating the threshold value th(x,y) for each division unit. The portion, F=(maxf(x,y)−minf(x,y))/2 in the equation (Eq. 35) represents the changing rate of the gradation values (i.e., change in the gradation value per one pixel) in the 3×3 pixels in the vicinity of the detection image f3(x,y) compensated by the position shift compensation portion 464 for each division unit, and the portion, G=(maxg(x,y)−ming(x,y))/2 represents the changing rate of the gradation value (i.e., change in the gradation value per one pixel) in the 3×3 pixels in the vicinity of the comparison image g3(x,y) compensated by the position shift compensation portion 464 for each division unit, therefore, the [F+G]/2 before being multiplied by "a" comes to be an average of the changing rates in the gradation values of f3(x,y) and g3(x,y). Accordingly, the B(x,y) obtained by multiplying the [F+G]/2 by "a" can be interpreted as an estimated value of change in the absolute value image diff(x,y) of the difference, which is caused by the position shift "a". Namely, the B(x,y) which can be represented by the equation (Eq. 35) means, in similar to the B(x,y) represented by the equation (Eq. 19), that it allows the "a" as the minute position shift at the pattern edge. And, as the a and, did in the equation (Eq. 19), it is possible to control the allowable or tolerable amount or quantity freely by this "a".

Figure 14:
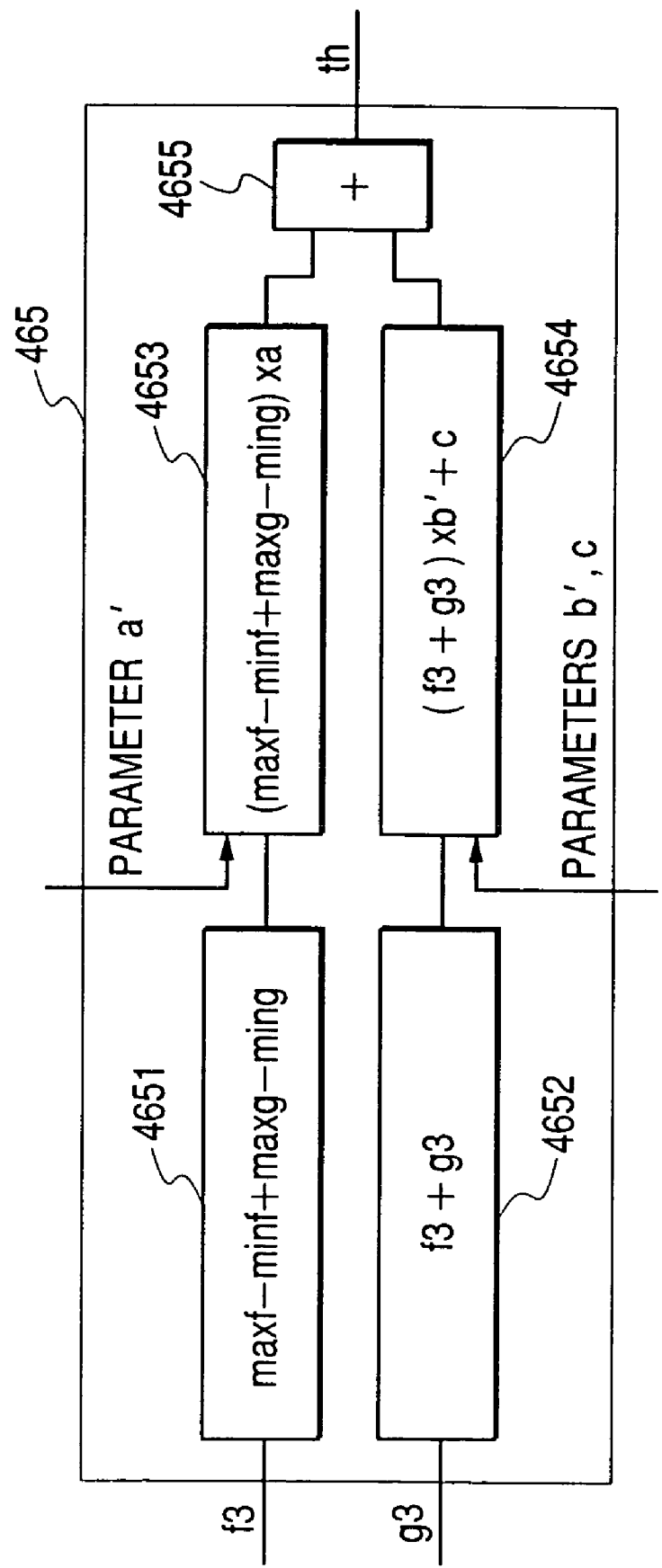
FIG. 14 shows a view of the detailed structure of a threshold calculating circuit in a first variation of the first embodiment, according to the present invention.

Next, an explanation will be given on the second clause, C(x,y) in the equation (Eq. 34) for calculating the threshold value th(x,y) for each division unit. The portion, (f3(x,y)+g3(x,y))/2, though needless to say, but it is an average of the gradation values at the coordinates (x,y) of the detection image f3 and the comparison image g3, which are obtained from the position shift compensation portion 464 for each division unit. Therefore, since the C(x,y)=(f3(x,y)+g(x,y))/2)xb+c changes depending upon the average in the gradation values of the both images, it can be said, in similar to the C(x,y) represented by the -equation (Eq. 20), that it is also the clause which changes the allowable or tolerable amount or quantity in the absolute value image diff(x,y) of the difference depending upon the gradation values. Here, the C(x,y) is described as the value obtained by multiplying the representative one of the gradation values (here, the average value) by the proportion constant "b" and adding the constant "c" thereto, however, in the similar manner as is mentioned in the explanation on the equation (Eq. 17), it should be substituted with a function fitting to the way of change in the gradation values if it is known in advance Further, as the y and s did in the equation (Eq. 17), it is also possible to control the allowable or tolerable amount or quantity freely by this "b" and "c". The construction of the threshold value calculating circuit 465 for each division unit is shown in FIG. 14. As is shown in FIG. 14, the threshold value calculating circuit 465 comprises a calculation circuit 4651 for executing a calculation, i.e., [maxf(x,y)−minf(x,y)+maxg(x,y)−ming(x,y)], and a calculation circuit 4652 for executing a calculation, i.e., [f3(x,y)+g3(x,y)]. A calculation circuit 4653 executes a calculation on the basis of (maxf(x,y)−minf(x,y)+maxg(x,y)−ming(x,y)] inputted from the calculation circuit 4651 and a parameter "a'=a/4" to be inputted, i.e., [{maxf(x,y)−minf(x,y)+maxg(x,y)−ming(x,y)}xa']. Namely, it obtains the B(x,y) in accordance with the equation (Eq. 35). And, a calculation circuit 4654 executes the calculation on the basis of [f3(x,y)+g3(x,y)] inputted from the calculation circuit 4652 and parameters "b'=b/2" and "c" to be inputted, i.e., [(f3(x,y)+g3(x,y))xb'+c]. Namely, it obtains the C(x,y) in accordance with the equation (Eq. 36).

Further, the threshold value calculating circuit 465 for each division unit comprises an addition circuit 4655 for adding [{maxf(x,y)−minf(x,y)+maxg(x,y)−ming(x,yfl−xa'] obtained from the calculation circuit 4653 and [(f3(x,y)+g3(x,y))xb'+c] obtained from the calculation circuit 4654, so as to output as the threshold value th(x,y) at the upper limit.

A threshold value processing portion 467 for each division unit decides the pixels at the position (x,y) for each division unit to be the non-defective candidate if both the absolute value image diff(x,y) of the difference obtained for each division unit from the difference image extracting circuit 466 for each division unit and the threshold value th(x,y) obtained for each division unit from the threshold value calculation circuit 465 for each division unit satisfy a relationship which is represented by the following equation (Eq. 41), while the pixels at the position (x,y) to be defective candidate if they do not satisfy it. The threshold value processing portion 467 for each division unit outputs the digitized image def(x,y), having "0" for the non-defective candidate pixels and "1" for the defective candidate pixels, respectively.

$$\text{diff}(x,y) \leq th(x,y) \qquad \text{(Eq. 41)}$$

The first variation mentioned in the above is same to that of the first embodiment in an aspect that the defect determination is executed after the detection image is divided into such the size that the image deformation can be neglected therefrom and is compensated in the position shift for each division unit. Accordingly, it is also possible to prevent from bringing about or occurring the false or wrong reports which are caused by the image deformation or distortion.

Further, since the minute positions shift at the each pattern edge and/or the minute difference in the gradation values can be allowed, it is also same that it is free from the error of recognizing the normal (or non-defective) portion as the defect, and it is possible to control the allowable or tolerable quantity or amount in the change of the position shift and the gradation values with ease, by setting up the parameters a, b and c at appropriate values thereof.

<Second Variation of the First Embodiment>

Figure 15:
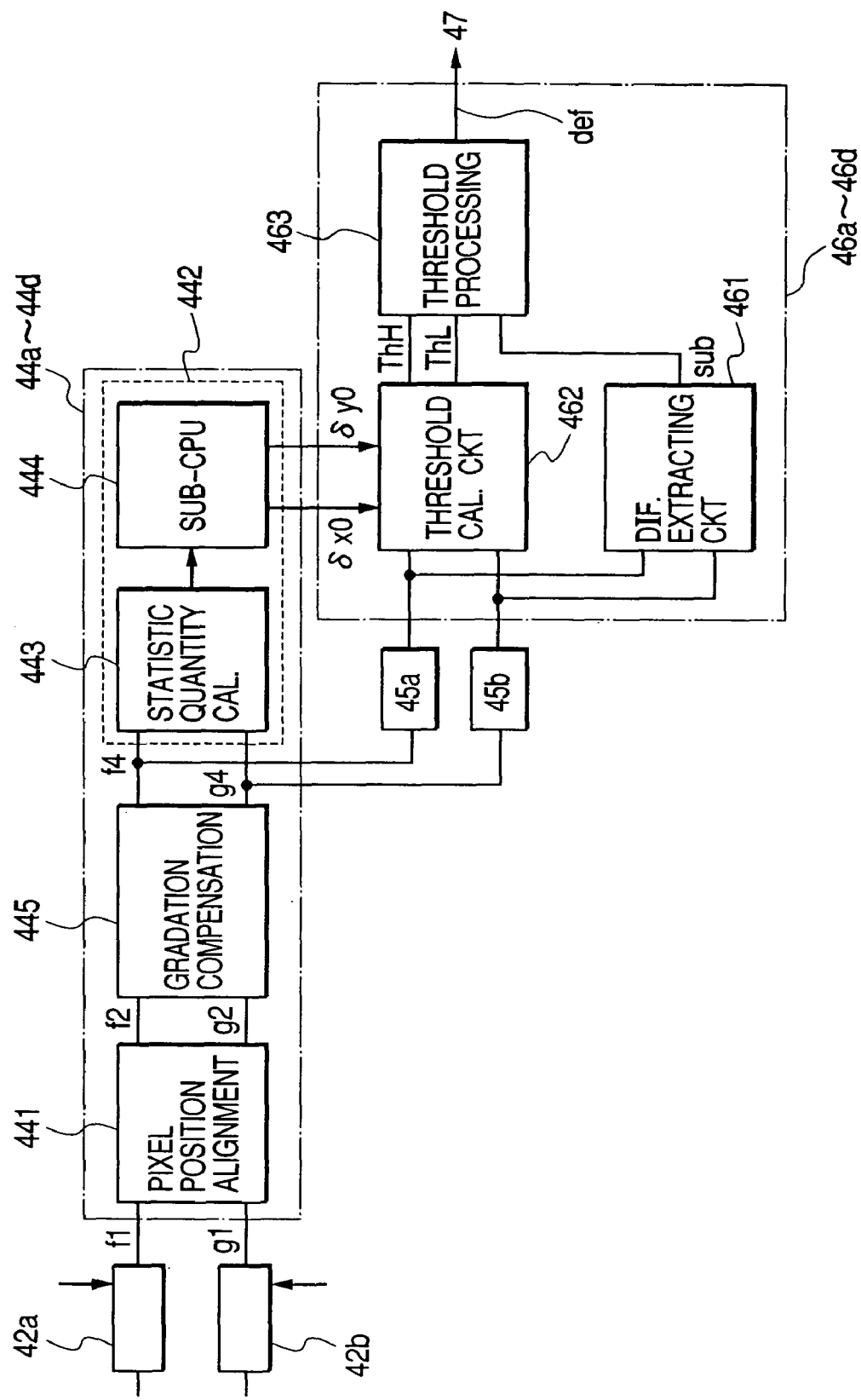
FIG. 15 shows a view of the structure of a position shift detector portion and a defect decision portion in a second variation of the first embodiment, according to the present invention.

A second variation of the first embodiment of the pattern inspecting method and the apparatus thereof according to the present invention will be shown in FIG. 15. A difference to the first embodiment shown in FIG. 9 lies in that there is provided a gradation compensation portion 445 for compensating the gradation values of the detection image f2 and the comparison image g2 after the position alignment in the pixel unit is done in the position alignment portion 441 in the pixel unit for each division unit.

In the gradation compensation portion 445 are obtained an average value avgF of the gradation values in the detection image f2 for each division unit and a standard or reference deviation sigmaF thereof, i.e., the average value avgG of the gradation values in the comparison image g2 for each division unit and the standard deviation sigmaG thereof, and they are converted into the gradation value of the comparison image g2 for each division unit, according to the following equation (Eq. 42):

$$g4(x,y) = (\text{sigma}F/\text{sigma}G) \times (g2(x,y) - \text{avg}G) + \text{avg}F \qquad \text{(Eq.42)}$$

Namely, according to the equation (Eq. 42), the g2 is converted into an image g4 having the average value avgF and the standard deviation sigmaF. On a while, the detection image f2 is outputted as it is without any change thereto. Namely, f4(x,y)=f2(x,y). Accordingly, the f2 and the g2, each having the average value and the standard or reference deviation being different to each other, come to the images f4 and the g4 being equal to each other in the average value and the standard or reference deviation thereof through the gradation compensation portion 445. And, since the f4 and g4 are aligned in the position in the accuracy of the pixel unit inherently, it is almost equal to that the gradation values of the both are same as a whole, if the average value and the standard deviation are made equal to each other.

Next, an explanation will be given on advantages of the second variation of the first embodiment.

Figure 16A:
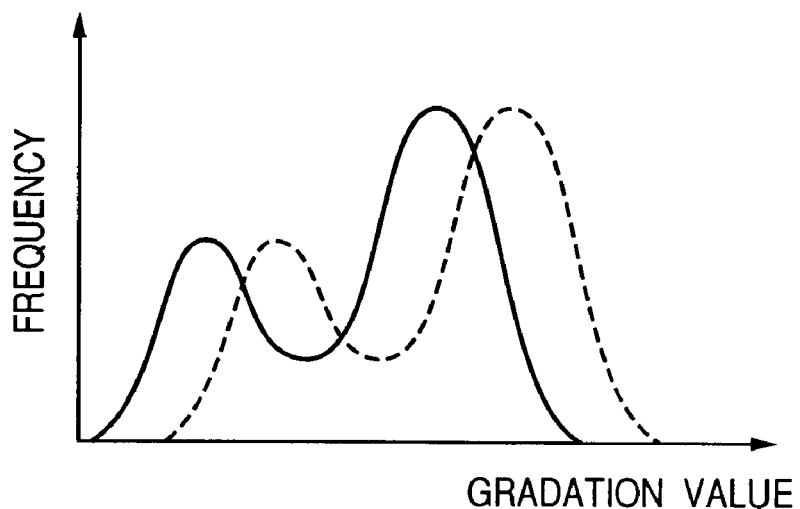
FIG. 16 shows a view for explaining the condition of change in the gradation values.
Figure 16B:
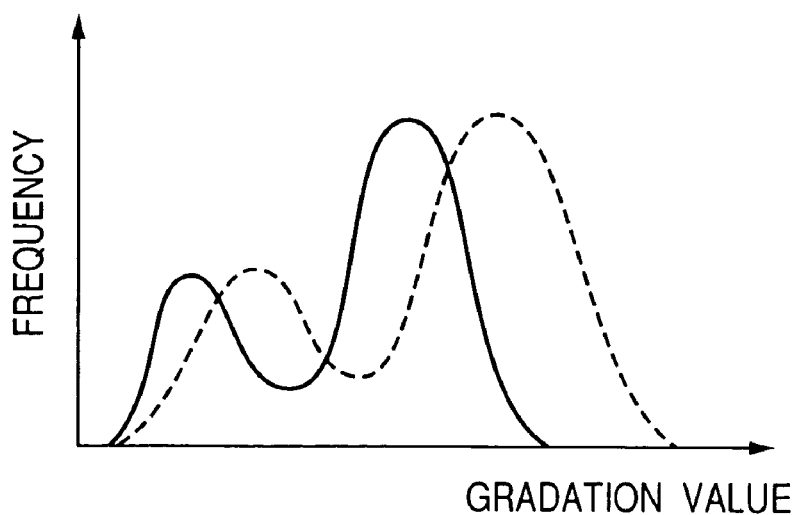

Basically, the present invention relates to a method for deciding the position having a great difference in the gradation values as to be the defect by comparing the detection image and the comparison image for each division unit. Therefore, it is assumed that the detection image and the comparison image for each division unit are equal to each other in the gradation values at the position other than that of the defect. However, the detection image and the comparison image for each division unit may actually differ to each other in the gradation values of the image as a whole, because of the difference such as the time of detecting the image and/or the position thereof. For instance, if the timing of detection of the image differs, the number of electrons caught by the electron detector 35 (see FIG. 1) varies depending upon the change in the condition of electrical charge in the electron optic system or the inspection object itself, therefore, the gradation values of the image as a whole might be fluctuated up and down as shown in FIG. 16 (a). Further, if the position for detecting image differs on the inspection object 100, the contrast of the pattern might be different as shown in FIG. 16 (b) due to the difference in the film thickness, etc. It can be said that FIG. 16 (a) shows the difference in the off-set and FIG. 16 (b) the difference in the gain, and either one or both (compound) of them can be compensated by the above equation (Eq. 42).

In general, the bigger the difference in the gradation values as a whole, the greater the difference in the timing of detecting the images, or the greater the distance between the positions of detecting the images. Therefore, though it does not come to be a problem so much in the "cell to cell Comparison Method" mentioned previously, however, it might bring false reports often in a "die to die Comparison Method", or might cause mall- or miss-detection of the defects if loosing the inspection condition for reducing the possibility of the false reports.

As is apparent from the above, according to the present second variation, the gradation values are made equal between the detection image and the comparison image for each division unit by the gradation compensation portion 445 provided for each division unit, therefore enabling the inspection by comparison in more strict. And, this effect is remarkable, in particular with the "Chip Comparison Method".

Figure 17:
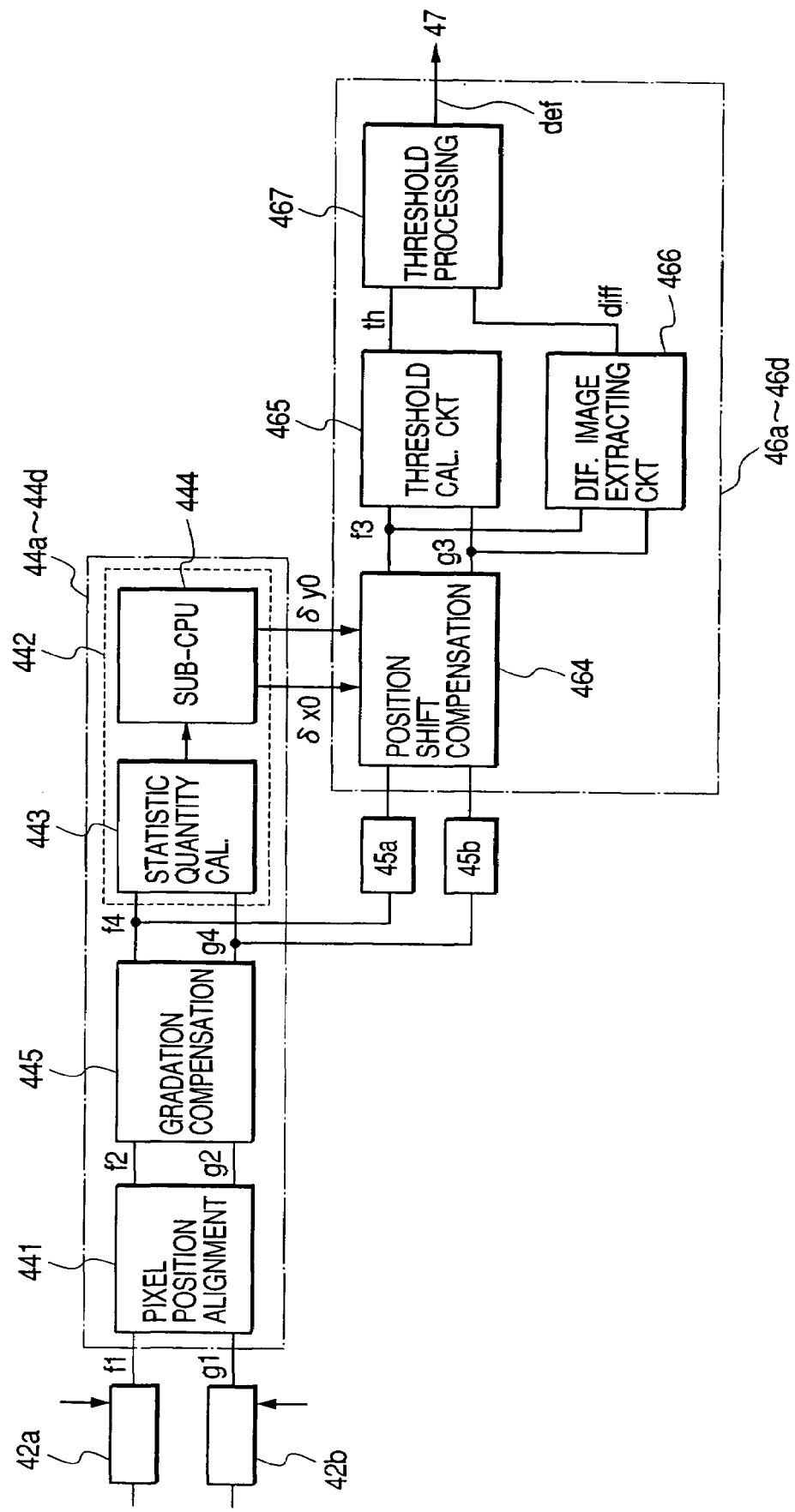
FIG. 17 shows a view of the structure of a position shift detector portion and a defect decision portion upon combining the first variation and the second variation of the first embodiment, according to the present invention.

In the equation (Eq. 42), the distribution of the gradation values in the comparison image g2 is made equal to that of the detection image f2 for each division unit, however, the both of the detection image and the comparison image for each division unit can be also adjusted or compensated to fit to a standard or reference distribution of the gradation values by determining an average value and a reference value of the standard deviation in advance. Further, the second variation explained in the above can also be constructed as shown in FIG. 17, combining with the first variation mentioned pervasively.

Here, the equation (Eq. 42) is applied to as the compensation method for the gradation, and in summary, it is important that there is included a process or a means for making the gradation values equal to each other is between the comparison image and the detection image, however, the present invention should not be restricted to the equation (Eq. 42) and rather includes various cases where such the compensations for the gradation value are applied to.

<Third Variation of the First Embodiment>

Figure 18:
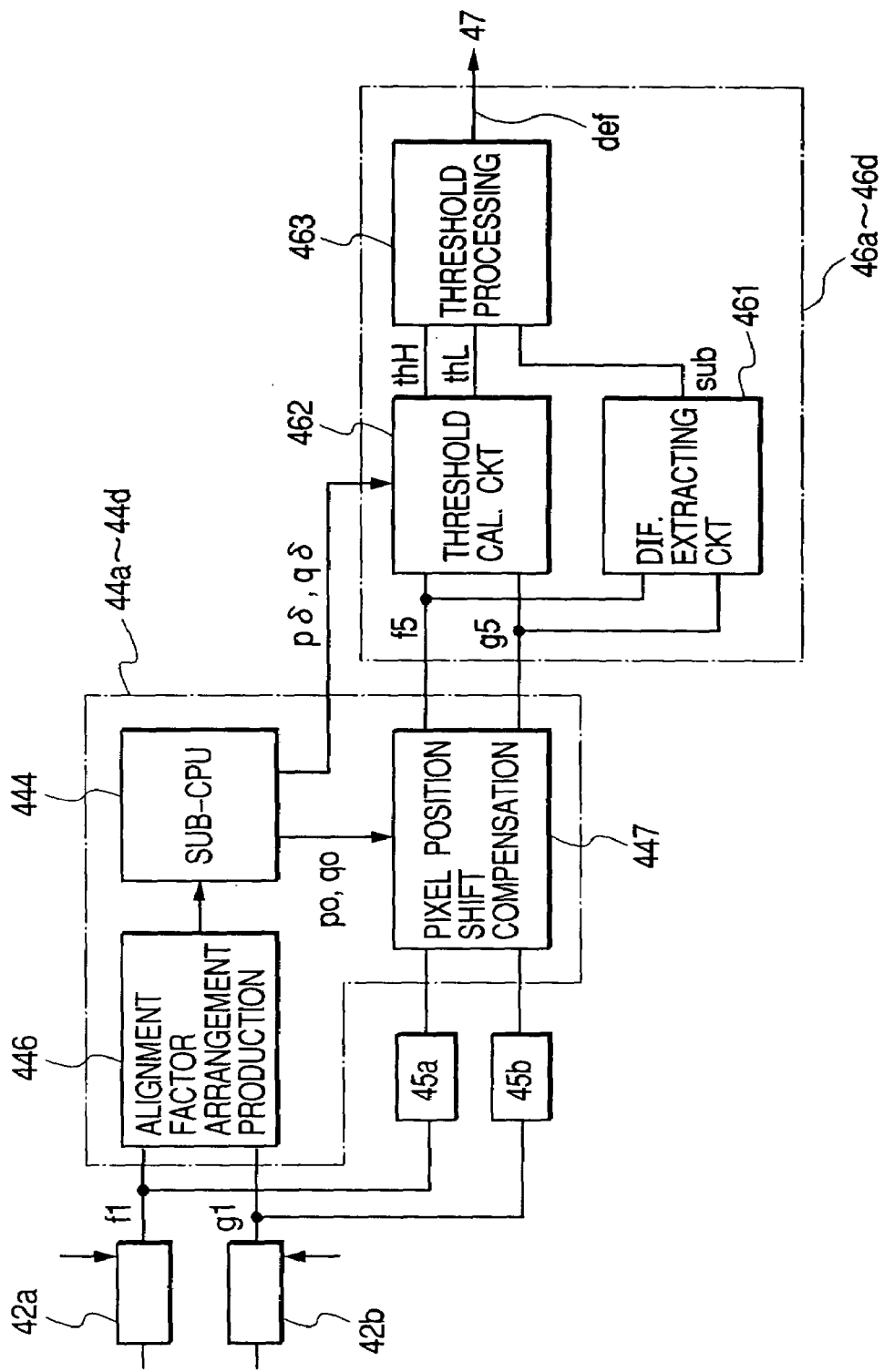
FIG. 18 shows a view of the structure of a position shift detector portion and a defect decision portion in a third variation of the first embodiment, according to the present invention.

A third variation of the first embodiment of the pattern inspecting method and the apparatus thereof according to the present invention will be shown in FIG. 18. A difference to the first embodiment shown in FIG. 9 lies in that, not detecting the position shift in the sub-pixel unit in the position shift detection portion 442 for each division unit again after the completion of the position aligning by the pixel unit in the position aligning portion 441 by the pixel unit for each division unit, it is so constructed that the position shift amount or quantity between f1(x,y) and g(x,y)

can be calculated in the accuracy being finer or lower than the pixel (i.e., sub-pixel unit), through the compensation between or among arranged elements, by using an arrangement at an alignment factor which is produced in a process or by means of obtaining the shift amount or quantity of $g1(x,y)$ so that the alignment factor between the detection image $f1(x,y)$ and the comparison image $g1(x,y)$ comes to be the maximum.

In the alignment factor arrangement production portion 446 for each division unit, the alignment factor is calculated between the each image obtained by shifting the comparison image $g1(x,y)$ for each division unit by −n through n pixels in the x and y directions respectively, and the detection image $f1(x,y)$, thereby producing two-dimension arrangement $s(p,q)$ as shown in FIG. 19. As the alignment factor can be used $\Sigma\Sigma|f1-g1|$, $\Sigma\Sigma(f1-g1)^2$, or the correlation coefficient, etc., in the above equation (Eq. 1). FIG. 19 shows the alignment factor arrangement in the case where n=4, and the alignment factor when the g1 is shifted by −2 pixels in the x direction and by 3 pixels in the y direction. The two-dimension arrangement $s(p,q)$ produced by the alignment factor arrangement production portion 446 is outputted to the CPU 444.

In the CPU 444, first, a value p0 for p and a value q0 for q for obtaining the maximum values in the alignment factor (however, in the case where $\Sigma\Sigma|f1-g1|$ or $\Sigma\Sigma(f1-g1)^2$ is applied to, the value p0 for p and the value q0 for q for obtaining the minimum value in them) are calculated from the two-dimension arrangement $s(p,q)$ which is inputted from the alignment factor arrangement production portion 446 for each division unit. Then, a parabolic curve is fitted with respect to $s(p0-1,q0)$, $s(p0,q0)$ and $s(p+1,q0)$ so as to obtain a value p0+pδ where the parabolic curve takes the extreme value.

Here, pδ is a non-integer from −1 to +1(−1<pδ<+1). In the same manner, the parabolic curve is fitted with respect to $s(p0-1,q0)$, $s(p0,q0)$ and $s(p+1,q0)$ so as to obtain the value q0+qδ where the parabolic curve takes the extreme value(s). Here, also qδ is a non-integer from −1 to +1 (−1<qδ<+1). The value p0+pδ is the position shift quantity in the x direction between the detection image f1 and the comparison image g1 for each division unit, which is obtained in the accuracy of the sub-pixel unit, and the value q0+qδ is the position shift quantity in the y direction between the detection image f1 and the comparison image g1 for each division unit, which is obtained in the accuracy of the sub-pixel unit.

The delay circuits 45a and 45b constructed with the shift registers and so on are for the purpose of delaying the image signals f1 and g1 by a time period which is necessary for obtaining the values p0+pδ and q0+qδ.

The position shift compensating portion 447 for each division unit in the pixel unit obtains P0 and q0 from the CPU 444 so as to output the detection image $f1(x,y)$ obtained for each division unit as it was, while the comparison image $g1(x,y)$ obtained for each division unit by shifting it by (p0,q0). Namely, $f5(x,y)=f1(x,y)$, and $g5(x,y)=g1(x+p0,y+q0)$.

The defect decision portion 46 for each division unit same to that of the first embodiment shown in FIG. 9. Namely, in the defect decision portion 46 for each division unit, while the difference image sub between the detection image f5 and the comparison image g5 is produced in the difference extraction circuit 461 for each division unit, the threshold values thH and thL with respect to each pixel for each division unit are calculated in the threshold value calculation circuit 462 so as to decide to be the defect or not by comparing the gradation values of the difference image sub and the threshold values thH and thL for each division unit in the threshold processing portion 463 for each division unit. However, as the position shift quantity of sub-pixel unit is used the pδ obtained from the CPU 444 for δx0, and the qδ obtained from the CPU 444 for δy0.

Figure 20:
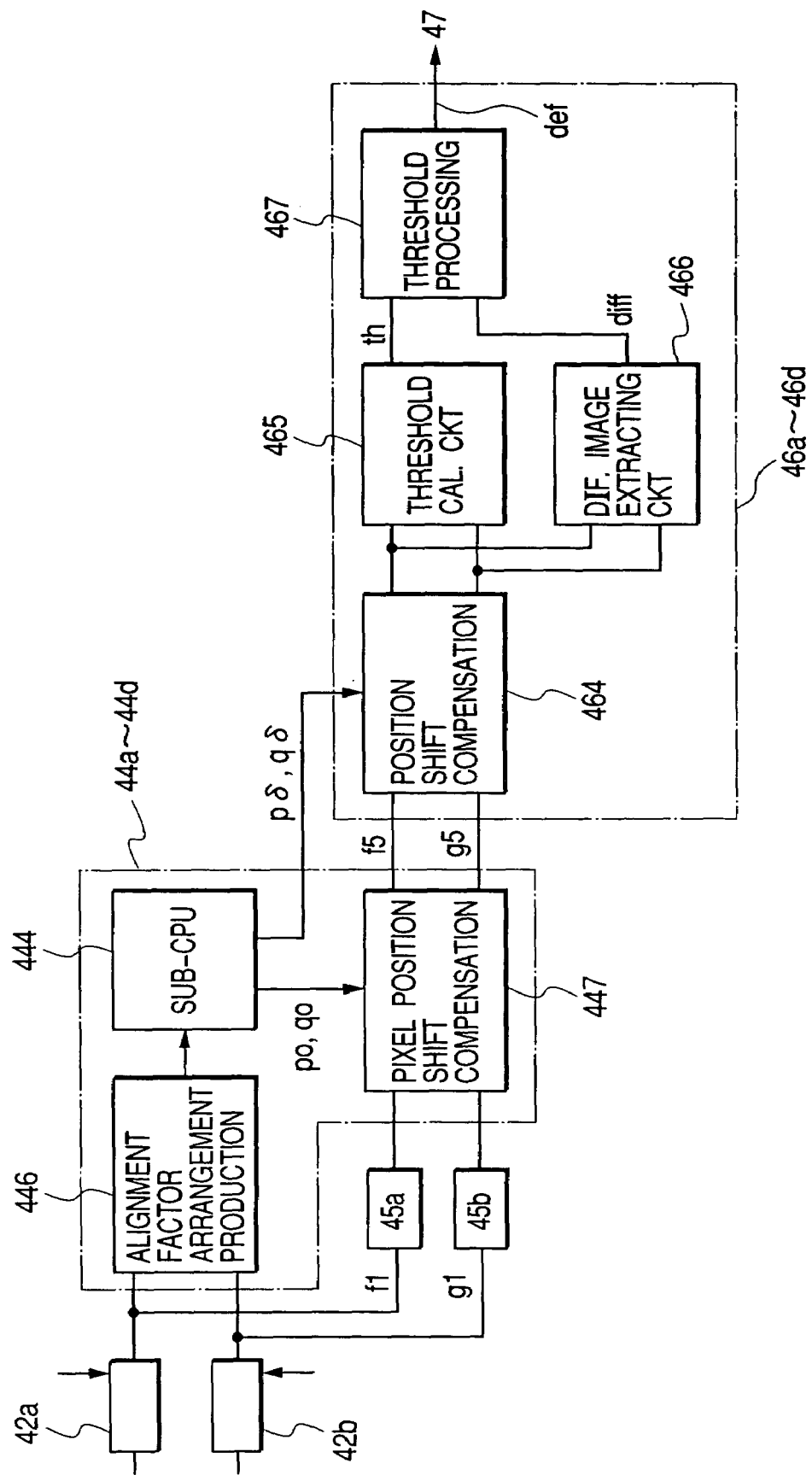
FIG. 20 shows a view of the structure of a position shift detector portion and a defect decision portion upon combining the first variation and the third variation of the first embodiment, according to the present invention.

Further, the position shift detection portion 44 for each division unit in the third embodiment mentioned in the above can be constructed as is shown in FIG. 20, by combining with the defect decision portion 46 for each division unit in the previously-mentioned first embodiment shown in FIG. 13.

Here is described a method of using only five data, i.e., $s(p0-1,q0)$, $s(p0,q0)$, $s(p0+1,q0)$, $s(p0,q0-1)$ and $s(p0,q0+1)$ for obtaining the position shift of the sub-pixel unit, however, the more the number of data to be utilized; the nearer the values pδ and go should be determined to the true values thereof. Further, by using a total tendency of the two-dimensional arrangement in the alignment factor (for example, the alignment factor has only one peak value or plural ones, or it is a flat-like without fluctuation thereof, etc.), it is conceivable to give a kind of restriction on the calculation of the values pδ and qδ. In this manner, with this third variation, the arrangement of the alignment factor is produced by the hardware, while the portion for calculating the position shift by using thereof is carried out by the software in the CPU 444, therefore the calculating method can be altered easily and it has a possibility of enabling the more intelligent processing.

For producing the two-dimensional arrangement of the alignment factor for each division unit, there is described a method of producing the image obtained by shifting the comparison image $g1(x,y)$ for each division unit by −n through n pixels in the x and y directions so as to obtain the alignment factor respectively, however, the two-dimensional arrangement of the correlation coefficient also can be obtained, by using Fourier transformation image to $f1(x,y)$ and $g1(x,y)$, as below.

Assuming that two-dimensional discrete Fourier transform is described by F and a reverse transformation by $F^{-1}$, the Fourier transformation image $F1(s,t)$ of $f1(x,y)$ and the Fourier transformation image $G1(s,t)$ of $g1(x,y)$ can be described by the following equations (Eq. 43) and (Eq. 44).

$$F1(s,t)=F[f1(x,y)] \tag{Eq. 43}$$

$$G1(s,t)=G[g1(x,y)] \tag{Eq. 44}$$

A cross power spectrum $cps(s,t)$ of those can be obtained by the following equation (Eq. 45).

$$cps(s,t)=F1(s,t)\cdot G1(s,t)^* \tag{Eq. 45}$$

where, $G1(s,t)^*$ is a complex conjugate of $G1(s,t)$. An mutual correlation image $corr(x,y)$ can be obtained by the reverse Fourier transformation of $cps(p,q)$, as shown by the following equation (Eq. 46).

$$corr(x,y)=F^{-1}[cps(s,t)] \tag{Eq. 46}$$

This mutual correlation image $corr(x,y)$ is the aimed two-dimensional arrangement of the mutual correlation.

Process after having obtaining the two-dimensional arrangement of the mutual correlation is as was mentioned previously. Assuming that the coordinates at the maximum gradation value is (x0,y0) on the mutual correlation image $corr(x,y)$, the position shift quantity is x0 in the x direction by pixel unit and y0 in the y direction in the pixel unit. Namely, p0=x0 and q0=y0.

An advantage of using the Fourier transformation is in that the hardware can be small-sized in the scale thereof according to an occasion. For example, in a case of obtaining the respective alignment factors for g1(x,y) by shifting it ±4 pixels (n=4) in the x and y directions respectively, the arrangement elements of $(4\times2+1)^2=81$ (see FIG. 5 19) must be obtained simultaneously in order to the two-dimensional arrangement of the alignment factors without time delay. Namely, it is necessary that it has the image in which the positions of 81 are shifted on the hardware. Comparing to this, in the case of using the Fourier transformation, the scale of the hardware does not depend upon the "n". If using the Fourier transformation, although the processing itself becomes complex, however it is considerably advantageous from a view point of the scale of hardware, in particular in a case that the "n" is large, i.e., is when a large position shift can be expected.

Further, for obtaining the mutual correlation image being sensitive to the position shift (i.e., meaning that the mutual correlation image having a sharp peak where the positions are aligned), the Fourier transformation image can be transferred or converted into a product between Fourier amplitude image and Fourier phase image, wherein the cross power spectrum cps(s,t) is obtained by using only the Fourier phase image and is reverse-converted to obtain the mutual correlation image corr(x,y).

Further, the third variation explained in the above can also be constructed as shown -in FIG. 20, combining with the first variation mentioned pervasively.

<Fourth Variation of the First Embodiment>

Figure 21:
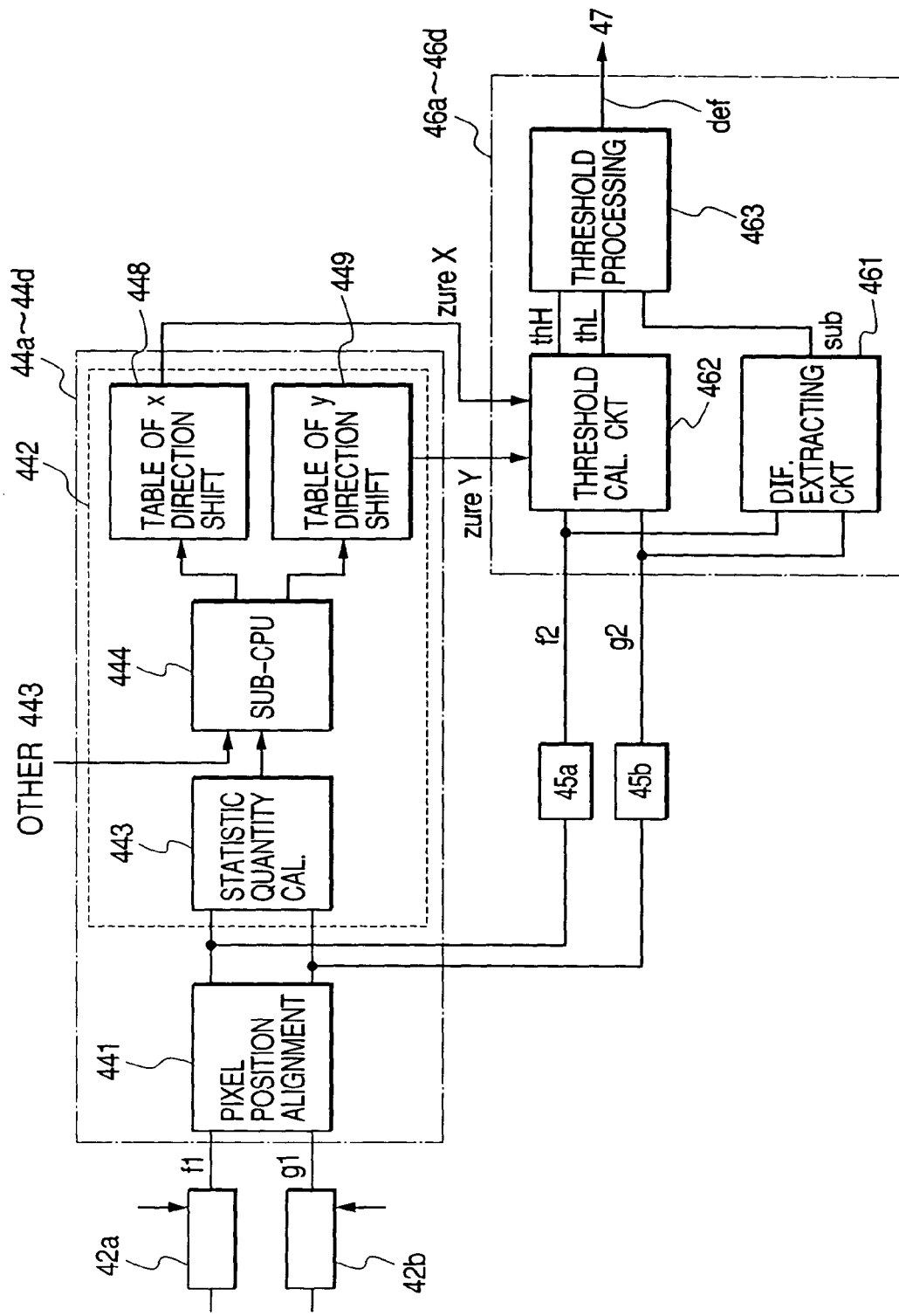
FIG. 21 shows a view of the structure of a position shift detector portion and a defect decision portion in a fourth variation of the first embodiment, according to the present invention.

A fourth variation of the first embodiment of the pattern inspecting method and the apparatus thereof according to the present invention will be shown in FIG. 21. A difference to the first embodiment shown in FIG. 9 lies in that, on the contrary to that the position shift quantity is obtained at the pitch of division unit so as to be used as the common position shift quantity ($\delta x0$, $\delta y0$) within division unit in the first embodiment, however in this fourth variation, the position shift quantities ($\delta x0a$, $\delta y0a$), ($\delta x0b$, $\delta y0b$), ($\delta x0c$, $\delta y0c$) and ($\delta x0d$, $\delta y0d$) obtained at the pitch of division unit are interpolated so as to obtain the position shift quantity at the pitch of the pixel.

Figure 22:
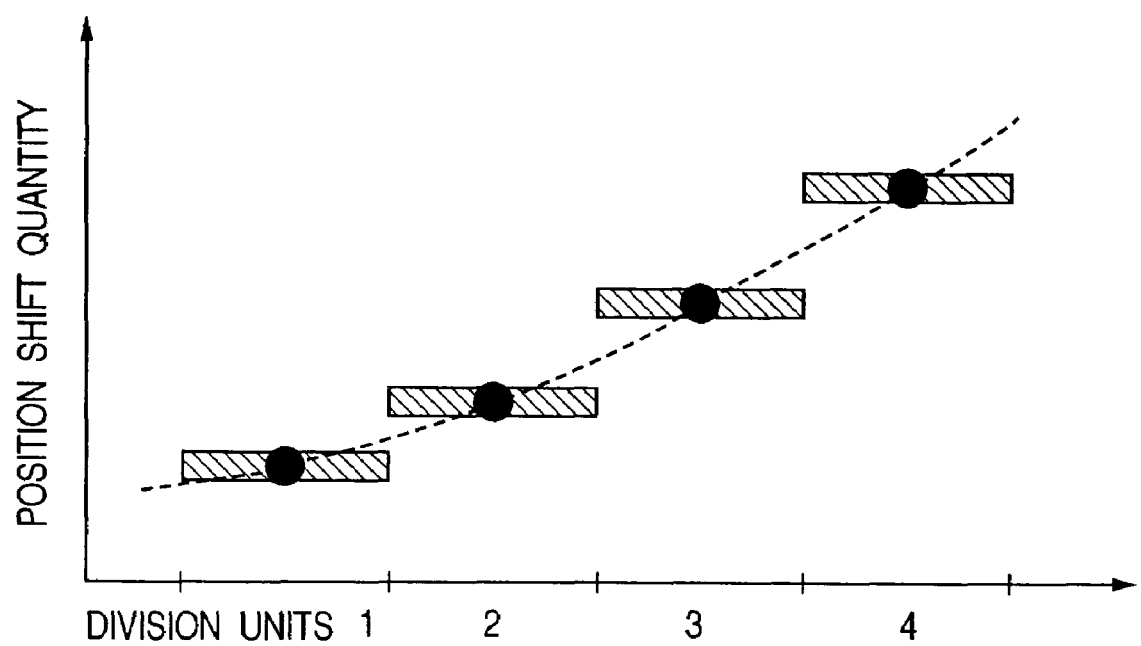
FIG. 22 shows a view of explaining a concept of the fourth variation of the first embodiment, according to the present invention.

A concept of the fourth variation will be explained by referring to FIG. 22. The black dots in FIG. 22 correspond to the position shift quantities ($\delta x0a$, $\delta y0a$), ($\delta x0b$, $\delta y0b$), ($\delta x0c$, $\delta y0c$) and ($\delta x0d$, $\delta y0d$) obtained at the pitch of the division unit. In the first embodiment, thought the position shift quantity for each division unit is assumed to be the common position shift quantity ($\delta x0$, $\delta y0$) in the sub-pixel unit within the division unit (thick line in the same figure), however, in this fourth variation, the position shift quantity for each pixel is obtained by tying up the black dots with a smooth curved line (shown by a broken line). If making the division unit too small, the position shift quantity cannot be determined since there is no pattern in the region, therefore, those are interpolated once obtaining the position shift quantity for each division unit having a predetermined size.

In FIG. 21, the processing in the position alignment portion 441 in the pixel unit for each division, and that in the statistical quantity calculation portion 443 within the position shift detection portion 442 in the sub-pixel unit for each division unit are same to those in the first embodiment. The sub-CPU 444 calculates the position shift quantity ($\delta x0a$, $\delta y0a$) for said the division unit by the above equations (Eq. 10) and (Eq. 11), and also obtains the position shift quantities ($\delta x0b$, $\delta y0b$), ($\delta x0c$, $\delta y0c$) and ($\delta x0d$, $\delta y0d$) for the other division units through the statistical quantity obtained from the other statistical quantity calculation portion 443 not shown in the figure (Since in FIG. 1 is shown the construction in the case of dividing the one scan into four (4), here is also explained in the case of dividing it into four (4). If the number of the division is more than that, of course, there are also obtained ($\delta x0e$, $\delta y0e$), ($\delta x0f$, $\delta y0f$)). After that, $\delta x0a$, $\delta x0b$, $\delta x0c$ and $\delta x0d$ are tied up with the smooth curved line, thereby obtaining the position shift quantities in the x direction, zureXa(x,y), zureXb(x,y), zureXc(x,y) and zureXd(x,y), for respective pixels, so as to be written into a x-direction shift quantity table 448. Namely, into the x-direction shift quantity table 448 is written the position shift quantity zureX(x,y) in the x direction for each pixel, which is obtained by tying up $\delta x0a$, $\delta x0b$, $\delta x0c$ and $\delta x0d$ with the smooth curved line (i.e., zureXa(x,y) indicates the position shift quantity in the x direction, changing one by one for each pixel within the division unit 1, zureXb(x,y) indicates the position shift quantity in the x direction, changing one by one for each pixel within the division unit 2, zureXc(x,y) indicates the position shift quantity in the x direction, changing one by one for each—pixel within the division unit 3, and zurexd(x,y) indicates the position shift quantity in the x direction, changing one by one for each pixel within the division unit 4). Further, $\delta y0a$, $\delta y0b$, $\delta y0c$ and $\delta y0d$ are tied up with the smooth curved line, thereby obtaining the position shift quantities in the y direction, zureYa(x,y), zureYb(x,y), zureYc(x,y) and zureYd(x,y), for respective pixels, so as to be written into a y-direction shift quantity table 449. Namely, into the y-direction shift quantity table 448 is written the position shift quantity zureY(x,y) in the y direction for each pixel, which is obtained by tying up $\delta y0a$, $\delta y0b$, $\delta y0c$ and $\delta y0d$ with the smooth curved line (i.e., zureYa(x,y) indicates the position shift quantity in the y direction, changing one by one for each pixel within the division unit 1, zureYb(x,y) indicates the position shift quantity in the y direction, changing one by one for each pixel within the division unit 2, zureYc(x,y) indicates the position shift quantity in the y direction, changing one by one for each pixel within the division unit 3, and zureYd(x,y) indicates the position shift quantity in the y direction, changing one by one for each pixel within the division unit 4). A so-called "B spline", or approximation by a polynomial also can be applied as the method for tying up with the smooth curved line. In this case of the fourth variation, the position shift detection portion 442 of sub-pixel unit, which is constructed with the statistical quantity calculation portion 443, the sub-CPU 444, the x-direction shift quantity table 448, and the y-direction shift quantity table 449 can be used in common.

Following to the above, an explanation will be given on the defect decision portion 46 for each division unit. The following explanation is in common with all over the division units, therefore, the suffixes a, b, c, and d attached for distinction of the division units in the above explanation will be omitted.

The delay circuits 45a and 45b, each comprising a shift register and so on, are provided for delaying the image signals f2 and g2 by a time period which is necessitated for calculating out zureXa(x,y), zureXb(x,y), zureXc(x,y), zureXd(x,y), zureYa(x,y), zureYb(x,y), zureYc(x,y) and zureYd(x,y).

The difference extracting circuit 461 for each division unit, in the same manner as in the first embodiment, obtains the difference image sub(x,y) for each division unit between the division unit detection image f2 and the division unit comparison image g2 by the following equation (Eq. 47).

$$\mathrm{sub}(x,y) = g1(x,y) - f1(x,y) \qquad \text{(Eq. 47)}$$

The threshold value calculating circuit 462 of each division unit calculates two threshold values thH(x,y) and thL(x,y) so as to determine to be the defective candidate or not, by using the position shift quantities zureX(x,y) and zureY(x,y) of the sub-pixel unit, changing one by one for each pixel, which are obtained from the position shift detecting portion 442 of sub-pixel unit at a certain division unit. The thH(x,y) for each pixel unit is a threshold value for restricting an upper limit of the difference image sub(x,y) for each pixel unit, and the thL(x,y) for each pixel unit a threshold value for restricting a lower limit of the difference image sub(x,y) for each division unit, respectively. Those threshold values, in the same manner as in the first embodiment, contains A(x,y) for substantially compensating the position shift in the sub-pixel unit, B(x,y) for allowing or tolerating the minute position shift at the pattern edge, and C(x,y) for allowing or tolerating the minute difference in the gradation values, as shown in the following equations (Eq. 48) and (Eq. 49).

$$thH(x,y)=A(x,y)+B(x,y)+C(x,y) \quad \text{(Eq. 48)}$$

$$thL(x,y)=A(x,y)-B(x,y)-C(x,y) \quad \text{(Eq. 49)}$$

The A(x,y) can be expressed by a relationship shown in the following equation (Eq. 50). This is obtained by substituting δx0 in the equation (Eq. 18) by zureX(x,y) and δy0 by zureY(x,y).

$$\begin{aligned} A(x,y) = & (dx1(x,y)*zureX(x,y) - \\ & dx2(x,y)*(-zureX(x,y))\} + \\ & (dy1(x,y)*zureY(x,y) - \\ & dy2(x,y)*(-zureY(x,y))\} \\ = & (dx1(x,y)+dx2(x,y))*zureX(x,y) + \\ & (dy1(x,y)+dy2(x,y))*zureY(x,y) \end{aligned} \quad \text{(Eq. 50)}$$

where, B(x,y) and C(x,y) are same to those in the first embodiment, therefore they can be obtained by the above equations (Eq. 19) and (Eq. 20), respectively.

Also, the processing in the threshold value calculation portion 463 for each division unit is same to that of the first embodiment. Namely, by using the difference image sub(x,y) obtained from the difference image extracting circuit (difference extracting circuit) 461 for each division unit, and also the lower limit threshold value thb(x,y) and the upper limit threshold value thH(x,y) obtained from the threshold value calculating circuit 462 for each division unit, the image at the position (x,y) in a certain division unit is outputted as the digital image def(x,y), having the value "0" for the non-defective candidate if satisfying the relationship of the above equation (Eq. 28), while having the value "1" for the defective candidate if not satisfying it.

Comparing this fourth variation to the first embodiment, in a case where the position shift quantity is changed within the division unit, a difference occurs between a center portion and a peripheral portion of the division unit in performance or capacity of detecting the defect in the first embodiment. However, in this fourth variation, since the position shift quantity within the divided area or region is obtained for each pixel with approximation, the value of A(x,y), i.e., the values of thH(x,y) and thL(x,y) are changed in accordance with the above equation (Eq. 50) on the basis of the obtained position shift quantities zureX(x,y) and zureY(x,y) for each pixel, thereby showing an advantage that the difference in the performance or capacity of detecting the defect within the division unit can be mitigated.

In the explanation in the above, the interpolation is executed by using the position shift quantity which is calculated by making the division unit at the same timing as a one set (for example, the division unit shown by solid line in FIG. 8), however, it is also possible to use the position shift quantity calculated by a next one set of the division unit (for example, the division unit shown by broken line in FIG. 8), further the position shift quantity calculated by an over-next one set of the division unit, as well, by extending the delay amount with the delay circuit 45 as two times as large, three times . . . In this case, it is enough to obtain a curved surface tying those up in oblique from the arrangement thereof, aligning in two-dimensional manner.

Figure 23:
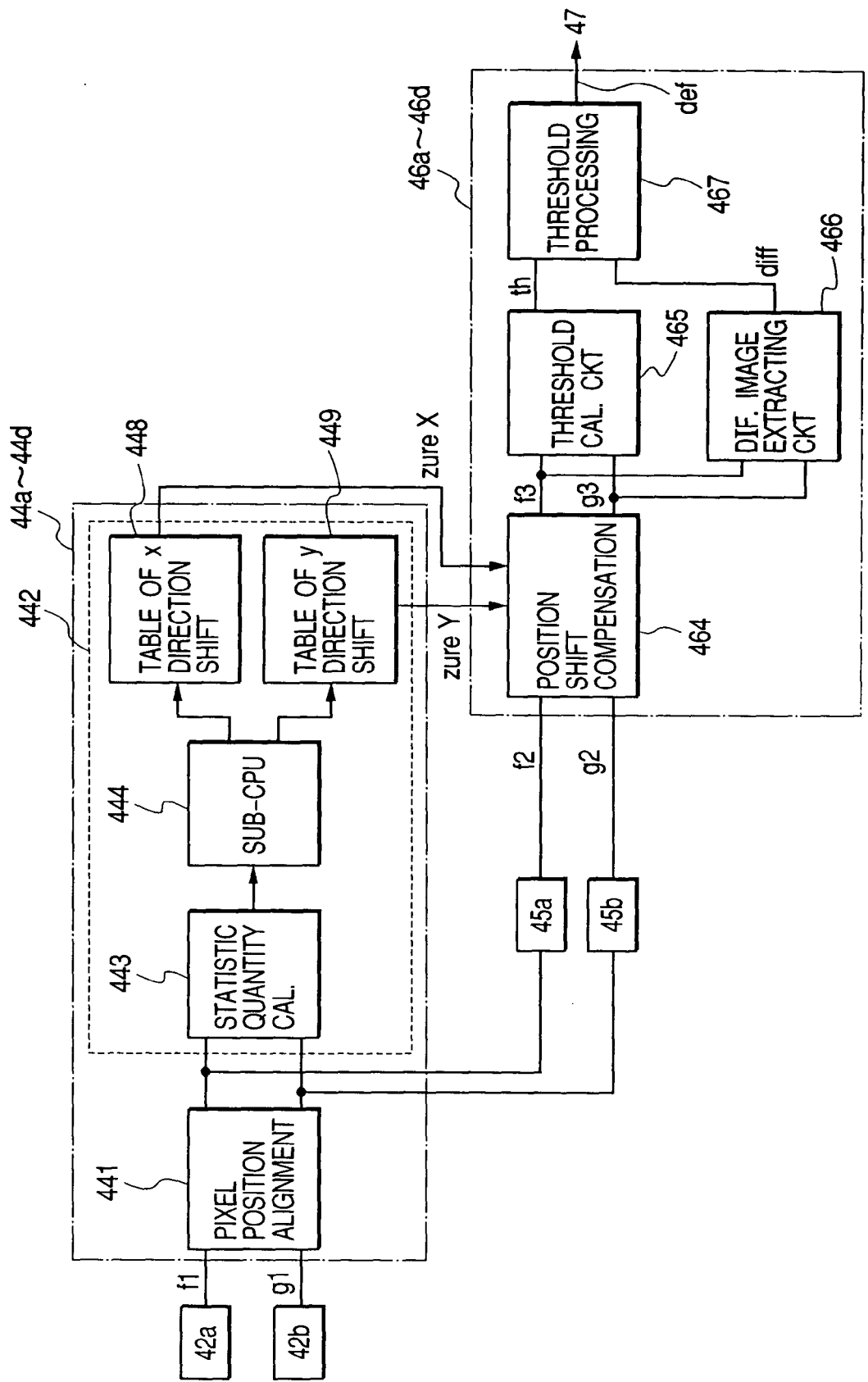
FIG. 23 shows a view of the structure of a position shift detector portion and a defect decision portion upon combining the first variation and the fourth variation of the first embodiment, according to the present invention.
Figure 24:
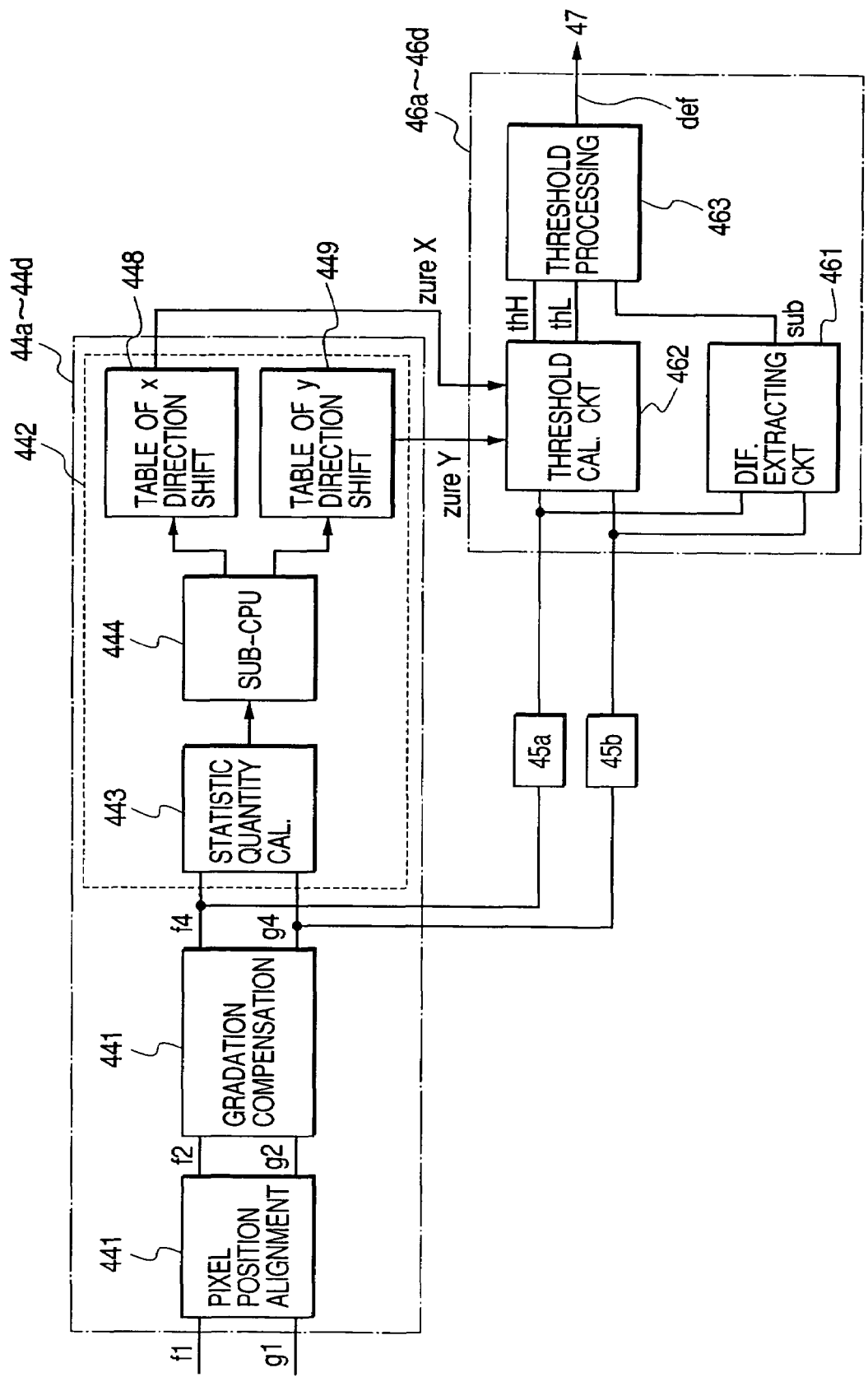
FIG. 24 shows a view of the structure of a position shift detector portion and a defect decision portion upon combining the second variation and the third variation of the first embodiment, according to the present invention.

Furthermore, this fourth variation explained in the above also can be constructed as shown in FIG. 23, combining with the first variation mentioned pervasively. Also, this fourth variation explained in the above can be constructed as shown in FIG. 24, combining with the second variation mentioned pervasively.

<Second Embodiment>

Figure 25:
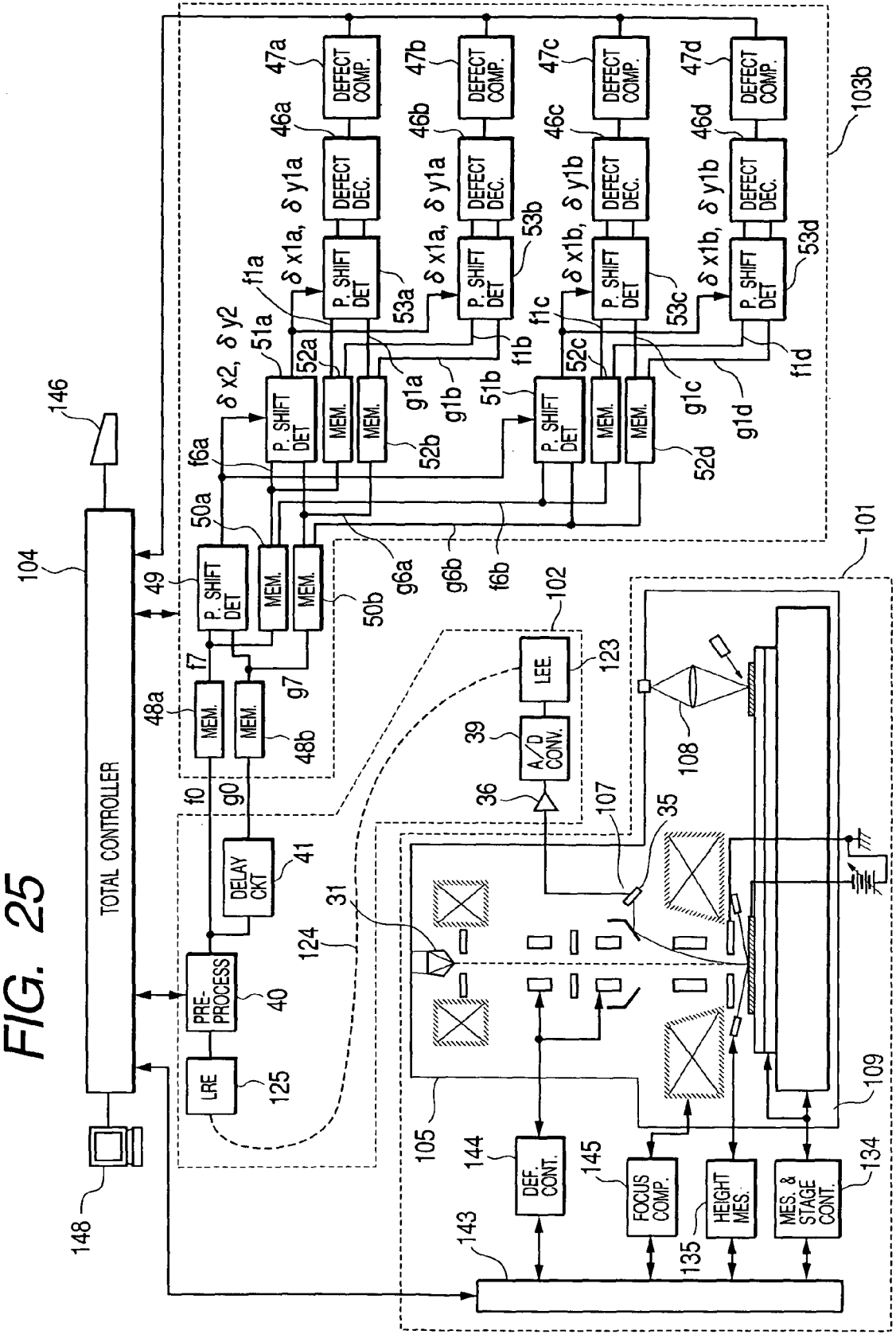
FIG. 25 shows an outline of the structure of a second embodiment of a pattern testing method and an apparatus with use of an electron microscope, according to the present invention.

A second embodiment of the pattern inspecting method and the apparatus thereof according to the present invention will be shown in FIG. 25. The present embodiment, as in the first embodiment shown in FIG. 1, comprises the detection portion 101, the image pick-out portion 102, the image processing portion 103, and the total controller portion 104. The detection portion 101, the image pick-out portion 102 and the total controller portion 104 are same to those of the first embodiment, therefore the explanation thereof is omitted here. The second embodiment is also same to the first embodiment described previously, as far as the image is divided finely into such the size, so as to perform the decision on the defect for each division unit, so that said the dynamic deformation or distortion can be-neglected therefrom, as is shown in FIG. 7, for dealing with the dynamic deformation due to the change in the magnetic field caused by the pattern distribution of the test object 100 and/or the vibration of the stages 131 and 132, etc. The difference to the first embodiment lies in that the image is divided into such the negligible size gradually, but not from the beginning. For convenience in explanation, the first embodiment is called as "a non-stepwise division method" is while the second embodiment as "a stepwise division method".

Figure 26A:
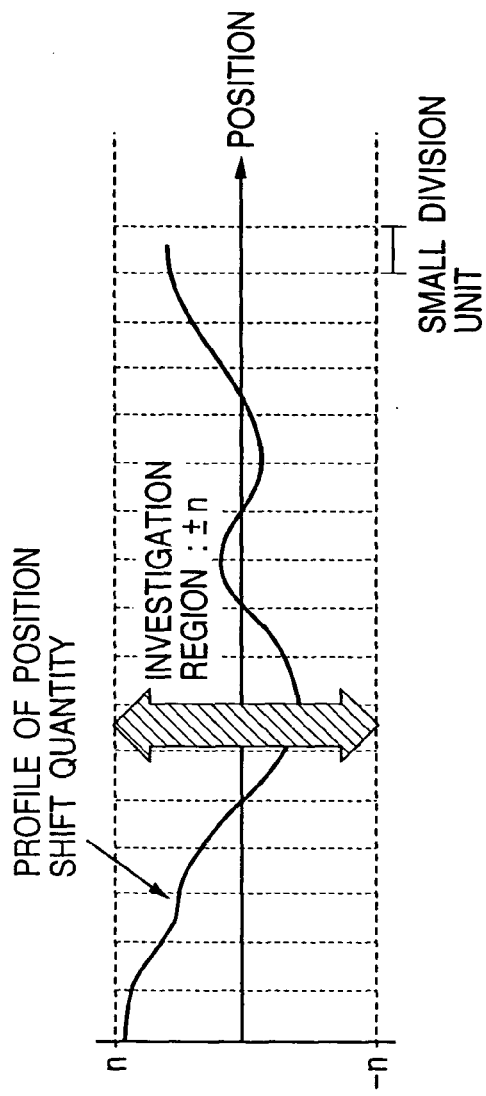
FIG. 26 shows a view of explaining a concept of the second embodiment according to the present invention.
Figure 26B:
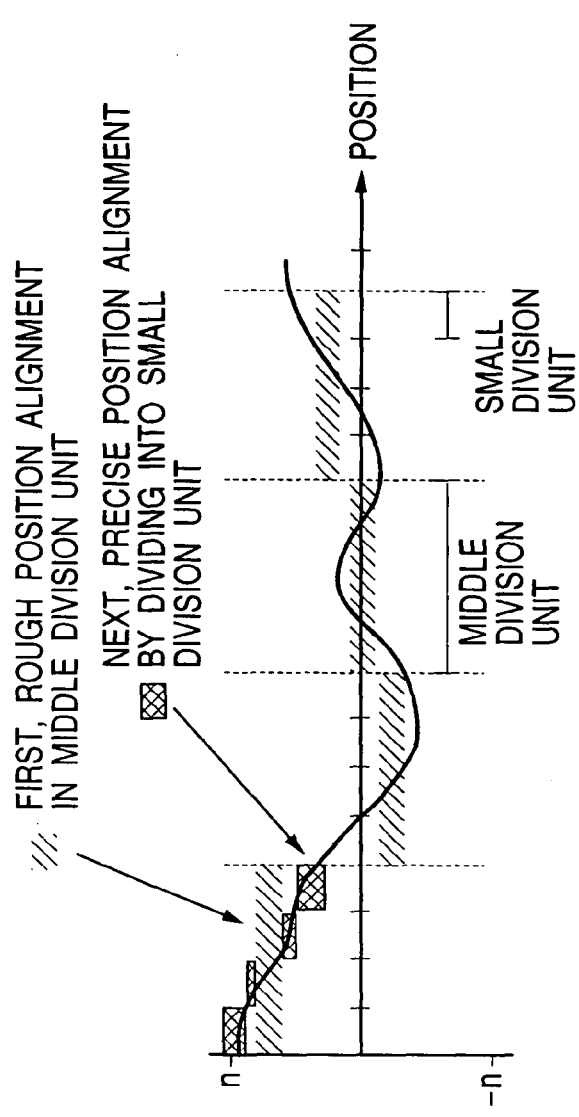

First of all, a concept of the stepwise division method will explained by referring to FIG. 26.

In the stepwise division method, the image is divided gradually and finally into the size being same to that in the first embodiment, however, for distinction thereof, the division unit at the final is called as "small division unit", at an earlier stage by one as "middle division unit", and at a stage earlier than that as "large division unit" . . . FIG. 26 shows the position coordinates on the horizontal axis and the position shift quantities between the detection image and the comparison image on the vertical axis. There are two position shifts, i.e., the position shifts in the x direction and in the y direction, however, FIG. 26 shows only one of them. If the change in the position shift quantity is in such a profile as shown in FIG. 26, according to the non-stepwise division method, as is shown in (a) of the same figure, investigation over ±n pixels (investigating the alignment factor within a range ±n pixels) is necessary for obtaining the position shift quantity. On the contrary to this, according to the stepwise division method, as is shown in (b) of the same figure, since the position shift is detected by the middle division unit in advance, it is enough the investigation at the small division unit be carried out focusing on the position shift obtained at the middle division unit, thereby making the investigation range much smaller than ±n. This is the concept of the stepwise division method.

The stepwise division method has two advantages as follows:

(1) Possibility of Reducing Hardware Scale.

Namely, the scale of the hardware is almost proportional to ((an area of the division unit)×(investigation range)$^2$× (number of the division unit)). Assuming that the investigation range at the first stage is n1, at the second stage n2, and at the third stage n3 in the stepwise division method, the investigation range n in the non-stepwise division method should be roughly equal to the sum or total of the investigation ranges at every stages in the stepwise division method. Namely, the investigation range n in the non-stepwise division method comes to be in a relation shown the following equation (Eq. 51).

$$n=n1+n2+n3+\ldots+nt \qquad \text{(Eq.51)}$$

In this instance, a ratio between the hardware scale of the stepwise division method and the hardware scale of the non-stepwise division method comes to be as shown by the following equation (Eq. 52), and it apparently is equal or less than 1.

$$r=(n1^2+n2^2+n3^2+\ldots nt^2)/(n1+n2+n3+\ldots nt)^2 \qquad \text{(Eq. 52)}$$

Namely, the stepwise division method is able to make the hardware scale small much more.

(2) High Possibility of Correct Position Shift Quantity.

Figure 27A:
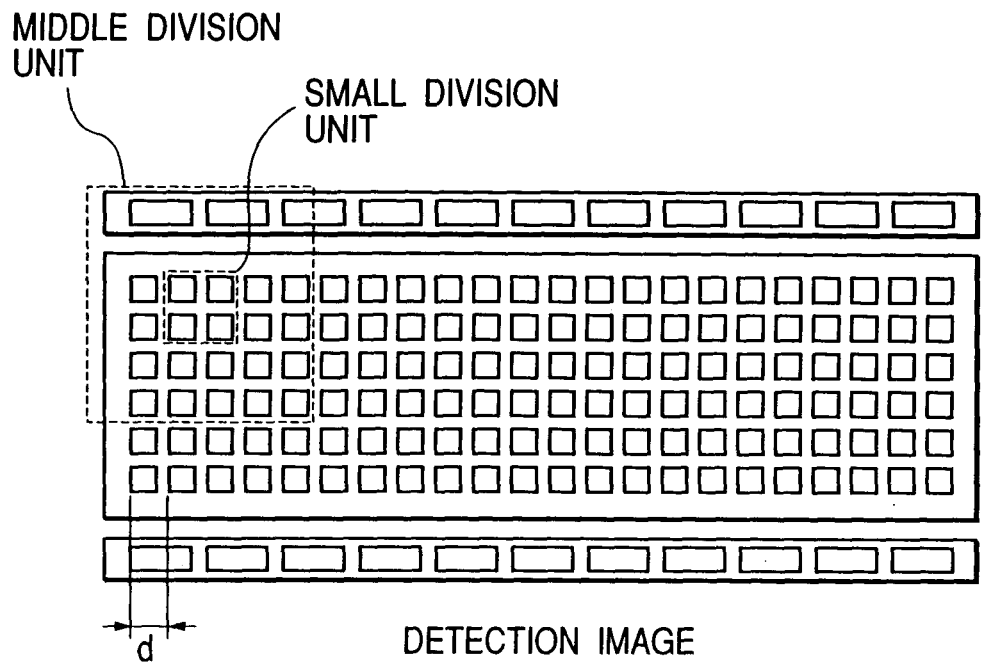
FIG. 27 shows a view of explaining effects of the second embodiment according to the present invention.
Figure 27B:
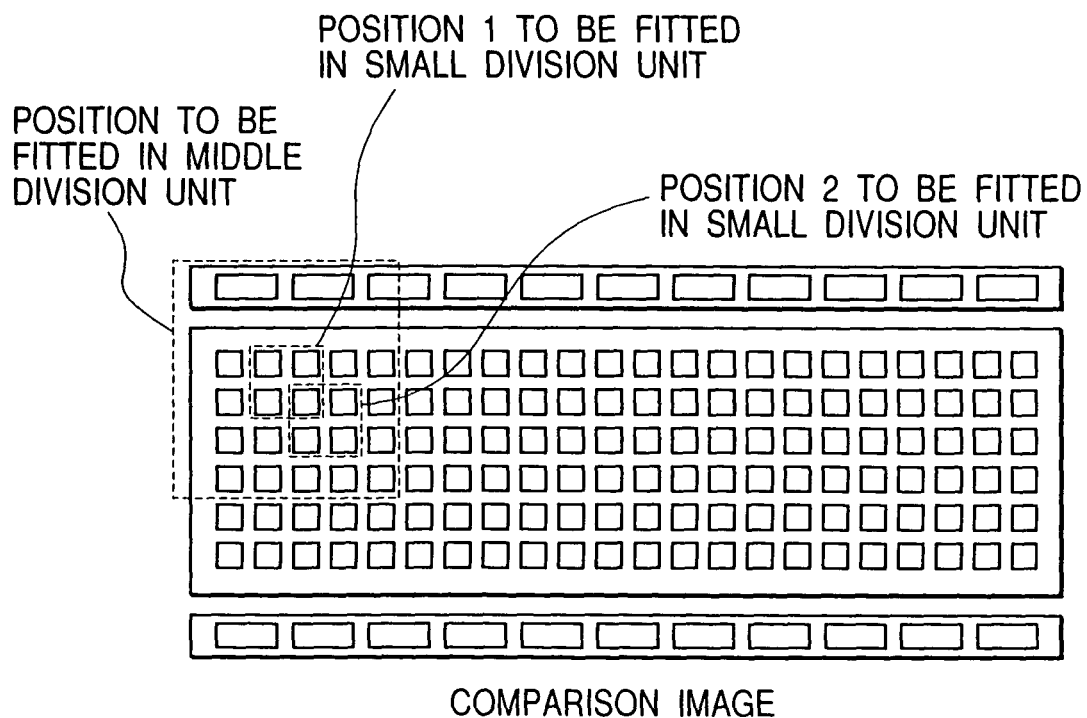

Namely, the investigation range of the small division unit is still wide in the non-stepwise division method, therefore there is possibility of occurring errors in the position alignment if the investigation range exceeds the pattern pitch. In FIG. 27, it is assumed that the small division unit is the size as shown in FIG. 27 (a), the pattern pitch "d", and the investigation range ±1.5 d. In this instance, an equal alignment factor can be obtained at a plurality of positions if investigating the position fitting to the small division unit on the comparison image, therefore there is possibility that it is aligned with an erroneous position. For instance in FIG. 27 (b), "position 1 to where the small division unit fits to" is correct, while "position 2 to where the small division unit fits to" is wrong, however, the calculation result of the position shift quantity can be either of them. On a while, in the stepwise division method, the investigation in the small division unit is executed by focusing on the position where the position alignment is done. Since the middle division unit is larger in the image size than the small division unit, a probability of including unique patterns therein is high, therefore, though the investigation is wide, but the possibility of the erroneous position alignment is low. Accordingly, with the small division unit, it is enough to investigate a narrow range by focusing only on the position where the position alignment is correctly done, therefore the possibility of the erroneous position alignment comes to be low or small. Even with this middle division unit, there still can be a case where the erroneous position alignment is done, in particular when no unique pattern is not involved therein, and/or when the investigation range is very large, however, it is apparent the possibility thereof is low comparing to the non-stepwise division method.

Next, an explanation will be given on the image processing portion 103b by referring to FIGS. 25 through 29.

Figure 28A:
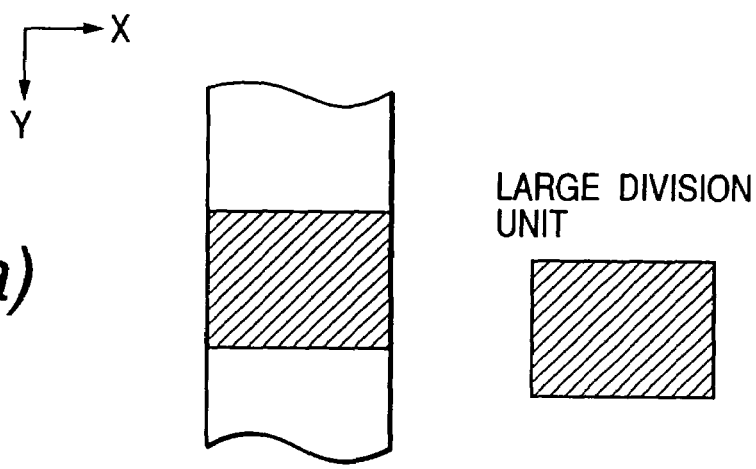
FIG. 28 shows a positional relationship of the division units on a continuous picture data, according to the second embodiment of the present invention.
Figure 28B:
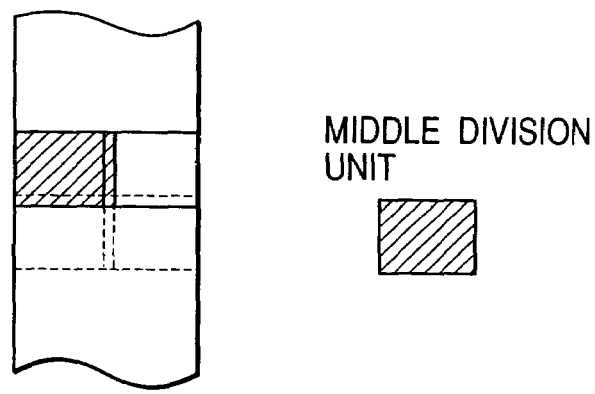
Figure 28C:
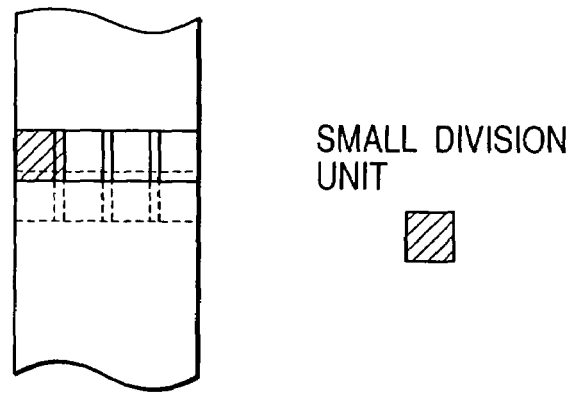

FIG. 25 shows the construction, where the position shift detection is conducted on the image without dividing thereof at the first stage, the image is divided into two at the second stage, and each of them is further divided into two at the third stage, totally at the three stages. Namely, the horizontal width (the width in the x direction) of the large division unit is the scanning width itself, the width of the middle division unit is about a half (½) or a little bit more of the scanning width, and the small division unit is about a quarter (¼) or a little bit more of the scanning width. A positional relationship of each division unit on the continuous image data is shown in FIG. 28 (a), (b) and (c). FIG. 28 (a) shows the large division unit, FIG. 28 (b) the middle division unit, and FIG. 28 (c) the third division unit, respectively. Here, each division unit is overlapped with one another in the same figure, as mentioned in the first embodiment, for the reason of bringing about no gap nor shift in the detection area or region.

As shown in FIG. 25, the continuous image data f0(x,y) and g0(x,y), being outputted from the image pick-up portion 102, are stored into the two-dimension image memories 48a and 48b, respectively, in a certain scanning area (corresponding to the vertical width of the large division unit). Each of the two-dimension memories 48a and 48b is constructed with the memory portion of two-dimension and the register for storing addresses for start/end of writing, In the same manner as each of the two-dimension image memories 42a and 42b. Accordingly, in each of those two-dimension memories 48a and 48b, the coordinates of the large division unit (read start/end addresses) are set from the total controller portion 104 into the registers for storing the read start/end addresses, and the detection image data f7(x,y) and the comparison image data g7(x,y) are cut out from the two-dimension memory portions by the large division unit, so as to be read out therefrom. The position shift detecting portion 49, as shown in FIGS. 9 and 13, has the detector portion 442 comprising the statistical quantity calculation portion 443 and the sub-CPU 444, which obtains the position shift quantities δx2 and δy2 over the large division unit between the detection image f7(x,y) and the comparison image g7(x,y), which are cut out and read out from the image memories 48a and 48b for example, on the basis of the above equations (Eq. 5) and (Eq. 6) in the accuracy of the pixel unit, so as to be inputted into the position shift detector portion 51a and 51b, respectively. The above equations (Eq. 5) and (Eq. 6) are for the case of calculating the position shift quantity in an unit larger than the pixel, wherein δx2 corresponds to mx0 and δy2 to my0. In the case of calculating the position shift quantity in the sub-pixel unit, they are based upon the above equations (Eq. 10) and (Eq. 11). By changing the shift quantity mx in the x direction and the shift quantity my in the y direction by ±0, 1, 2, 3, 4 n, in other words, shifting the comparison image g7(x,y) by the pixel pitches in the large division unit, then s1(mx,my)s are calculated on those occasions. And the values mx0 of mx and my0 of my are obtained, at which each of them comes to be the minimum. However, the maximum shift quantity n of the comparison image must to be a large value because of the large division unit.

Those δx2 and δy2 are the position shift quantities between the detection image f7(x,y) and the comparison image g7(x,y) over the large division unit, in particular, δx2 is the position shift quantity over the large division unit in the x direction and δy2 is the position shift quantity over the large division unit in the y direction. During this, into the image memories 50a and 50b are written the detection image f7(x,y) and the comparison image g7(x,y) of the large division unit, which are cut out and read out from those image memories 48a and 48b. However, as the method of calculating the position shift in the position shift detector portion 49 can be applied either the method in the position shift detector portion 44 of the first embodiment, or the method in the position shift detector portion 44 of the third variation of the first embodiment, however, since there is no necessity of obtaining the position shift quantity between the large division units in the accuracy of sub-pixel unit, those stages up to obtaining the position shift in the accuracy of pixel unit are installed into this position shift detector portion.

The image memories 50a and 50b are also constructed in the same manner as the image memories 48a and 48b or the image memories 42a and 42b mentioned above. Accordingly, in each of those two-dimension memories 50a and 50b, the coordinates of the middle division unit (read start/end addresses) are set from the total controller portion 104 into the registers for storing the read start/end addresses, and the detection image data f6a(x,y) and 6b(x,y) and the comparison image data g6a(x,y) and g6b(x,y) are cut out from the two-dimension memory portions by the middle division unit so as to be read out therefrom. The position shift detecting portion 51a obtains the position shift quantities δx1a and δy1a between the detection image f6a(x,y) and the comparison image g6a(x,y) of the portion corresponding to the first middle division unit, which are cut out and read out from the image memories 50a and 50b, on the basis of such as the above equations (Eq. 5) and (Eq. 6) in the accuracy of the pixel unit, so as to be inputted into the position shift detector portion 53a and 53b, respectively. Those δx1a and δy1a are the position shift quantities over the first middle division unit. In synchronism with this, the position shift detector portion 51b obtains the position shift quantities δx1b and δy1b between the detection image f6b(x,y) and the comparison image g6b(x,y) of the portion corresponding to the second middle division unit, which are cut out and read out from the image memories 50a and 50b, on the basis of such as the above equations (Eq. 5) and (Eq. 6) in the accuracy of the pixel unit, so as to be inputted into the position shift detector portion 53a and 53b, respectively. Those δx1a and δy1a are the position shift quantities over the second middle division unit. Those δx1b and δx1bcorrespond to mx0 and δy1b and δy1b to my0 in each of the first and second middle division units. With changing the shift quantity mx in the x direction and the shift quantity my in the y direction by ±0, 1, 2, 3, 4 n, respectively, in other words, shifting the comparison images g6a(x,y) and g6b(x, y) by the pixel pitches in the first and the second middle division units, then s1(mx,my)s are calculated on those occasions. And the values mx0 of mx and my0 of my are obtained, at which each of the comes to be the minimum. Namely, the maximum shift quantity n of the comparison image in the respective position shift detector portions 51a and 51b can be narrowed very much depending upon the values δx2 and δy2 obtained from the position shift detection portion 49 in the large division unit, thereby enabling the hardware scale and the processing time to be minimized. However, in a case where the position shift quantities can be obtained in the accuracy of the pixel unit for the large division unit, it is also possible to obtain the position shift quantities δx1a and δy1a and δx1b and δy1b in the accuracy of the sub-pixel unit too, on the basis of the above equations (Eq. 10) and (Eq. 11) in the respective position shift detector portions 51a and 51b. And, during the position shift detection is executed in each of the position shift detection portions 51a and 51b, into the image memories 52a, 52b and 52c and 52d are written the detection image f6a and f6b and the comparison image g6a and g6b of the middle division unit, respectively, which are cut out and read out from those image memories 50a and 50b. However, each of the position shift detector portions 51a and 51b has the construction having the position shift detector portion 442 comprising the statistical quantity calculation portion 443 and the sub-CPU therein. Namely, as the method for calculating the position shift in the position shift detector portions 51a and 51b can be applied either the method in the position shift detector portion 44 of the first embodiment, or the method in the position shift detector portion 44 of the third variation of the first embodiment, however, since there is no necessity of obtaining the position shift quantity between the middle division units in the sub-pixel accuracy, those stages up to obtaining the position shift in the accuracy of pixel unit are installed into this position shift detector portion.

And, the detection images f1a(x,y), f1b(x,y), f1c(x,y) and f1d(x,y) are cut out and read out for each small division unit from each of the image memories 52a and 52c, in the same manner of the memory 42a shown in FIG. 1. At the same time, the detection images g1a(x,y), g1b(x,y), g1c(x,y) and g1d(x,y) are cut out and read out for each small division unit from each of the image memories 52b and 52d, in the same manner of the memory 42b shown in FIG. 1.

The processing contents in the position shift detector portions 53a–53d, the defect decision portions 46a–46d, the defect compiler portion 47a–47d are basically same to those in the first embodiment. Namely, in the position shift detector portions 53a–53d and the defect decision portions 46a–46d, there is executed any one of the method of the first embodiment (see FIG. 9), the method of the first variation of the first embodiment (see FIG. 13), the method of the third variation of the first embodiment (see FIG. 18), and the method of the fourth variation of the first embodiment (see FIG. 21).

Those position shift detector portions 53a–53d have the same constructions to the position shift detector portions 44a–44d shown in FIG. 1, the defect decision portions 46a–46d to those shown in FIG. 1, and also the defect compiler portion 47a–47d to those shown in FIG. 1. However, into position shift detector portions 53a and 53b are inputted the position shift quantities δx1a and δy1a over the first middle division unit in the pixel accuracy, which are obtained in the position shift detector portion 51a, while into position shift detector portions 53c and 53d are inputted the position shift quantities δx1b and δy1b over the second middle division unit in the pixel accuracy, which are obtained in the position shift detector portion Sib. Accordingly, for the position alignment portion 441 in the pixel unit in the position shift detector portion 53a, it is enough to execute the position alignment between the detection image f1a(x,y) and the comparison image g1a(x,y) inputted for each small division unit, on the basis of the position shift quantities δx1a and δy1a in the pixel accuracy over the above first middle division unit inputted. Also, for the position alignment portion 441 in the pixel unit in the position shift detector portion 53b, it also is enough to execute the position alignment between the detection image f1b(x,y) and the comparison image g1b(x,y) inputted for each small division unit, on the basis of the position shift quantities δx1a and δy1a in the pixel accuracy over the above first middle division unit inputted. Further, for the position alignment portion 441 in the pixel unit in the position shift detector portion 53c, it is also enough to execute the position alignment between the detection image f1c(x,y) and the comparison image g1c(x,y) inputted for each small division unit, on the basis of the position shift quantities δx1b and δy1b in the pixel accuracy over the above second middle division unit inputted. Furthermore, for the position alignment portion 441 in the pixel unit in the position shift detector portion 53d, it is also enough to execute the position alignment between the detection image f1d(x,y) and the comparison image g1d(x,y) inputted for each small division unit, on the basis of the position shift quantities δx1b and δy1b in the pixel accuracy over the above second middle division unit inputted. If not satisfied only by executing the position alignment on the basis of the position shift quantities δx1a, δy1a and δx1b, δy1b in the pixel accuracy over the first and the second middle division units, it is enough to obtain the position shift quantities by narrowing the investigation area or range upon the said position shift quantities δx1a, δy1a and δx1b, δy1b, in the position alignment portion 441 in the pixel unit, within each of the position detection portions 53a–53d.

In this manner, it is possible to make small or to neglect the investigation area or range for obtaining the position shift in the position alignment portion 441 in the pixel unit, within each of the position detection portions 53a–53d.

<First Variation of the Second Embodiment>

Figure 29:
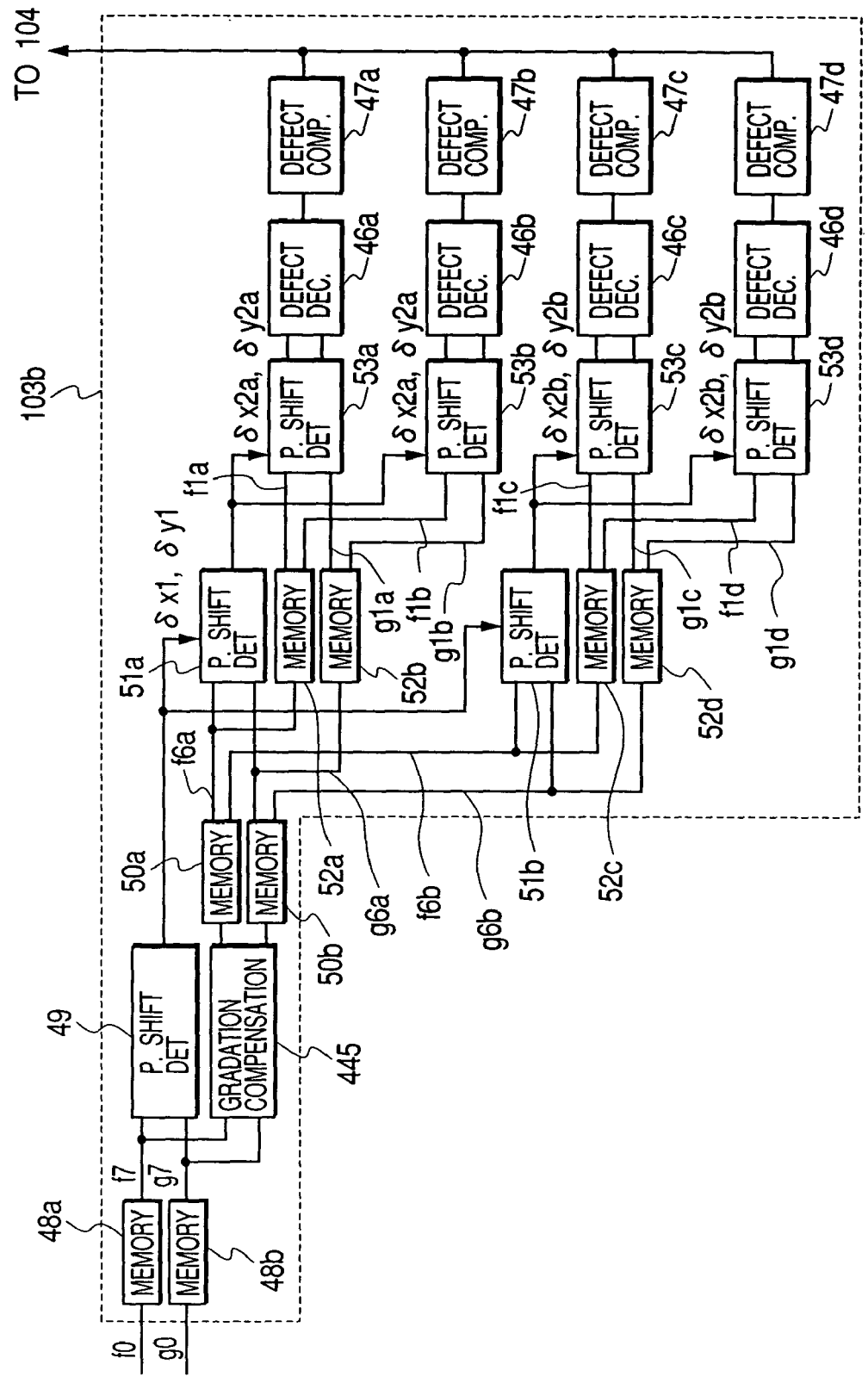
FIG. 29 shows an example of the structure upon combining the second embodiment and the second variation of the first embodiment, according to the present invention.

A first variation of the second embodiment of the pattern inspecting method and the apparatus thereof according to the present invention is shown in FIGS. 29 and 30. In FIG. 29, the gradation compensation portion 445 mentioned in the second variation of the first embodiment is provided between the image memory 48a and the image memory 50a and also between image memory 48b and the image memory 50b. Namely, the gradation compensation portion 445 is so constructed that it executes the gradation compensation on the detection image f7(x,y) and the comparison image g7(x,y) of the large division unit (at the first stage), which are cut out by the image memories 48a and 48b, respectively.

In FIG. 30, the gradation compensation portions 445a and 445b mentioned in the second variation of the first embodiment are provided between the image memory 50a and the image memory 52a or 52c and also between image memory 50b and the image memory 52b or 52d. Namely, the gradation compensation portions 445a and 445b are so constructed that they execute the gradation compensation on the detection image f6a(x,y) and f6b(x,y) and the comparison image g7(x,y) and g6b(x,y) of the middle division unit (at the second stage), which are cut out by the image memories 50a and 50b, respectively.

Also, as is shown in FIGS. 15 and 17, the gradation compensation can be executed on the detection images f1a(x,y), f1b(x,y), f1c(x,y) and f1d(x,y) and the comparison images g1a(x,y), g1b(x,y), g1c(x,y) and g1d(x,y) for each the small unit (at the third stage), which are cut out from the image memories 52a, 52b, 52c and 52d (42a and 42b), by the gradation compensation portion 445. However, in this instance, the gradation compensation unit 445 can be provided among the respective image memories 52a–52d and among the respective position shift detector portions 53a–53d.

As is explained in the above, the gradation compensation can be executed at any stage where the position shift detection is performed by the gradation compensation portion 445. Or, alternatively the gradation compensation can be executed over all of the stages mentioned in the above.

In the second embodiment, since the position shift detection is performed in the stepwise method, the position shift quantities between the images being almost equal to each other in the gradation values can be obtained in the following stages. With the position shift detection between the images being almost equal to each other in the gradation values, it is possible to calculate the position shift correctly, comparing to the position shift detection between the images being different in the gradation values. In this sense, that the position shift detection and the gradation compensation can be executed alternatively is also one of the advantages of the present embodiment.

<Common Variation with the First and Second Embodiments>

In the first and second embodiments explained in the above, there was shown the method in which two images obtained form the same object are compared, however, it is apparent that the same contents also can be practiced in the image processing portion in the case where the image obtained form the object is compared to the image which is detected and stored from another object in advance or which is formed from design data.

Further, in the first and the second embodiments explained in the above was given explanation on the apparatus using the electron optic detection means or system, however, it is needless to say that the same operation can also practiced in the system using any detection means, such as the optical detection means as is shown in FIG. 31, and so on. However, the present invention deals with the problems such as, the dynamic image deformation or distortion caused due to the vibration of the stages, change in the magnetic field caused due to the pattern distribution of the test object; and so on, so as to dissolve them. Accordingly, in the case of dealing with the dynamic image deformation or distortion as shown in FIG. 7, it is needed to divide the image finely so that the dynamic deformation or distortion can be neglected therefrom, so as to perform the defect decision for each division unit.

Namely, in FIG. 31 is shown the structure of an outline of the pattern detection apparatus using the optical detection means (detection portion) 101'. The optical detection portion 101' is constructed with a stage 2 for mounting the object 100 to be tested (test object) such as the semiconductor wafer and for shifting it into the x and the y directions, a light source 3, an illumination optical system 4 for condensing the light emitted from the said light source 3, an objection lens 5 for illuminating the object 100 to be tested with the illumination light condensed by the said illumination optical system 4 so as to focus it on an optical image obtained by the refection from the test object 100, and an single dimension image sensor 6 as a one example of the photoelectric transfer element, for receiving the light and converting the optical image focused by an optical detection system including the said objection lens 5 into the image signal depending on the brightness of the optical image formed. And, the image signal detected by the single dimension image sensor 6 of the detector portion 101' is inputted into an image input portion (image cutting portion) 102'. The image input portion 102' comprises an A/D converter 39 and an image memory portion (delay circuit) 41' which memorizes a digitized image signal for producing the comparison image g0 from the digitized image signal having the gradation values obtained from the A/D converter 39. Of course, it is possible to provide the pre-processing circuit 40 for executing shading compensation, dark level compensation, filtering process, etc. The image processing portion 103a (103b), in the same manner with the constructions shown in FIGS. 1 and 25, also able to decide between the defective candidate and the non-defective candidate upon the basis of the same image processing, as well as to calculate the characteristic quantities with respect to the defective candidate.

According to the present invention, it is possible to reduce the possibility of bringing about or occurring the erroneous or false reports due to the test objection side and the inspecting apparatus side thereof, which are caused by the discrepancies including, such as the minute difference in pattern shapes, the difference in gradation values, the distortion or deformation of the patterns, the position shift, thereby enabling the detection of the defects or the defective candidates in more details thereof.

Also, according to the present invention, it is also possible to reduce the possibility of bringing about or occurring the erroneous or false reports due to the test objection side and the inspecting apparatus side thereof, which are caused by discrepancies including, such as the minute difference in pattern shapes, the difference in gradation values, the distortion or deformation of the patterns, the position shift, thereby enabling the detection of the defects or the defective candidates in more details thereof, in particular, in the inspection of the patterns which are formed on the object to be tested or inspected by means of the electron microscope.

Further, according to the present invention, it is possible to reduce the distortion or deformation in the detection image, thereby widening the inspection area or region up to the peripheral portion of the test object.

Furthermore, according to the present invention, it is possible to obtain the image signal having stable gradation values from the patterns formed on the test object by means of the electron microscope, as a result of this, it is possible to realize the inspection of the more minute defects or defective candidates with stability.

What is claimed:

1. A pattern inspecting method for inspecting a defect or defective candidate of patterns on a sample, comprising:
    a size defining step for measuring geometric distortion in an image of a standard sample by picking up the image of the standard sample while shifting a sampling position on the standard sample, beforehand, and for defining a size for which the measured geometric distortion is neglectable;
    an image picking-up step for picking up an image of a sample by shifting a sampling position on the sample;
    an image data obtaining step for obtaining a first image of the sample obtained by the image picking-up step and for obtaining a second image to be compared with the first image;
    an image dividing step for dividing the first image and the second image into images of a division unit having a size not greater than the size defined by the size defining step;
    a calculating step for comparing a divided image of the first image which is divided in the dividing step with a divided image of the second image which corresponds to the divided image of the first image, and for calculating a difference in gradation values between both of the divided images of the first and second images; and
    an extracting step for extracting the defect or the defect candidate of the sample in accordance with the calculated difference in the gradation values of both of the divided images obtained from the calculating step.

2. A pattern inspecting method for inspecting a defect or defective candidate of patterns according to claim 1, wherein the image picking-up step comprises a step for irradiating of an electron beam onto the sample so as to detect secondary electron generated from the sample by the irradiation of the electron beam.

3. A pattern inspecting method for inspecting a defect or defective candidate of patterns according to claim 1, wherein the image picking-up step comprises a step for irradiating of light onto the sample so as to detect reflection light generated from the sample by the irradiation of the light.

4. A pattern inspecting method for inspecting a defect or defective candidate of patterns on a sample, comprising:
    a size defining step for measuring geometric distortion in an image of a standard sample by picking up the image of the standard sample while shifting a sampling position on the standard sample, beforehand, and for defining a size for which the measured geometric distortion is neglectable;
    an image picking-up step for picking up an image of a sample by shifting a sampling position on the sample;
    an image data obtaining step for obtaining a first image of the sample obtained by the image picking-up step and for obtaining a second image to be compared with the first image;
    an area extracting step for extracting an area unit having a size not greater than the size defined by the size defining step from each of the first image and the second image;
    a position shift detecting step for detecting position shift quantities between the area unit of the first image which is extracted in the area extracting step and the area unit of the second image corresponding to the area of the first image;
    a calculating step for comparing the first image with the second image which corresponds to the first image, and for calculating a difference in gradation values between both of the first and second images; and
    a defect extracting step for extracting the defect or the defect candidate of the sample in accordance with of the difference in the gradation values of both of the first and second images obtained in the calculating step.

5. A pattern inspecting method for inspecting a defect or defective candidate of patterns according to claim 4, wherein the position shift quantities detected by the position shift detecting step includes position shift quantities ($\delta x0$, $\delta y0$) which are not greater than a size of a pixel.

6. A pattern inspecting method for inspecting a defect or defective candidate of patterns on a sample, comprising:
    a size defining step for measuring geometric distortion in an image of a standard sample by picking up the image of the standard sample while shifting a sampling position on the standard sample, beforehand, and for defining a size for which the measured geometric distortion is neglectable;
    an image picking-up step for picking up an image of a sample by shifting a sampling position on the sample;
    an image data obtaining step for obtaining a first image of the sample obtained by the image picking-up step and for obtaining a second image to be compared with the first image;
    an area extracting step for extracting an area unit having a size not greater than the size defined by the size defining step from each of the first image and the second image;
    a position shift detecting step for detecting position shift quantities between the area unit of the first image which is extracted in the area extracting step and the area unit of the second image which corresponds to the area of the first image;

a calculating step for comparing the extracted area image of the first image with the extracted area image of the second image which corresponds to the extracted area image of the first image, and for calculating a difference in gradation values between both of the extracted area images of the first and second images; and a defect extracting step for extracting the defect or the defect candidate of the sample in accordance with the difference (sub(x,y)) in the gradation values of both of the extracted area images obtained in the calculating step.

7. A pattern inspecting method for inspecting a defect or defective candidate of patterns according to claim 5, wherein the position shift quantities detected by the position shift detecting step includes sub-pixel position shift quantities ($\delta x0$, $\delta y0$) which are not greater than a size of a pixel.

8. A pattern inspecting method for inspecting a defect or defective candidate of patterns as claimed in claim 7, wherein the defect extracting step includes a step for extracting the defect or the defect candidate of the sample by using at least one of judgment reference (th(x,y)) for the difference (sub(x,y)), and a judgment reference (th(x,y)) including a compensation item A(x,y) which is calculated by estimating as minute changes of the difference (sub (x,y)) correspondence with the sub-pixel position shift quantities ($\delta x0$, $\delta y0$) which are obtained for each extracted area.

9. A pattern inspecting apparatus for inspecting a defect or defective candidate of patterns on a sample, comprising:

a size defining unit which measures geometric distortion in an image of a standard sample by picking up the image of the standard sample while shifting a sampling position on the standard sample, beforehand, and which defines a size for which the measured geometric distortion is neglectable;

an image picking-up unit which picks up an image of a sample by shifting a sampling position on the sample;

an image data obtaining unit which obtains a first image of the sample obtained by the image picking-up unit and which obtains a second image to be compared with the first image;

an image dividing unit which divides the first image and the second image into images of a division unit having a size not greater than the size defined by the size defining unit;

a calculating unit which compares a divided image of the first image which is divided in the dividing unit with a divided image of the second image which corresponds to the divided image of the first image, and which calculates a difference in gradation values between both of the divided images of the first and second images; and an extracting unit which extracts the defect or the defect candidate of said sample in accordance with the difference in the gradation values of both of the divided images obtained from the calculating unit.

10. A pattern inspecting apparatus for inspecting a defect or defective candidate of patterns according to claim 9, wherein the image picking-up unit comprises an irradiation system which irradiates electron beam onto the sample so as to detect secondary electron generated from the sample by the irradiation of the electron beam.

11. A pattern inspecting apparatus for inspecting a defect or defective candidate of patterns according to claim 9, wherein the image picking-up unit comprises an irradiation system which irradiates light onto the sample so as to detect reflection light generated from the sample by the irradiation of the light.

12. A pattern inspecting apparatus for inspecting a defect or defective candidate of patterns on a sample, comprising:

a size defining unit which measures geometric distortion in an image of a standard sample by picking up the image of the standard sample while shifting a sampling position on the standard sample, beforehand, and which defines a size for which the measured geometric distortion is neglectable;

an image picking-up unit which picks up an image of a sample by shifting a sampling position on the sample;

an image data obtaining unit which obtains a first image of the sample obtained by the image picking-up unit and which obtains a second image to be compared with the first image;

an area extracting unit which extracts an area unit having a size not greater than the size defined by the size defining unit from each of the first image and the second image;

a position shift detecting unit which detects position shift quantities between the area unit of the first image which is extracted by the area extracting unit and the area unit of the second image which corresponds to the area of the first image;

a calculating unit which compares the first image with the second image which corresponds to the first image, and which calculates a difference in gradation values between both of the images of the first and second images; and a defect extracting unit which extracts the defect or the defect candidate of the sample in accordance with the difference in the gradation values both of the images obtained from said calculating unit.

13. A pattern inspecting apparatus for inspecting a defect or defective candidate of patterns according to claim 12, wherein the position shift quantities detected by the position shift detecting unit includes position shift quantities ($\delta x0$, $\delta y0$) which are not greater than a size of a pixel.

14. A pattern inspecting apparatus for inspecting a defect or defective candidate of patterns on a sample, comprising:

a size defining unit which measures geometric distortion in an image of a standard sample by picking up the image of the standard sample while shifting a sampling position on the standard sample, beforehand, and which defines a size for which the measured geometric distortion is neglectable;

an image picking-up unit which picks up an image of a sample by shifting a sampling position on the sample;

an image data obtaining unit which obtains a first image of the sample obtained by the image picking-up unit and which obtains a second image to be compared with the first image;

an area extracting unit which extracts an area unit having a size not greater than the size defined by the size defining unit from each of the first image and the second image;

a position shift detecting unit which detects position shift quantities between the area unit of the first image which is extracted by the area extracting unit and the area unit of the second image which corresponds to the area of the first image;

a calculating unit which compares the extracted area image of the first image with the extracted area image of the second image which corresponds to the extracted area image of the first image, and which calculates a difference in gradation values between both of the extracted area images of the first and second images; and a defect extracting unit which extracts the defect or the defect candidate of the sample in accordance with the difference (sub(x,y)) in the gradation values of both of the area images obtained from said calculating unit.

15. A pattern inspecting apparatus for inspecting a defect or defective candidate of patterns according to claim 14, wherein the position shift quantities detected by the position shift detecting unit includes sub-pixel position shift quantities ($\delta x0$, $\delta y0$) which are not greater than a size of pixel.

16. A pattern inspecting apparatus for inspecting a defect or defective candidate of patterns according to claim 15, wherein the defect extracting unit includes a unit which extracts the defect or the defect candidate of said sample by using at least one of judgment reference (th(x,y)) for the difference (sub(x,y)), and a judgment reference (th(x,y)) including a compensation item A(x,y) which is calculated by estimating as minute changes of the difference (sub (x,y)) in correspondence with the sub-pixel position shift quantities ($\delta x0$, $\delta y0$) which are obtained for each extracted area.

* * * * *